(12) United States Patent
Omura et al.

(10) Patent No.: US 7,301,605 B2
(45) Date of Patent: *Nov. 27, 2007

(54) PROJECTION EXPOSURE APPARATUS AND METHOD, CATADIOPTRIC OPTICAL SYSTEM AND MANUFACTURING METHOD OF DEVICES

(75) Inventors: Yasuhiro Omura, Tokyo (JP); Naomasa Shiraishi, Urawa (JP); Soichi Owa, Tokyo (JP)

(73) Assignee: Nikon Corporation, Tokyo (JP)

( * ) Notice: Subject to any disclaimer, the term of this patent is extended or adjusted under 35 U.S.C. 154(b) by 235 days.

This patent is subject to a terminal disclaimer.

(21) Appl. No.: 09/769,832

(22) Filed: Jan. 26, 2001

(65) Prior Publication Data

US 2003/0011755 A1    Jan. 16, 2003

(30) Foreign Application Priority Data

Mar. 3, 2000    (JP)    ............................. 2000-058268
Aug. 10, 2000    (JP)    ............................. 2000-242096

(51) Int. Cl.
*G03B 27/54*    (2006.01)
*G03B 27/70*    (2006.01)
(52) U.S. Cl. .......................................... 355/67; 355/66
(58) Field of Classification Search .................. 355/43, 355/45, 49, 51, 53, 57, 60, 66, 67, 71, 77; 359/355, 636–640, 726–727, 732
See application file for complete search history.

(56) References Cited

U.S. PATENT DOCUMENTS 3,574,459 A * 4/1971 Hartwig et al. ................ 355/66
4,678,321 A * 7/1987 Inokuchi ....................... 355/52
4,736,225 A * 4/1988 Tanaka et al. .................. 355/1

5,140,459 A    8/1992 Sagan ........................ 359/434

(Continued)

FOREIGN PATENT DOCUMENTS

EP    0 855 623 A2    7/1998

(Continued)

OTHER PUBLICATIONS

U.S. Appl. No. 09/260,544, filed Mar. 2, 1999, Ebiarra et al.

(Continued)

*Primary Examiner*—Rodney Fuller
(74) *Attorney, Agent, or Firm*—Oliff & Berridge, PLC

(57) ABSTRACT

A projection exposure apparatus includes a projection optical system, which is arranged in an optical path between a first surface and a second surface, projects a pattern on a negative plate arranged on the first surface onto a workpiece arranged on the second surface and exposes the pattern thereon. The projection optical system includes a first imaging optical subsystem having a dioptric imaging optical system; a second imaging optical subsystem having a concave reflecting system; a third imaging optical subsystem having a dioptric imaging optical system; a first folding mirror arranged in an optical path between the first imaging optical subsystem and the second imaging optical subsystem; and a second folding mirror arranged in an optical path between the second imaging optical subsystem and the third imaging optical subsystem. The first imaging optical subsystem forms a first intermediate image and the second imaging optical subsystem forms a second intermediate image.

108 Claims, 19 Drawing Sheets

U.S. PATENT DOCUMENTS

| | | | |
|---|---|---|---|
| 5,473,410 | A | 12/1995 | Nishi |
| 5,557,469 | A | 9/1996 | Markle et al. |
| 5,559,629 | A | 9/1996 | Sheets et al. |
| 5,576,895 | A | 11/1996 | Ikeda |
| 5,636,066 | A | 6/1997 | Takahashi |
| 5,638,223 | A | 6/1997 | Ikeda |
| 5,689,377 | A | 11/1997 | Takahashi |
| 5,694,241 | A | 12/1997 | Ishiyama et al. |
| 5,739,964 | A | 4/1998 | Allen |
| 5,805,334 | A | 9/1998 | Takahashi |
| 5,835,284 | A | 11/1998 | Takahashi et al. |
| 5,850,300 | A | 12/1998 | Kathman et al. |
| 5,852,518 | A | 12/1998 | Hatasawa et al. |
| 5,861,997 | A | 1/1999 | Takahashi |
| 5,969,441 | A | 10/1999 | Loopstra et al. |
| 6,246,204 | B1 | 6/2001 | Ebihara et al. |
| 6,249,382 | B1 | 6/2001 | Komatsuda |
| 6,262,796 | B1 | 7/2001 | Loopstra et al. |
| 6,327,022 | B1 | 12/2001 | Nishi |
| 6,337,162 | B1 | 1/2002 | Irie |
| 6,341,007 | B1 | 1/2002 | Nishi et al. |
| 6,381,077 | B1 * | 4/2002 | Jeong et al. ................. 359/726 |
| 6,512,631 | B2 | 1/2003 | Shafer et al. |
| 6,677,088 | B2 | 1/2004 | Magome et al. |
| 6,717,746 | B2 | 4/2004 | Epple et al. |
| 6,909,492 | B2 * | 6/2005 | Omura ........................ 355/67 |
| 2002/0145711 | A1 | 10/2002 | Magome et al. |
| 2002/0196533 | A1 * | 12/2002 | Shafer et al. ............... 359/355 |
| 2003/0020888 | A1 | 1/2003 | Tanaka et al. |
| 2004/0104359 | A1 | 6/2004 | Komatsuda et al. |

FOREIGN PATENT DOCUMENTS

| | | |
|---|---|---|
| EP | 0 951 054 A1 | 10/1999 |
| EP | 1 020 897 A1 | 7/2000 |
| EP | 1 030 351 A1 | 8/2000 |
| EP | 1 043 625 A1 | 10/2000 |
| EP | 1 069 600 A1 | 1/2001 |
| GB | 2 290 658 A | 1/1996 |
| JP | A 4-196513 | 7/1992 |
| JP | A-6-250074 | 9/1994 |
| JP | A 6-250074 | 9/1994 |
| JP | A-6-265789 | 9/1994 |
| JP | A 6-300955 | 10/1994 |
| JP | A 6-349699 | 12/1994 |
| JP | A 7-86152 | 3/1995 |
| JP | A-7-168116 | 7/1995 |
| JP | A 8-62502 | 3/1996 |
| JP | A 8-63231 | 3/1996 |
| JP | A 8-327895 | 12/1996 |
| JP | A-9-312254 | 12/1997 |
| JP | A 10-163097 | 6/1998 |
| JP | A 10-163098 | 6/1998 |
| JP | A 10-163100 | 6/1998 |
| JP | A 10-209039 | 8/1998 |
| JP | A 10-214783 | 8/1998 |
| JP | A 11-84199 | 3/1999 |
| JP | A-11-84199 | 3/1999 |
| JP | A 10-163099 | 6/1999 |
| JP | A 11-194479 | 7/1999 |
| JP | A-11-194479 | 7/1999 |
| JP | A 11-219902 | 8/1999 |
| JP | A-11-231192 | 8/1999 |
| JP | A 11-231192 | 8/1999 |
| JP | A 11-251217 | 9/1999 |
| JP | A-2000-12453 | 1/2000 |
| JP | A 2000-12453 | 1/2000 |
| JP | A 2000-21765 | 1/2000 |
| JP | A-2000-28898 | 1/2000 |
| JP | A 2000-28898 | 1/2000 |
| JP | A-2000-29202 | 1/2000 |
| JP | A 2000-29202 | 1/2000 |
| JP | A-2000-47114 | 2/2000 |
| WO | WO98/28665 | 7/1998 |
| WO | WO98/40791 | 9/1998 |
| WO | WO99/10917 | 3/1999 |
| WO | WO99/25010 | 5/1999 |
| WO | WO99/34255 | 7/1999 |
| WO | WO99/49505 | 9/1999 |
| WO | WO99/50712 | 10/1999 |
| WO | WO99/66370 | 12/1999 |

OTHER PUBLICATIONS

U.S. Appl. No. 09/340,236, filed Jul. 1, 1999, Komatsuda.

U.S. Appl. No. 09/661,396, filed Mar. 26, 1999, Irie.

* cited by examiner

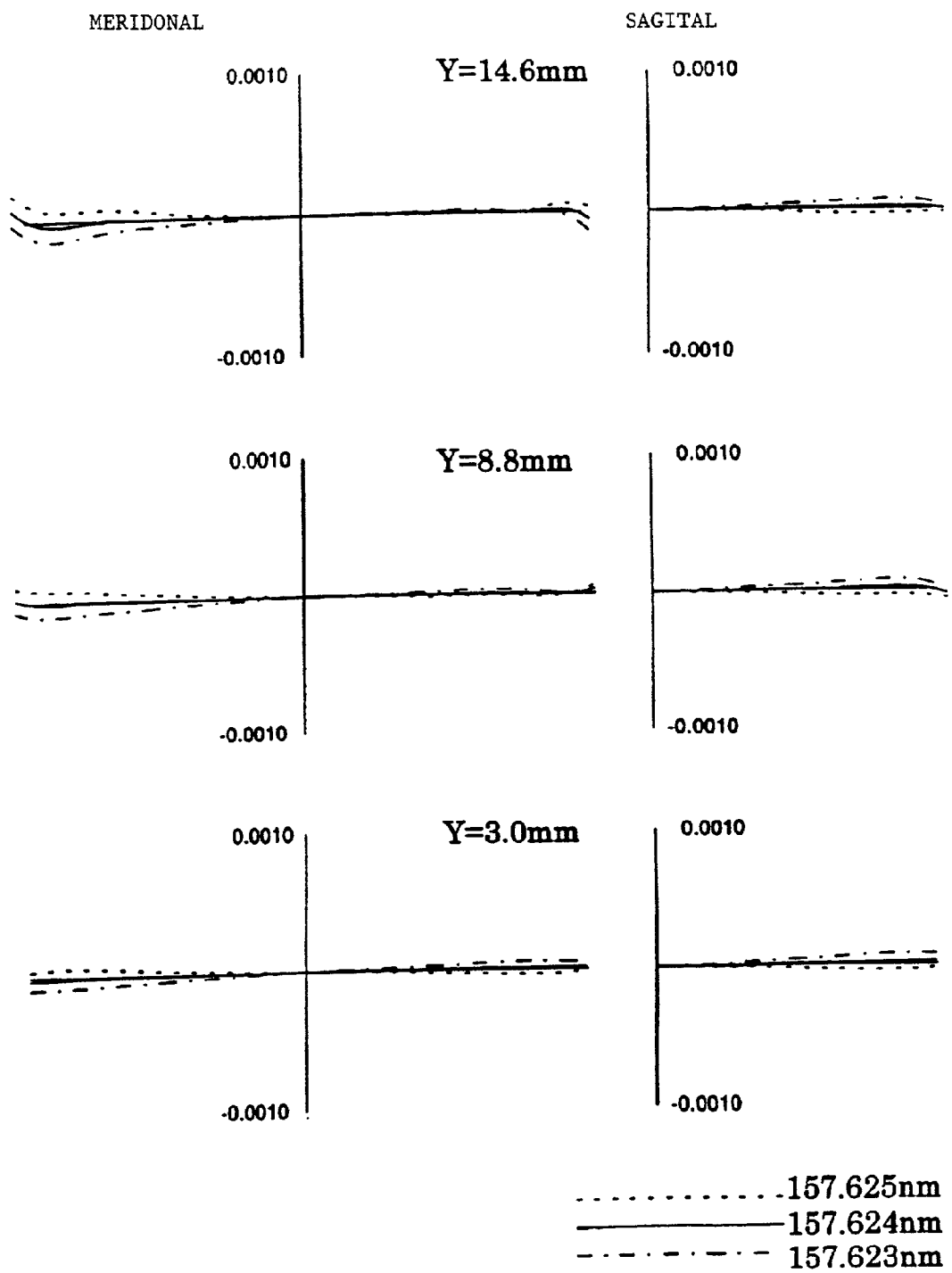

PROJECTION EXPOSURE APPARATUS AND METHOD, CATADIOPTRIC OPTICAL SYSTEM AND MANUFACTURING METHOD OF DEVICES

TECHNICAL FIELD

The present invention relates to a projection exposure apparatus and method used in transferring a negative plate (mask, reticle and the like) onto a workpiece (substrate and the like) in a photolithographic process for manufacturing devices, such as semiconductor devices, image pickup devices, liquid crystal display devices or thin-film magnetic heads and so on and relates to a high-resolution catadioptric type projection optical system suitable for such projection exposure apparatus.

BACKGROUND ART

In the photolithographic process for manufacturing semiconductor devices and so on, projection exposure apparatus in which a pattern image of a photomask or a reticle (generically called "reticle" hereafter) is exposed onto a workpiece such as a wafer, or a glass plate and the like coated with a photoresist and the like via projection optical system have been used. Then, the resolving power (resolution) required for the projection optical system of the projection exposure apparatus has been increased more and more in order to improve the integration level of semiconductor devices and so on. As a result, the wavelength of illuminating light (exposure light) must be shortened and the numerical aperture (NA) of the projection optical system must be increased.

For example, if an exposure light with wavelength of 180 nm or less is used, it is possible to achieve a high resolution of 0.1 µm or less. However, if the wavelength of illuminating light is shortened, the absorption of light becomes remarkable, and the kinds of glass materials (optical materials) that can be practically used are limited. In particular, if the wavelength of illuminating light becomes 180 nm or less, the practically usable glass material is limited to fluorite only. As a result, the correction of chromatic aberrations becomes impossible in a dioptric type projection optical system. Here, the dioptric type optical system is an optical system which does not contain reflective surfaces (concave reflective mirrors and convex reflective mirrors) with power, but only contains transmissive optical members, such as lens components.

As described above, there is a limit to the allowable chromatic aberrations in a dioptric type projection optical system, and a very narrow band of laser light source is needed. In this case, an increase in the cost of laser light source and a decrease of its output are unavoidable. Moreover, many positive lenses and negative lenses must be arranged in a dioptric optical system to bring the Petzval sum, which affects the curvature of image field, close to 0. By contrast, a concave reflective mirror corresponds to a positive lens as an optical element for converging light, but it is different from a positive lens in that no chromatic aberrations occur and that the Petzval sum takes a negative value (a positive lens takes a positive value in this connection).

In a so called catadioptric optical system constituted by combining a concave reflective mirror and lenses, the above characteristic of the concave reflective mirror is best used to the maximum in an optical design and good correction of aberrations beginning with the chromatic aberrations and the curvature of image field are possible in spite of its simple construction. However, the manner in which an incident beam and an emergent beam are separated for a concave reflective mirror is point of greatest difficulty, and various techniques for this separation have been proposed.

For example, Japanese Laid-Open Application No. 8-62502 (U.S. Pat. No. 5,861,997) discloses a catadioptric optical system which is a catadioptric optical system using an exposure region (off-axis visual field) free of an optical axis in a projection exposure apparatus and is of a type wherein intermediate images are formed twice on the way of the optical system and the separation of beam is spatially conducted in the vicinity of the intermediate images.

SUMMARY OF THE INVENTION

The present invention is aimed at providing a catadioptric optical system which facilitates optical adjustment and mechanical design, fully corrects aberrations beginning with chromatic aberrations and achieves a high resolution of 0.1 µm or less using a light with wavelength of 180 µnm or less in the vacuum ultraviolet wavelength region.

Moreover, the present invention is aimed at providing a projection exposure apparatus and an exposure method which results in facilitating optical adjustment and mechanical design, fully corrects aberrations beginning with chromatic aberrations, and ensures a high resolution of, e.g., 0.1 µm or less and lowly sets up the off-axis quantity of an effective exposure region from the optical axis.

Furthermore, the present invention is aimed at providing a manufacturing method of microdevices which results in the manufacture of good micro-devices at a high resolution of, e.g., 0.1 µm or less.

To achieve the previous objects, a catadioptric optical system according to a first aspect of the preferred embodiment is a catadioptric optical system for forming a reduced image of a first surface onto a second surface and comprises a first imaging optical subsystem for forming a first intermediate image of the first surface, which is arranged onto an optical path between the first surface and the second surface and has a dioptric imaging optical system; a first folding mirror for deflecting a beam incident to the first intermediate image or a beam from the first intermediate image, which is arranged in the vicinity of a position for forming the first intermediate image; a second imaging optical subsystem for forming a second intermediate image of a magnification factor nearly equal to the first intermediate image in the vicinity of a position for forming the first intermediate image based on the beam from the first intermediate image, which has a concave reflecting mirror and at least one negative lens; a second folding mirror for deflecting a beam incident to the second intermediate image or a beam from the second intermediate image, which is arranged in the vicinity of a position for forming the second intermediate image; and a third imaging optical subsystem for forming the reduced image onto the second surface based on a beam from the second intermediate image, which is arranged onto an optical path between the second imaging optical subsystem and the second surface and has a dioptric imaging optical system.

To achieve the objects, the catadioptric optical system according to a second aspect of the preferred embodiment is a catadioptric optical system for forming a reduced image of a first surface onto a second surface and comprises a first imaging optical subsystem, arranged in an optical path between the first surface and the second surface, having a first optical axis, and a dioptric imaging optical system; a second imaging optical subsystem, arranged in an optical path between the first imaging optical system and the second surface, having a concave reflecting mirror and a second optical axis; and a third imaging optical subsystem, arranged in an optical path between the second iamging optical system and the second surface, having a third optical axis and a dioptric imaging optical system where the first optical axis and the second optical axis intersect with each other, and the second optical axis and the third optical axis intersect with each other.

To achieve the objects, a catadioptric optical system according to a third aspect of the preferred embodiment is a catadioptric optical system for forming a reduced image of a first surface onto a second surface and comprises a first imaging optical subsystem, arranged in an optical path between the first surface and the second surface, having a first optical axis, and a dioptric imaging optical system; a second imaging optical subsystem, arranged in an optical path between the first imaging optical subsystem and the second surface, having a concave reflecting mirror and a second optical axis; and a third imaging optical subsystem, arranged in an optical path between the second imaging optical subsystem and the second surface, having a third optical axis, and a dioptric imaging optical system; where the first optical axis and the third optical axis are located on a common axis.

To achieve the previous objects, a projection exposure apparatus according to a fourth aspect of the preferred embodiment comprises: a projection optical system in which a pattern on a negative plate arranged in the first surface is projected onto a workpiece arranged in the second surface and exposed, which is arranged in an optical path between the first surface and the second surface and the projection optical system comprises a first imaging optical subsystem which has a dioptric imaging optical system; a second imaging optical subsystem which has a concave reflecting mirror; a third imaging optical subsystem which has a dioptric imaging optical system; a first folding mirror which is arranged in an optical path between the first imaging optical subsystem and the second imaging optical subsystem; a second folding mirror which is arranged in an optical path between the second imaging optical subsystem and the third imaging optical subsystem; where the first imaging optical subsystem forms a first intermediate image on an optical path between the first imaging optical subsystem and the second imaging optical subsystem and the second imaging optical subsystem forms a second intermediate image on an optical path between the second imaging optical subsystem and the third imaging optical subsystem.

To achieve the previous mentioned objects, an exposure method according to a fifth aspect of the preferred embodiment is an exposure method in which a pattern on a negative plate is projected onto a workpiece via a projection optical system and exposed and comprises the following steps: an illuminating light of ultraviolet region is led to the pattern on the negative plate; the illuminating light is led to the first imaging optical subsystem having a dioptric imaging optical system via the pattern to form a first intermediate image of the pattern on the projection negative plate; a light from the first intermediate image is led to a second imaging optical subsystem having a concave reflecting mirror to form a second intermediate image; a light from the second intermediate image is led to a third imaging optical subsystem having a dioptric imaging optical system to form a final image on the workpiece; a light from the first imaging optical subsystem is deflected by a first folding mirror arranged on an optical path between the first intermediate image and the second imaging optical subsystem; and a light from the second imaging optical subsystem is deflected by a second folding mirror arranged on an optical path between the second intermediate image and the third imaging optical subsystem.

To achieve the previous mentioned objects, an imaging optical system according to a sixth aspect of the preferred embodiment is an imaging optical system for forming an image of a first surface onto a second surface and comprises at least one reflecting surface arranged between the first surface and the second surface, and the reflecting surface comprises a metallic reflecting film and a correction film arranged on the metallic reflecting film for correcting a phase difference which is caused by a difference in polarized state possessed by a reflected light from the metallic reflecting film.

To achieve the previous objects, a projection exposure apparatus according to a seventh aspect of the preferred embodiment is a projection exposure apparatus in which a pattern on a negative plate arranged on a first surface is projected onto a workpiece arranged on the second surface and exposed and comprises that the projection optical system arranged in an optical path between the first surface and the second surface and having at least one reflecting members and the reflecting member reflect a light so that a phase difference of a P polarized component and a S polarized component substantially does not exist when the P polarized component and the S polarized component come to the photosensitive substrate.

BRIEF DESCRIPTION OF DRAWINGS

FIG. 14 is a diagram illustrating the lateral aberrations in the third embodiment.

DETAILED DESCRIPTION OF PREFERRED EMBODIMENTS

Figure 1:
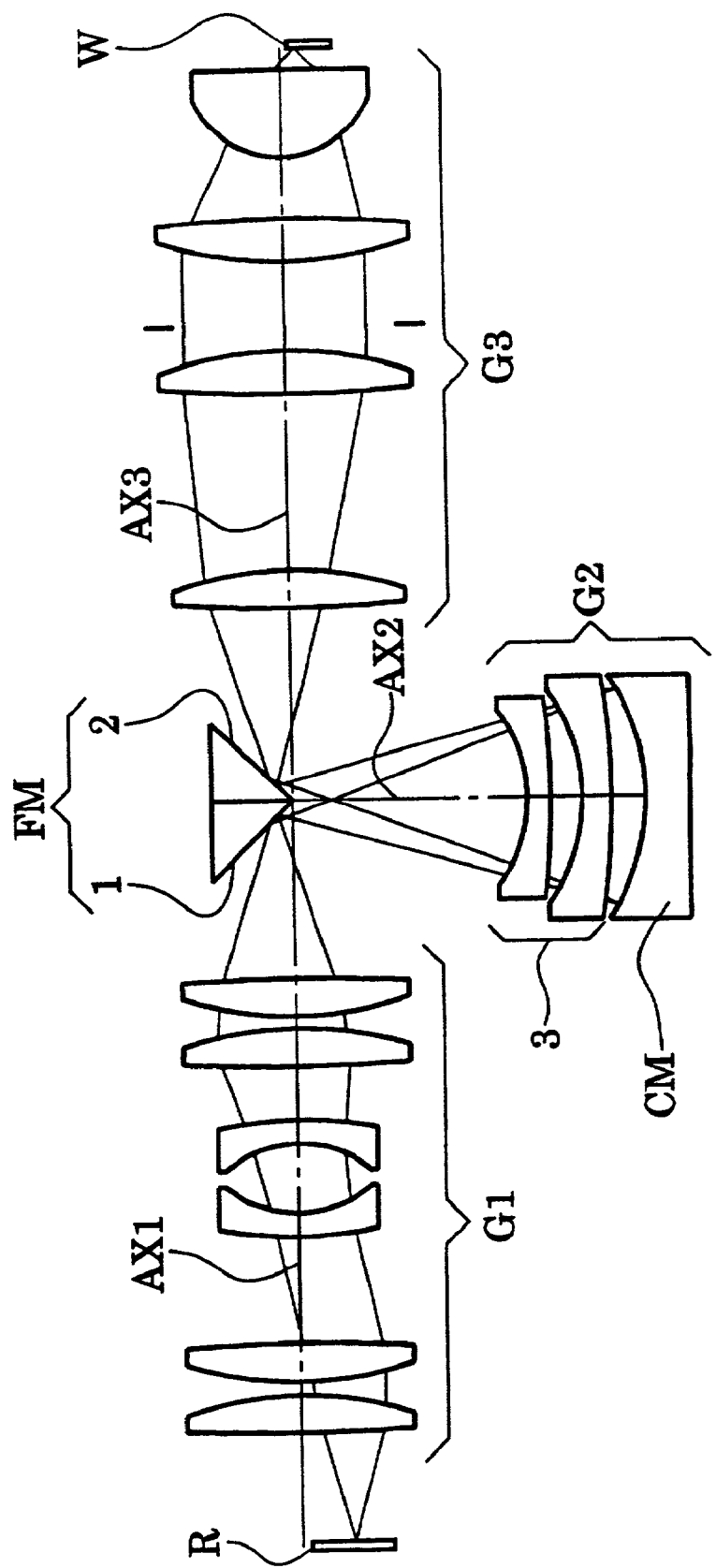
FIG. 1 is a diagram illustrating the basic construction of a catadioptric optical system of the present invention.

FIG. 1 is a diagram illustrating the basic construction of a catadioptric optical system of the present invention. In the diagram, the catadioptric optical system of the present invention is applied to the projection optical system of a projection exposure apparatus.

As shown in FIG. 1, the catadioptric optical system of the present invention is provided with a dioptric type first imaging optical system G1 for forming a first intermediate image of a pattern of reticle R arranged as a first surface as a negative plate.

A first optical path folding mirror 1 is arranged in the vicinity of formation position of the first intermediate image formed by the first imaging optical system G1. The first optical path folding mirror 1 deflects a beam incident to the first intermediate image or a beam from the first intermediate image to a second imaging optical system G2. The second imaging optical system G2 has a concave reflecting mirror (CM) and at least one negative lens 3, and a second intermediate image (an image of the first intermediate image and a secondary image of the pattern) nearly equal in size to the first intermediate image is formed in the vicinity of formation position of the first intermediate image based on the beam from the first intermediate image.

A second optical path folding mirror 2 is arranged in the vicinity of formation position of the second intermediate image formed by the second imaging optical system G2. The second optical path folding mirror 2 deflects a beam incident to the second intermediate image or a beam from the second intermediate image to a dioptric type third imaging optical system G3. Here, the reflecting surface of the first optical path folding mirror 1 and the reflecting surface of the second optical path folding mirror 2 are positioned so as not to overlap spatially. The third imaging optical system G3 forms a reduced image of pattern of the reticle (an image of the second intermediate image and a final image of the catadioptric optical system) on a wafer W arranged as a second surface as photosensitive substrate based on the beam from the second intermediate image.

In the above construction, a chromatic aberration and a positive Petzval sum produced by the first imaging optical system G1 and the third imaging optical system G3, which are dioptric optical systems comprising plural lenses, are compensated by the concave reflecting mirror CM and the negative lens(es) 3. Moreover, the second intermediate image can be formed in the vicinity of the first intermediate image by a construction that the second imaging optical system G2 has a nearly equal (unit) magnification. In the present invention, the distance from the optical axis of an exposure region (i.e., an effective exposure region), namely, the off-axis quantity can be lowly set up by conducting an optical path separation in the vicinity of these two intermediate images. This is not only favorable in aberration correction, but also favorable in miniaturization of optical systems, optical adjustment, mechanical design, manufacturing cost, and so on.

As described above, the second imaging optical system G2 bears the compensation of the chromatic aberration and the positive Petzval sum produced by the first imaging optical system G1 and the third imaging optical system G3 all alone. For this reason, a large power (dioptric power) must be set up for both the concave reflecting mirror CM and the negative lens(es) 3 constituting the second imaging optical system G2. Therefore, if the symmetry of the second imaging optical system G2 collapses, the occurrence of asymmetrical chromatic aberrations such as lateral chromatic aberration or chromatic coma aberration increases, thus an enough resolution power cannot be obtained. Accordingly, the present invention succeeds in ensuring good symmetry and preventing the previous mentioned asymmetrical chromatic aberrations by adopting a construction which results in a set up having a nearly unity magnification for the second imaging optical system G2 and by arranging the concave reflecting mirror CM in the vicinity of its pupil position.

The construction of the present invention is described in more detail hereafter with reference to the following conditions.

In the present invention, it is preferable that the magnification $\beta 2$ satisfies the following condition (1).

$$0.82 < |\beta 2| < 1.20 \qquad (1)$$

Condition (1) specifies an appropriate range of magnification $\beta 2$ of the second imaging optical system G2.

If this condition (1) is not satisfied, it is not preferred because the off-axis quantity for the optical path separation increases, thus the large scale and complication of the optical systems cannot be avoided. In addition, it is not preferred because the occurrence of asymmetrical chromatic aberrations such as lateral chromatic aberration or chromatic coma aberration and the like cannot be prevented.

It is more preferable that the lower limit is 0.85 and the upper limit is 1.15 for condition (1). It is even more preferable that the lower limit is 0.87 for condition (1).

In the present invention, it is preferable that the following condition (2) is satisfied.

$$|L1-L2|/|L1| < 0.15 \qquad (2)$$

Here, L1 is the distance between the first intermediate image and the concave reflecting mirror CM in the second imaging optical system G2 along the optical axis. L2 is the distance between the second intermediate image and the concave reflecting mirror CM in the second imaging optical system G2 along the optical axis. In the case of the present invention, L1 and L2 are distances from the intersection of the optical axis and a perpendicular from the intermediate image to the optical axis when extending the perpendicular down to the concave reflecting mirror CM along the optical axis because the intermediate image is not formed on the optical axis.

Condition (2) specifies a positional relation between the first intermediate image formed by the first imaging optical system G1 and the second intermediate image formed by the second imaging optical system G2.

If condition (1) is not satisfied, it is not preferred because the off-axis quantity for the optical path separation increases, thus the large scale and complication of the optical systems cannot be avoided.

It is more preferable that the upper limit is 0.85 for condition (2).

In the present invention, it is preferable that the first intermediate image is formed on the optical path between the first optical path folding mirror 1 and the second imaging optical system G2, and the second intermediate image is formed on the optical path between the second imaging optical system G2 and the second optical path folding mirror 2. In this case, the stability of the optical systems increases and the optical adjustment and mechanical design become easy because the distance between first surface and second surface can be shortened. Moreover, when the present invention is applied to a projection exposure apparatus, the height of the whole apparatus can be reduced because the distance between the reticle R arranged on the first surface and the wafer arranged on second surface is shortened.

In the present invention, it is preferable that the following condition (3) is satisfied.

$$0.20 < |\beta|/|\beta 1| < 0.50 \quad (3)$$

Here, $\beta$ is the magnification of the catadioptric optical system (projection optical system if applied to a projection exposure apparatus). $\beta 1$ is the magnification of the first imaging optical system G1.

Condition (3) specifies an appropriate range of the ratio of the magnification of the whole system $\beta$ to the magnification of the first imaging optical system G1.

If the ratio is more than the upper limit of condition (3), it is undesirable because the angle of dispersion (angle range) of a beam incident into the first optical path folding mirror 1 and the second optical path folding mirror 2 increases and consequently the design of a reflecting film becomes difficult. In particular, reflecting film materials usable for a light with wavelength shorter than 180 nm are also limited, thus it is difficult to keep the reflectivity at a high level in a broad angular band constant. The difference in reflectivity between P polarized light and S polarized light or the phase change also changes with the angle of incidence and therefore in its turn is associated with deterioration of the imaging property of the whole system.

On the other hand, if the ratio is less than the lower limit of this condition (3), it is undesirable because the load of magnification factor, which should be the burden of the third imaging optical system G3, rises, and thus a large scale of the optical systems cannot be avoided.

Moreover, it is more preferable that the lower limit of condition (3) is 0.25 and its upper limit is 0.46.

Furthermore, in the present invention, it is preferable that the catadioptric optical system is a telecentric optical system on both sides of the first surface and the second surface. When the system is applied to a projection exposure apparatus, it is preferable that the projection optical system is a telecentric optical system on both reticle side and wafer side. This construction enables to lowly suppress the magnification error or distortion of image when positional errors or warp of the reticle or wafer and the like occur. Furthermore, it is preferable that an angle made by a light passing through the center of beam (i.e., principal ray) becomes 50 minutes or less in the whole field so that the optical systems are substantially telecentric.

In the present invention, it is preferable to satisfy the following condition (4), in addition to the catadioptric optical system, which is telecentric on both sides.

$$|E-D|/|E| < 0.24 \quad (4)$$

Here, E is the distance between the surface on the image side of the first imaging optical system G1 and its exit pupil position along the optical axis. D is the distance by air conversion from the surface on the image side of the first imaging optical system G1 to the concave reflecting mirror CM in the second imaging optical system G2 along the optical axis.

Condition (4) specifies a positional relation between the exit pupil of the first imaging optical system G1 and the concave reflecting mirror CM.

If condition (4) is not satisfied, it is not preferable because the occurrence of asymmetrical chromatic aberrations such as lateral chromatic aberration or chromatic coma aberration and the like cannot be lowly suppressed.

Moreover, it is more preferable that the upper limit of condition (4) is 0.17.

Furthermore, it is preferable in the present invention that the intersection line of an assumed extension plane of the reflecting plane (an assumed plane obtained by infinitely extending a planar reflecting plane) of the first optical path folding mirror 1 and an assumed extension plane of the reflecting plane of the second optical path folding mirror 2 is so set up that an optical axis AX1 of the first imaging optical system G1, an optical axis AX2 of the second imaging optical system G2 and an optical axis AX3 of the third imaging optical system G3 intersect at one point (reference point). This construction results in the optical axis AX1 of the first imaging optical system G1 and the optical axis AX3 of the third imaging optical system G3 becoming a common optical axis, and particularly enables to position the three optical axes AX1–AX3 and the two reflecting planes in relation to one reference point. Therefore, the stability of the optical systems increases, and the optical adjustment and mechanical design become easy. An even higher accuracy optical adjustment can be facilitated and even higher stability can be achieved by setting the optical systems so that the optical axis AX2 is perpendicular to the optical axis AX1 of the first imaging optical system G1 and the optical axis AX3 of the third imaging optical system G3.

Furthermore, it is preferable in the present invention that all lenses constituting the first imaging optical system G1 and all lenses constituting the third imaging optical system G3 are arranged along a single optical axis. This construction causes any flexure due to gravity to become rotationally symmetrical and provides to lowly suppress the deterioration of imaging property due to the optical adjustment. In particular, when it is applied to a projection exposure apparatus, the reticle R and the wafer W can be arranged parallel to each other along a plane perpendicular to the gravity direction (i.e., horizontal plane) and all lenses constituting the first imaging optical system G1 and the third imaging optical system G3 can be arranged horizontally along a single optical axis in the gravity direction by using the first imaging optical system G1 and the third imaging optical system G3 in an upright position along the common optical axis. As a result, the reticle, wafer and most of the lenses constituting the projection optical system are held horizontally, not subjected to an asymmetrical deformation due to their own weight, and this is very favorable in ensuring optical adjustment, mechanical design, high resolution and the like.

Further, it is preferable in the present invention that over 85% of the number of lenses in all lenses constituting the catadioptric optical system (the projection optical system in the case of applying it to a projection exposure apparatus) are arranged along a single optical axis. For example, if the first imaging optical system G1 and the third imaging optical system G3 are used in an upright position along the common optical axis, almost all lenses in many lenses constituting the optical systems are held horizontally and an asymmetrical deformation due to their own weight does not occur by this construction, therefore it is further favorable in ensuring optical adjustment, mechanical design, high resolution and the like.

Additionally, as described above, the negative lens(es) 3 in the second imaging optical system G2 requires a large power (refractive power) to compensate for chromatic aberrations being produced by the first imaging optical system G1 and the third imaging optical system G3 alone. Accordingly, it is preferable in the present invention that the second imaging optical system G2 has at least two negative lenses 3. This construction enables to divide and bear a necessary power with at least two negative lenses and in its turn provides to constitute stabilized optical systems.

Embodiments of the present invention are described hereafter, with reference to the following drawings.

Figure 2:
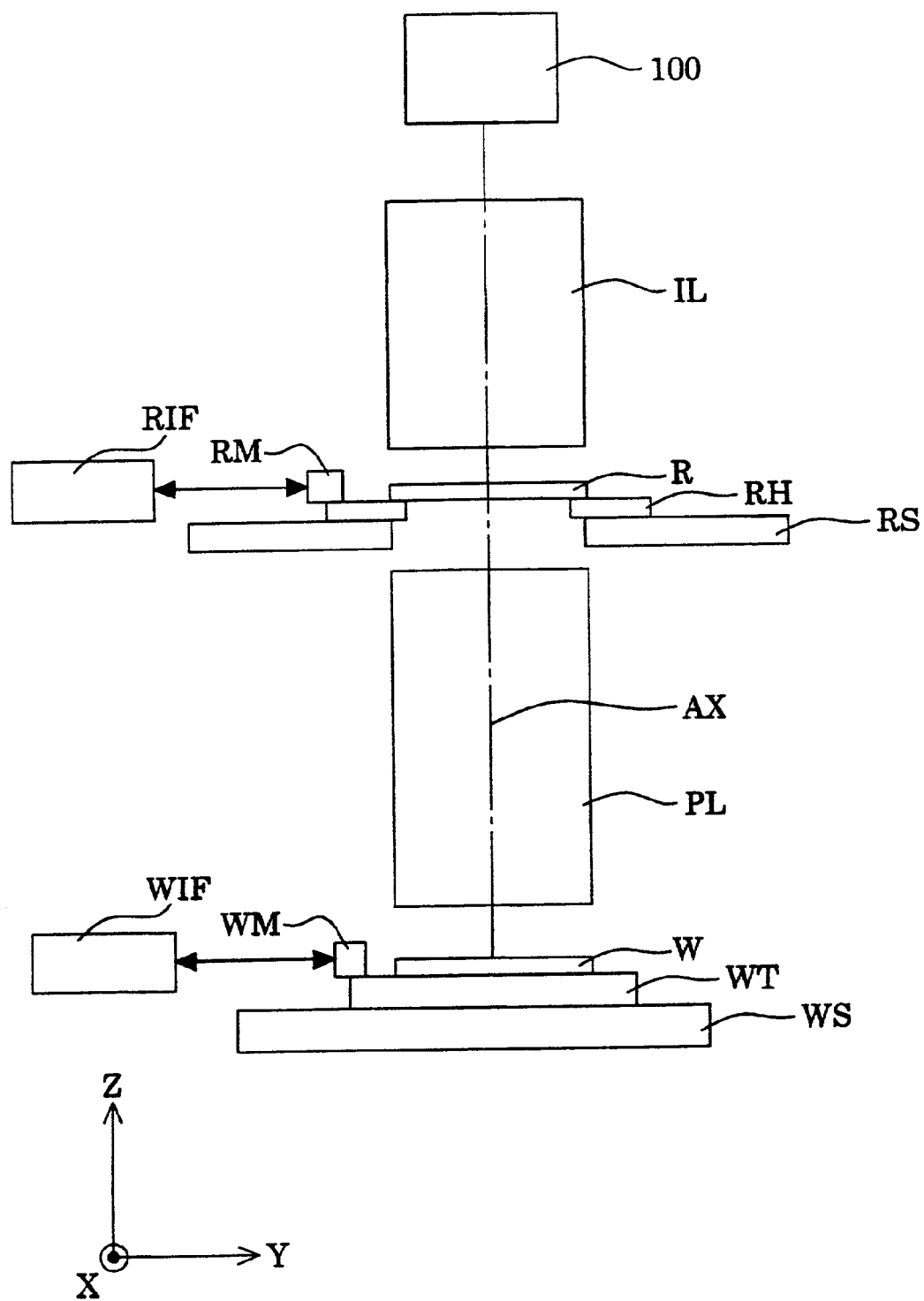
FIG. 2 is a diagram schematically illustrating the general construction of a projection exposure apparatus provided with catadioptric optical systems according to embodiments of the present invention as a projection optical system.

FIG. 2 is a diagram schematically showing the general construction of a projection exposure apparatus which is provided with a catadioptric optical system according to embodiments of the present invention as a projection optical system. In FIG. 2, the Z axis is set up in parallel to a reference optical axis AX of the catadioptric optical system constituting a projection optical system PL, the Y axis is set up in parallel to the paper surface of FIG. 2 in a plane perpendicular to the optical axis AX. Moreover, FIG. 2 schematically shows the general construction of a projection exposure apparatus, and its detailed construction will be described later in FIGS. 8–10.

The described projection exposure apparatus is provided with, e.g., a $F_2$ laser (wavelength 157.624 nm) as a light source 100 for supplying an illuminating light of ultraviolet region. The illuminating light emergent from the light source 100 evenly illuminates a reticle R where a given pattern is formed.

Moreover, an optical path between the light source 100 and an illuminating optical system IL is sealed by a casing (not shown), and a space from the light source 100 to an optical member on the reticle side in the illuminating optical system IL is filled with an inert gas, such as helium gas or nitrogen gas and the like being a gas with a low absorptivity of exposure light, or kept in a nearly vacuum state.

The reticle R is in parallel held in the XY plane on a reticle stage RS via a reticle holder RH. A pattern to be transferred is formed on the reticle, and a rectangular (slit-like) pattern region with a long side along the X direction and a short side along the Y direction in the whole pattern region is illuminated. The reticle stage RS is movable two-dimensionally along the reticle surface (i.e., the XY plane) by the action of a driving system whose illustration is omitted and is so constituted that its position coordinates are measured and positionally controlled by an interferometer RIF using a reticle moving (measuring) mirror RM.

A light from the pattern formed on the reticle forms a reticle pattern image on a wafer W, which is a photosensitive substrate, via a catadioptric type projection optical system PL. The wafer W is in parallel held on the XY plane on a wafer stage WS via a wafer table (wafer holder) WT. Then, a pattern image is formed in a rectangular exposure region with a long side along the X direction and a short side along the Y direction on the wafer W so as to correspond to the rectangular illuminating region on the reticle R optically. The wafer stage WS is movable two-dimensionally along the wafer surface (i.e., the XY plane) by the action of a driving system whose illustration is omitted, and its position coordinates are measured and positionally controlled by an interferometer WIF using a wafer moving (measuring) mirror WM.

Figure 3:
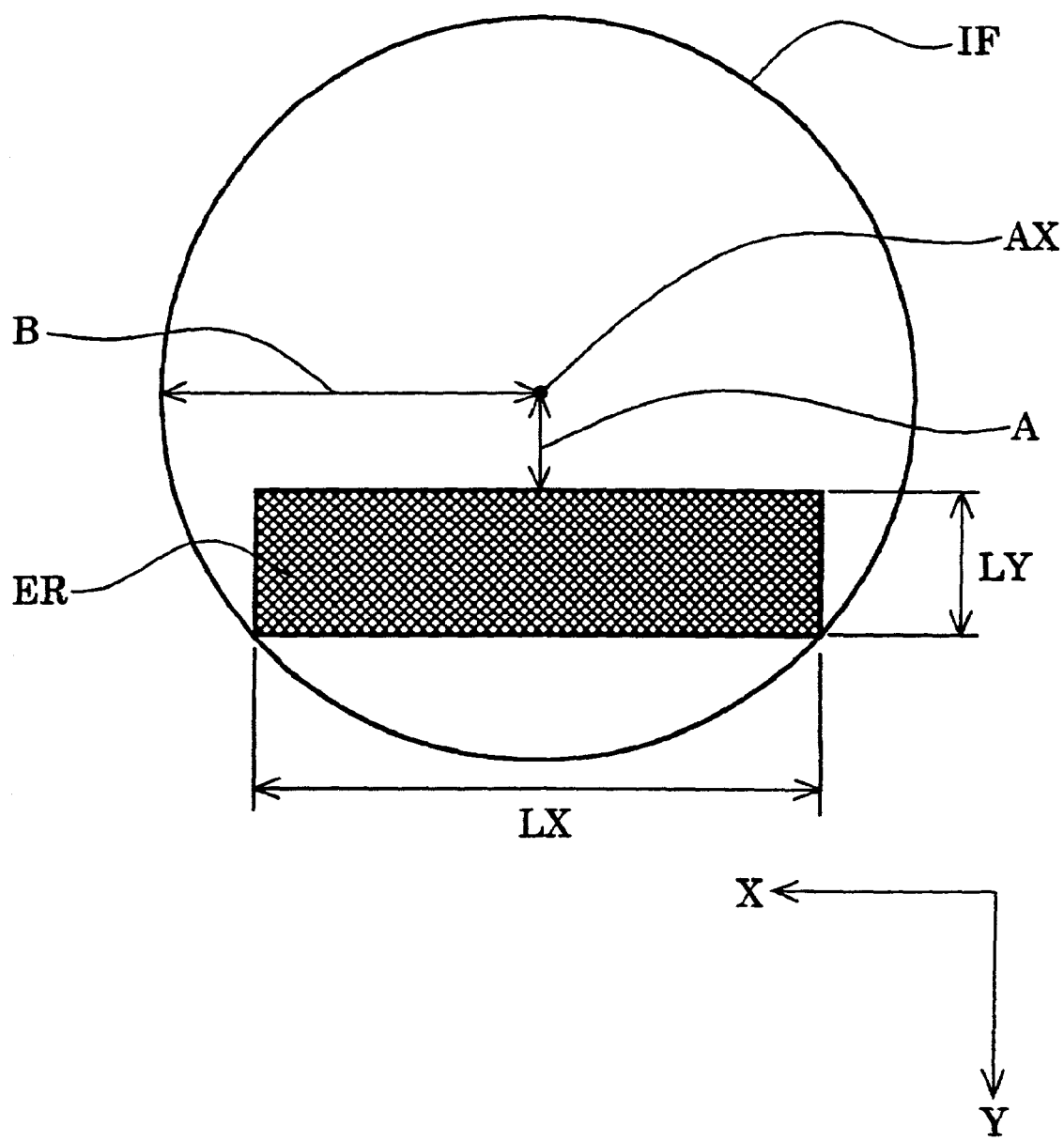
FIG. 3 is a diagram illustrating the positional relation between a rectangular exposure region (i.e., effective exposure region) formed on a wafer W and a reference optical axis.

FIG. 3 is a diagram showing a positional relation between the rectangular exposure region (i.e., effective exposure region) formed on the wafer W and the reference optical axis.

As shown in FIG. 3, in the embodiments, a rectangular effective exposure region ER having a desirable size is set up in a position separated from the reference axis AX by only an off-axis quantity A in the +Y direction in a circular region (image circle) with a radius B and with the reference axis AX as its center. Here, the X-direction length of the effective exposure region ER is LX and its Y-direction length is LY.

In other words, in the embodiments, the rectangular effective exposure region ER having a desirable size is set up in a position separated from the reference axis AX by an off-axis quantity A in the +Y direction, and the radius B of the circular image circle IF is specified so as to include the effective exposure region ER with the reference axis AX as its center.

Therefore, a description is omitted, but a rectangular illumination region (i.e., effective illumination region) with a size and a shape corresponding to the effective exposure region ER is formed in a position separated from the reference axis AX by only a distance corresponding to the off-axis quantity A in the −Y direction.

Moreover, in the described projection exposure apparatus, the projection optical system PL is so constituted that its inside is kept in an air (gas)-tight state between an optical member arranged on the reticle side (lens L11 in the embodiments) and an optical member arranged on the wafer side (lens L311 in the embodiments) among optical members constituting the projection optical system PL, and is filled with an inert gas such as helium gas or nitrogen gas and the like or kept in a nearly vacuum state.

Furthermore, the reticle R and the reticle stage RS and the like are arranged in a narrow optical path between the illumination optical system IL and the projection optical system PL, but an inert gas, such as nitrogen or helium gas and the like, is filled into a casing (not shown) which seals and encloses the reticle R and the reticle stage RS and the like or the casing is kept in a nearly vacuum state.

Additionally, the wafer W and the wafer stage WS and the like are arranged in a narrow optical path between the projection optical system PL and the wafer W, but an inert gas, such as nitrogen or helium gas and the like, is filled into a casing (not shown) which seals and encloses the wafer W and the wafer stage WS and the like or the casing is kept in a nearly vacuum state.

Thus, an atmosphere in which the exposure light is almost not absorbed is formed over the whole optical path from the light source 100 to the wafer W.

As described above, the illumination region on the reticle and the exposure region on the wafer W (i.e., effective exposure region ER) specified by the projection optical system PL are rectangles with short sides in the Y direction. Therefore, the reticle pattern is scanned and exposed for a region which has a width equal to the long side of the exposure region on the wafer W and has a length corresponding to the scan quantity (moving quantity) of the wafer W by moving (scanning) the reticle stage RS and the wafer stage WS and in its turn the reticle R and the wafer W synchronously in the same direction (i.e., same orientation) along the short-side direction, i.e., the Y direction of the rectangular exposure region and the illumination region, while the positional control of the reticle R and the wafer W is taken by a driving system or an interferometer (RIF, WIF) and the like.

In the embodiments, the projection optical system PL including the catadioptric optical system is provided with a dioptric type first imaging optical system G1 for forming a first intermediate image of the pattern of the reticle arranged on the first surface, a second imaging optical system G2 comprising a concave reflecting mirror CM and two negative lenses 3 for forming a second intermediate image nearly unitary to the first intermediate image (a nearly equal size image of the first intermediate image and a secondary image of the reticle pattern) and a dioptric type third imaging optical system G3 for forming a final image of the reticle pattern (a reduced image of the reticle pattern) on the wafer W arranged on the second surface based on a light from the second intermediate image.

Moreover, in the embodiments, a first optical path folding mirror 1 for deflecting the light from the first imaging optical system G1 to the second imaging optical system G2 is arranged in the vicinity of the formation position of the first intermediate image in an optical path between the first imaging optical system G1 and the second imaging optical system G2. A second optical path folding mirror 2 for deflecting the light from the second imaging optical system G2 to the third imaging optical system G3 is arranged in the vicinity of the formation position of the second intermediate image in an optical path between the second imaging optical system G2 and the second imaging optical system G3. In the embodiments, the first intermediate image and the second intermediate image are formed in an optical path between the first optical path folding mirror 1 and the second imaging optical system G2 and an optical path between the second imaging optical system G2 and the second optical path folding mirror 2, respectively.

Furthermore, in the embodiments, the first imaging optical system G1 has a linearly extended optical axis AX1, the third imaging optical system G3 has a linearly extended optical axis AX3, the optical axis AX1 and the optical axis AX3 are set up so as to coincide with the reference optical axis AX, which is a common single axis. As a result, the reticle and the wafer W are arranged in parallel to each other along a plane perpendicular to the gravity direction, i.e., a horizontal plane. In addition, all lenses constituting the first imaging optical system G1 and all lenses constituting the third imaging optical system G3 are also arranged along the horizontal plane on the reference optical axis AX.

On the other hand, the second imaging optical system G2 also has a linearly extended optical axis AX2, and this optical axis AX2 is set up so as to be perpendicular to the reference optical axis AX, which is the common single axis. Moreover, both the first optical path folding mirror 1 and the second optical path folding mirror 2 have planar reflecting surfaces and are integrally constituted as one optical member (one optical path folding mirror FM) with two reflecting planes. The intersection line of these two reflecting planes (strictly the intersection line of their assumed extended planes) are set up so that the axis AX1 of the first imaging optical system G1, the axis AX2 of the second imaging optical system G2 and the axis AX3 of the third imaging optical system G3 intersect at one point. Furthermore, both the first optical path folding mirror 1 and the second optical path folding mirror 2 are constituted as front surface reflecting mirrors in the first embodiment and in the second embodiment, and both the first optical path folding mirror 1 and the second optical path folding mirror 2 are constituted as rear (back) surface reflecting mirrors in the third embodiment. The smaller the interval between the effective region of reflecting plane of the optical path folding mirror FM and optical AX is set up, the less the off-axis quantity A of the effective exposure region will be.

In the embodiments, fluorite ($CaF_2$ crystal) is used for all dioptric optical members (lens component) constituting the projection optical system. The wavelength of the $F_2$ laser being exposure light is 157.624 nm, the dioptric index of $CaF_2$ in the vicinity of 157.624 nm changes in a ratio of $-2.6 \times 10^{-6}$ per +1 pm of wavelength change and in a ratio of $+2.6 \times 10^{-6}$ per −1 pm of wavelength change. In other words, the dispersion of dioptric index $(dn/d\lambda)$ of $CaF_2$ on the vicinity of 157.624 nm is $2.6 \times 10^{-6}$ pm.

Therefore, in the first and second embodiments, the dioptric index of $CaF_2$ to the wavelength 157.624 nm is 1.559238, the dioptric index of $CaF_2$ to 157.624 nm+1 pm=157.625 nm is 1.5592354, and the dioptric index of $CaF_2$ to 157.624 nm−1 pm=157.623 nm is 1.5592406. On the other hand, in the third embodiment, the dioptric index of $CaF_2$ to the wavelength 157.624 nm is 1.559307, the dioptric index of $CaF_2$ to 157.624 nm+1 pm 157.625 nm is 1.5593041, and the dioptric index of $CaF_2$ to 157.624 nm−1 pm=157.623 nm is 1.5593093.

Furthermore, in the embodiments, if the height in a direction perpendicular to the optical axis is taken as y, the distance (amount of sag) from a tangent plane at the vertex of aspherical surface to a position on the aspherical surface at the height y along the optical axis as z, the vertex curvature radius as r, the conic coefficient as k and the n-order aspherical coefficient as $C_n$, then the aspherical surface is expressed by the following numerical formula (a).

$$z=(y^2/r)/[1+\{1-(1+\kappa)\cdot y^2/r^2\}^{1/2}]+C_4 \cdot y^4+C_6 \cdot y^6+C_8 \cdot y^8+C_{10} \cdot y^{10}+C_{12} \cdot y^{12}+C_{14} \cdot y^{14} \quad (a)$$

In the embodiments, a * sign is attached on the right side of surface no. on a lens surface which is formed into an aspherical shape.

[Embodiment 1]

Figure 4:
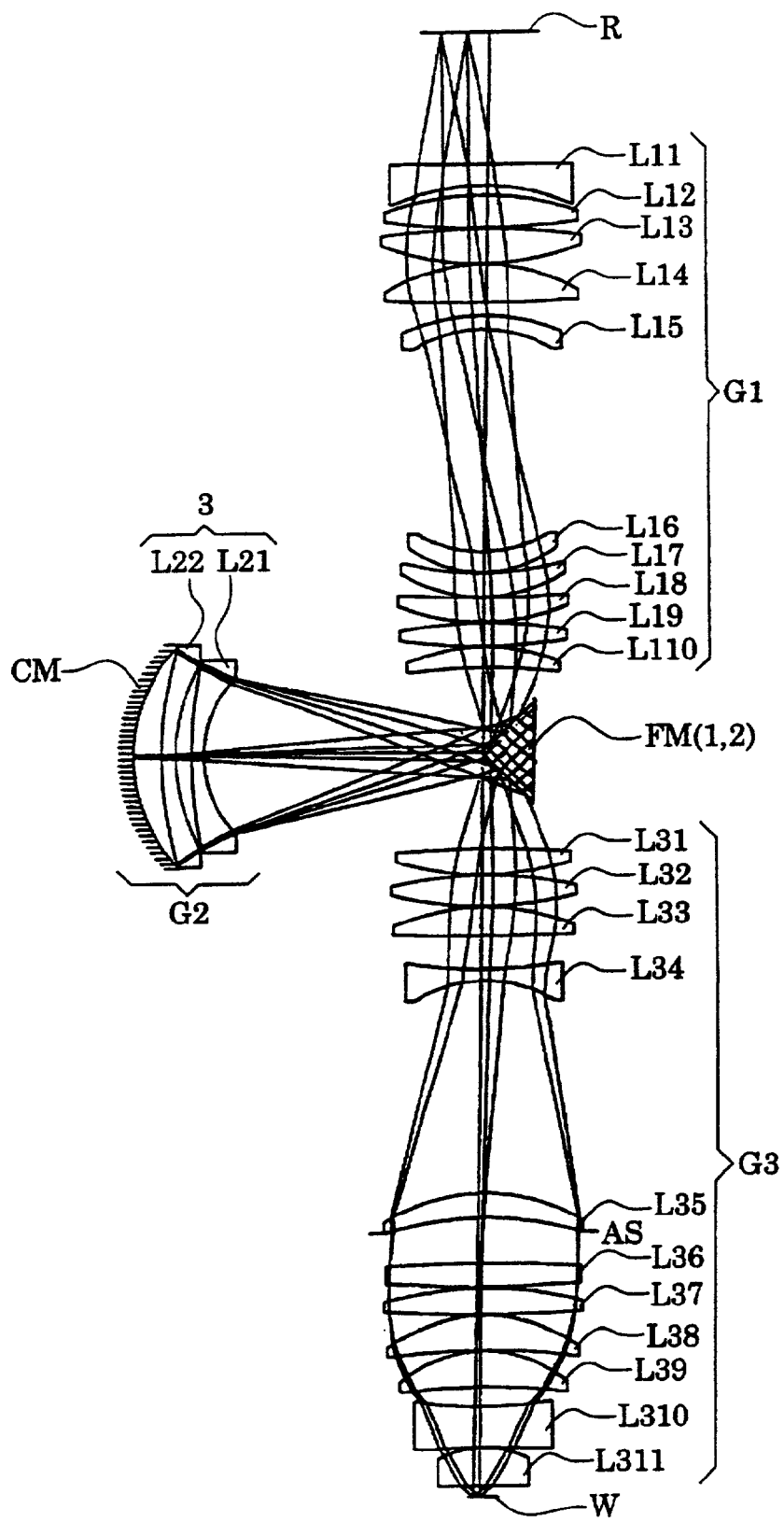
FIG. 4 is a diagram illustrating the lens construction of a catadioptric optical system (projection optical system PL) according to a first embodiment.

FIG. 4 is a diagram showing the lens construction of a catadioptric optical system (projection optical system PL) according to a first embodiment. In the first embodiment, the present invention is applied to a projection optical system in which aberrations including chromatic aberrations are corrected for an exposure light with wavelength of 157.624 nm±1 pm.

In the catadioptric optical system of FIG. 4, the first imaging optical system G1 comprises a negative meniscus lens L11 having an aspherical concave surface facing to the wafer side, a biconvex lens L12, a biconvex lens L13, a biconvex lens L14, a negative meniscus lens L15 having a convex surface facing to the reticle side, a positive meniscus lens L16 having a concave surface facing to the reticle side, a positive meniscus lens L17 having a concave surface facing to the reticle side, a positive meniscus lens L18 having a concave surface facing to the reticle side, a biconvex lens L19 and a positive meniscus lens L110 having a convex surface facing to the reticle side in order from the reticle side.

The second imaging optical system G2 comprises a negative meniscus lens L21 having a concave surface facing to the reticle side, a negative meniscus lens L22 having an aspherical concave surface facing to the reticle side and a concave reflecting mirror CM in order from the reticle side along the propagative route of light (i.e., the incident side).

The third imaging optical system G3 comprises a biconvex lens L31 having an aspherical convex surface facing to the facing reticle side, a biconvex lens L32, a biconvex lens L33, a biconcave lens L34, a positive meniscus lens L35 having a convex surface facing to the reticle side, an aperture stop AS, a biconvex lens L36 having an aspherical convex surface facing to the wafer side, a biconvex lens L37, a positive meniscus lens L38 having a convex surface facing to the reticle side, a positive meniscus lens L39 having a convex surface facing to the reticle side, a biconcave lens L310 and a plano-convex lens L311 having a plane surface facing to the wafer side in order from the reticle side along the propagative route of light.

Values of data of the catadioptric optical system of the first embodiment are identified in the following table (1). In the table (1), λ represents the wavelength of exposure light, β the projection magnification (magnification of whole system), NA the numerical aperture on the image side (wafer side), B the radius of image circle IF on wafer W, A the off-axis quantity of effective exposure region ER, LX the dimension of effective exposure region ER along the X direction (dimension of long side), and LY the dimension of effective exposure region ER along the Y direction (dimension of short side), respectively.

Moreover, the surface no. represents the order of surfaces from the reticle side along the propagative direction of light from the reticle surface, being the object surface (first surface) to the wafer surface, being the image surface (second surface), r the curvature radius of surface (vertex curvature radius in the case of aspherical surface: mm), d the axial space of surface, i.e., surface distance (mm), and n the dioptric index to wavelength, respectively.

Furthermore, the surface distance d changes its sign with reflected degree. Therefore, the sign of the surface distance d is taken as negative on the optical path from the first optical path folding mirror 1 to the concave reflecting mirror CM and on the optical path from the second optical path folding mirror 2 to the image surface, and is taken as positive in other optical paths. Then, the curvature radius of a convex surface facing to the reticle side is taken as positive and the curvature radius of a concave surface facing to the reticle side is taken as negative in the first imaging optical system G1. On the other hand, the curvature radius of a concave surface facing to the reticle side is taken as positive and the curvature radius of a convex surface facing to the reticle side is taken as negative in the third imaging optical system G3. The curvature radius of a concave surface facing to the reticle side (i.e., incident side) is taken as positive and the curvature radius of a convex surface facing to the reticle side (i.e., incident side) is taken as negative along the progression route of light in the second imaging optical system G2.

TABLE 1

(Main data)

λ = 157.624 nm
β = −0.25
NA = 0.75
B = 14.6 mm
A = 3 mm
LX = 22 mm
LY = 6.6 mm (Data of optical members)

| Surface no. | r | d | n |
|---|---|---|---|
|  | (reticle surface) | 129.131192 |  |
| 1 | 8233.14221 | 20.000000 | 1.559238 (lens L11) |
| 2* | 229.43210 | 8.970677 |  |
| 3 | 286.74048 | 31.000034 | 1.559238 (lens L12) |
| 4 | −803.12188 | 1.000000 |  |
| 5 | 666.75874 | 33.633015 | 1.559238 (lens L13) |
| 6 | −296.74142 | 1.000000 |  |
| 7 | 180.00000 | 38.351830 | 1.559238 (lens L14) |
| 8 | −2028.08028 | 13.262240 |  |
| 9 | 201.14945 | 12.933978 | 1.559238 (lens L15) |
| 10 | 128.43682 | 221.621142 |  |
| 11* | −127.65364 | 20.866949 | 1.559238 (lens L16) |
| 12 | −120.00000 | 1.000000 |  |
| 13 | −302.13109 | 23.424817 | 1.559238 (lens L17) |
| 14 | −150.00000 | 1.000000 |  |
| 15 | −1158.54680 | 23.049991 | 1.559238 (lens L18) |
| 16 | −228.52501 | 1.000000 |  |
| 17 | 433.60390 | 22.934308 | 1.559238 (lens L19) |
| 18 | −656.20038 | 1.000000 |  |
| 19 | 188.30389 | 21.335899 | 1.559238 (lens L110) |
| 20 | 563.10068 | 86.000000 |  |
| 21 | ∞ | −273.261089 (first optical path folding mirror 1) |  |
| 22 | 114.73897 | −12.000000 | 1.559238 (lens L21) |
| 23 | 453.07648 | −16.355803 |  |

TABLE 1-continued

| | | | |
|---|---|---|---|
| 24* | 172.15013 | −13.328549 | 1.559238 (lens L22) |
| 25 | 395.88538 | −28.227312 | |
| 26 | 162.85844 | 28.227312 | (concave reflecting mirror CM) |
| 27 | 395.88538 | −13.328549 | 1.559238 (lens L22) |
| 28* | 172.15013 | 16.355803 | |
| 29 | 453.07648 | 12.000000 | 1.559238 (lens L21) |
| 30 | 114.73897 | 273.261089 | |
| 31 | ∞ | −94.835481 | (second optical path folding mirror 2) |
| 32* | −774.94652 | −26.931959 | 1.559238 (lens L31) |
| 33 | 275.96516 | −1.000000 | |
| 34 | −376.08486 | −31.371246 | 1.559238 (lens L32) |
| 35 | 388.08658 | −1.000000 | |
| 36 | −219.25460 | −29.195314 | 1.559238 (lens L33) |
| 37 | 4359.72825 | −32.809802 | |
| 38 | 505.14516 | −12.000000 | 1.559238 (lens L34) |
| 39 | −128.75641 | −209.396172 | |
| 40 | −180.58054 | −24.481519 | 1.559238 (lens L35) |
| 41 | −331.81286 | −14.336339 | |
| 42 | ∞ | −30.366910 | (aperture stop AS) |
| 43 | −1502.56896 | −24.392042 | 1.559238 (lens L36) |
| 44* | 933.76923 | −1.000000 | |
| 45 | −357.34412 | −25.686455 | 1.559238 (lens L37) |
| 46 | 2099.98513 | −1.000000 | |
| 47 | 163.08575 | −32.557214 | 1.559238 (lens L38) |
| 48 | −631.02443 | −1.000000 | |
| 49 | −124.04732 | −35.304921 | 1.559238 (lens L39) |
| 50 | −639.72650 | −18.536315 | |
| 51 | 467.75212 | −40.196625 | 1.559238 (lens L310) |
| 52 | −616.22436 | −1.000000 | |
| 53 | −95.47627 | −38.068687 | 1.559238 (lens L311) |
| 54 | ∞ | −11.016920 | |

(wafer surface)
(Aspherical data)
Surface 2

$r = 229.43210$  $\kappa = 0.000000$
$C_4 = 0.174882 \times 10^{-7}$  $C_6 = -0.593217 \times 10^{-12}$
$C_8 = -0.194756 \times 10^{-16}$  $C_{10} = 0.677479 \times 10^{-21}$
$C_{12} = -0.212612 \times 10^{-25}$  $C_{14} = -0.320584 \times 10^{-30}$ Surface 11

$r = -127.65364$  $\kappa = 0.000000$
$C_4 = -0.130822 \times 10^{-7}$  $C_6 = 0.512133 \times 10^{-12}$
$C_8 = 0.875810 \times 10^{-16}$  $C_{10} = 0.138750 \times 10^{-19}$
$C_{12} = -0.203194 \times 10^{-25}$  $C_{14} = 0.241236 \times 10^{-27}$ Surface 24 and Surface 28 (same Surface)

$r = 172.15013$  $\kappa = 0.000000$
$C_4 = 0.293460 \times 10^{-7}$  $C_6 = -0.868472 \times 10^{-12}$
$C_8 = -0.848590 \times 10^{-17}$  $C_{10} = -0.159330 \times 10^{-22}$
$C_{12} = 0.868714 \times 10^{-26}$  $C_{14} = -0.116970 \times 10^{-29}$ Surface 32

$r = -774.94652$  $\kappa = 0.000000$
$C_4 = 0.253400 \times 10^{-7}$  $C_6 = -0.505553 \times 10^{-12}$
$C_8 = 0.151509 \times 10^{-16}$  $C_{10} = -0.433597 \times 10^{-21}$
$C_{12} = 0.841427 \times 10^{-26}$  $C_{14} = 0.165932 \times 10^{-30}$ Surface 44

$r = 933.76923$  $\kappa = 0.000000$
$C_4 = -0.140105 \times 10^{-7}$  $C_6 = -0.779968 \times 10^{-12}$
$C_8 = -0.148693 \times 10^{-16}$  $C_{10} = 0.100788 \times 10^{-21}$
$C_{12} = -0.251962 \times 10^{-25}$  $C_{14} = 0.104216 \times 10^{-29}$ (Corresponding values of conditions)

$\beta 1 = -0.626$
$\beta 2 = -0.919$
$\beta 3 = -0.435$
L1 = 335.3 mm
L2 = 310.0 mm
E = 484.8 mm
D = 443.3 mm
(1) $|\beta 2| = 0.919$ TABLE 1-continued (2) |L1 − L2| / |L1| = 0.076
(3) |β| / |β1| = 0.400
(4) |E − D| / |E| = 0.086

Figure 5:
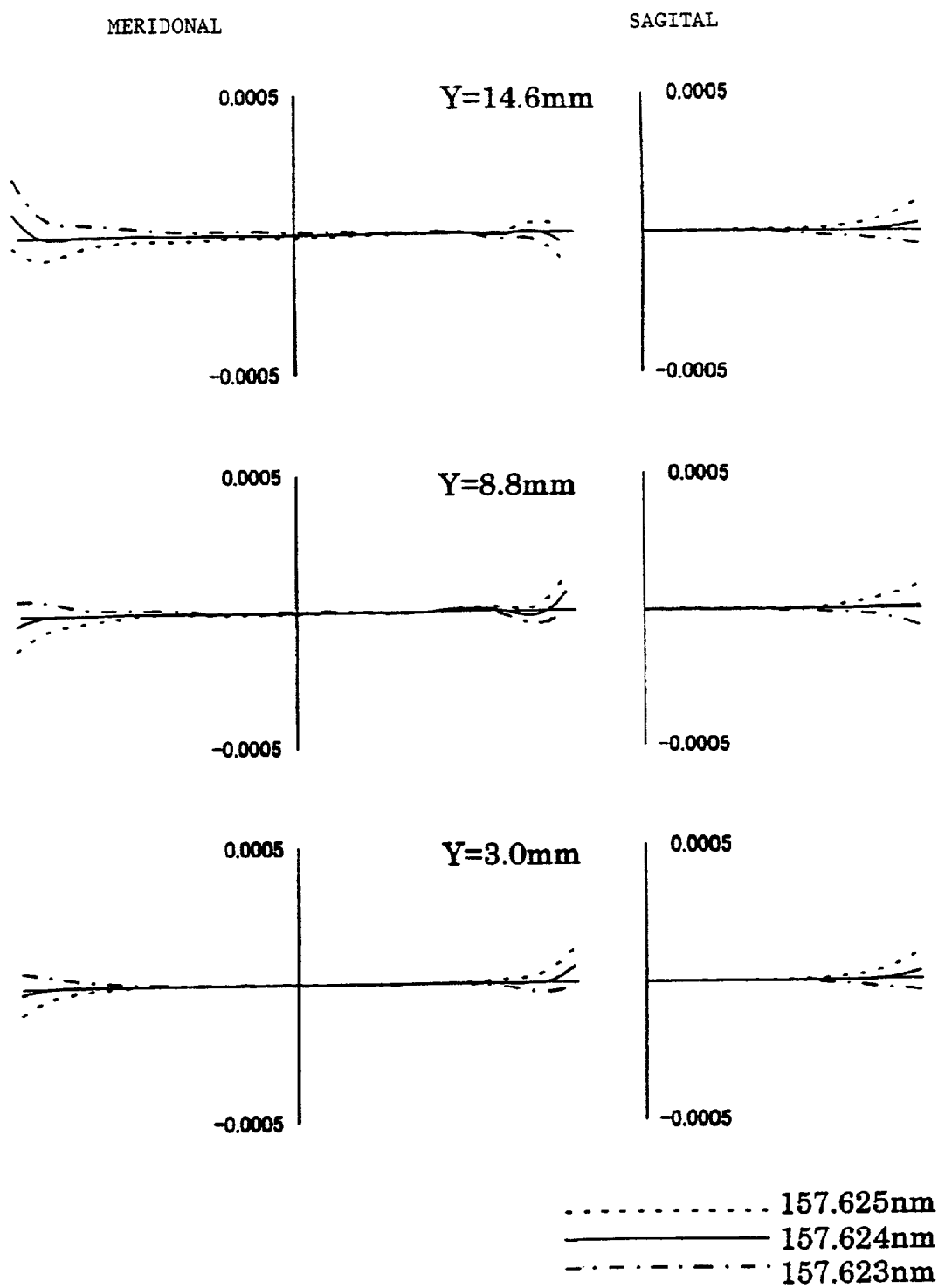
FIG. 5 is a diagram illustrating the lateral aberrations in the first embodiment.

FIG. 5 are charts showing the lateral aberrations in the first embodiment.

In the aberration charts, Y represents the image height, solid lines the wavelength 157.624 nm, broken lines 157.624+1 pm=157.625 nm and dashed lines 157.624−1 pm=157.623 nm, respectively.

As is evident from the aberration charts, it is generally known that the chromatic aberrations are well corrected for the exposure light with a wavelength of 157.624±1 pm in the first embodiment.

[Embodiment 2]

Figure 6:
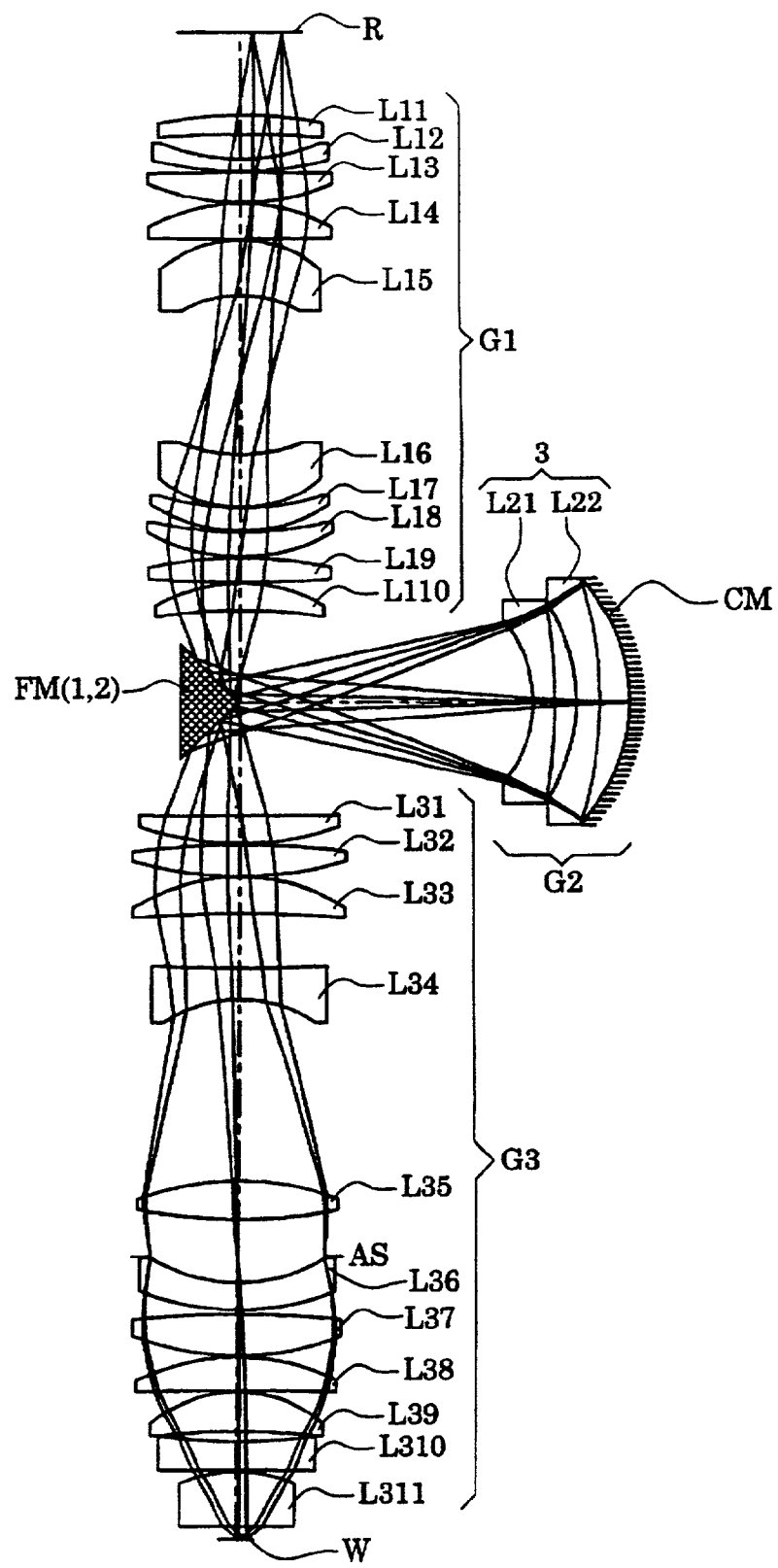
FIG. 6 is a diagram for illustrating the lens construction of a catadioptric optical system (projection optical system PL) according to a second embodiment.

FIG. 6 is a diagram showing the lens construction of a catadioptric optical system (projection optical system PL) according to the second embodiment. In the second embodiment, this invention is applied to a projection optical system in which aberrations including chromatic aberrations are corrected for an exposure light with wavelength width of 157.624 nm±1 pm similarly as in the first embodiment.

In the catadioptric optical system of FIG. 6, the first imaging optical system G1 comprises a positive meniscus lens L11 having an aspherical concave surface facing the wafer side, a negative meniscus lens L12 having a concave surface facing the reticle side, a biconvex lens L13, a biconvex lens L14, a positive meniscus lens L15 having a convex surface facing the reticle side, a positive meniscus lens L16 having an aspherical concave surface facing the reticle side, a positive meniscus lens L17 having a concave surface facing the reticle side, a positive meniscus lens L18 having a concave surface facing the reticle side, a biconvex lens L19 and a positive meniscus lens L110 having an aspherical concave surface facing the wafer side in order from the reticle side.

The second imaging optical system G2 comprises a negative meniscus lens L21 having a concave surface facing the reticle side, a negative meniscus lens L22 having an aspherical concave surface facing the reticle side and a concave reflecting mirror CM in order from the reticle side along the propagative route of light (i.e., the incident side).

The third imaging optical system G3 comprises a biconvex lens L31 having an aspherical convex surface facing the reticle side, a biconvex lens L32, a positive meniscus lens L33 having a convex surface facing the reticle side, a biconcave lens L34, a biconvex lens L35, an aperture stop AS, a negative meniscus lens L36 having an aspherical convex surface facing the wafer side, a biconvex lens L37, a positive meniscus lens L38 having an aspherical convex surface facing the reticle side, a positive meniscus lens L39 having a convex surface facing the reticle side, a biconcave lens L310 and a plano-convex lens L311 having a plane surface facing the wafer side in order from the reticle side along the propagative route of light (i.e., the incident side).

Values of data of the catadioptric optical system of the second embodiment are identified in the following table (2). In the table (2), λ represents the wavelength of exposure light, β the projection magnification (magnification of whole system), NA the numerical aperture on the image side (wafer side), B the radius of image circle IF on wafer W, A the off-axis quantity of effective exposure region ER, LX the dimension of effective exposure region ER along the X direction (dimension of long side), and LY the dimension of effective exposure region ER along the Y direction (dimension of short side), respectively.

Moreover, surface no. represents the order of surfaces from the reticle side along the propagative direction of light from the reticle surface being the object surface (first surface) to the wafer surface, being the image surface (second surface), r the curvature radius of surface (vertex curvature radius in the case of aspherical surface: mm), d the axial space of surface, i.e., surface distance (mm), and n the dioptric index to wavelength, respectively.

Furthermore, the surface distance d changes its sign with reflected degree. Therefore, the sign of the surface distance d is taken as negative on the optical path from the first optical path folding mirror 1 to the concave reflecting mirror CM and on the optical path from the second optical path folding mirror 2 to the image surface, and is taken as positive in other optical paths. Then, the curvature radius of a convex surface facing to the reticle side is taken as positive and the curvature radius of a concave surface facing to the reticle side is taken as negative in the first imaging optical system G1. On the other hand, the curvature radius of a concave surface surfacing to the article side is taken as positive and the curvature radius of a convex surface facing to the article side is taken as negative in the third imaging optical system G3. The curvature radius of a concave surface facing to the reticle side (i.e., the incident side) is taken as positive and the curvature radius of a convex surface facing to the reticle side (i.e., the incident side) is taken as negative along the propagative route of light in the second imaging optical system G2.

TABLE 2

| (Main data) |
| --- |
| λ = 157.624 nm |
| β = −0.25 |
| NA = 0.75 |
| B = 14.6 mm |
| A = 3 mm |
| LX = 22 mm |
| LY = 6.6 mm |

| (Data of optical members) | | | |
| --- | --- | --- | --- |
| Surface no. | r | d | n |
| | (reticle surface) | 74.237501 | |
| 1 | 392.09887 | 18.011517 | 1.559238 (lens L11) |
| 2* | 1161.26854 | 22.550885 | |
| 3 | −197.82341 | 12.000000 | 1.559238 (lens L12) |
| 4 | −320.24045 | 1.072412 | |
| 5 | 4535.10509 | 27.582776 | 1.559238 (lens L13) |
| 6 | −230.22207 | 1.003799 | |
| 7 | 180.02979 | 31.376675 | 1.559238 (lens L14) |
| 8 | −16797.46544 | 1.001727 | |

TABLE 2-continued

| | | | |
|---|---|---|---|
| 9 | 120.09101 | 49.640624 | 1.559238 (lens L15) |
| 10 | 111.81156 | 146.176310 | |
| 11* | −147.64267 | 50.000000 | 1.559238 (lens L16) |
| 12 | −120.00000 | 1.034195 | |
| 13 | −243.75596 | 21.927192 | 1.559238 (lens L17) |
| 14 | −150.02545 | 1.001112 | |
| 15 | −355.46587 | 23.499758 | 1.559238 (lens L18) |
| 16 | −170.06869 | 1.005485 | |
| 17 | 380.97487 | 22.758028 | 1.559238 (lens L19) |
| 18 | −1174.10533 | 1.018161 | |
| 19 | 162.68954 | 24.816537 | 1.559238 (lens L110) |
| 20* | 644.69642 | 86.000000 | |
| 21 | ∞ | −275.440338 | (first optical path folding mirror 1) |
| 22 | 116.98457 | −20.000000 | 1.559238 (lens L21) |
| 23 | 556.37904 | −19.644110 | |
| 24* | 165.29528 | −22.001762 | 1.559238 (lens L22) |
| 25 | 383.86012 | −26.835741 | |
| 26 | 170.53370 | 26.835741 | (concave reflecting mirror CM) |
| 27 | 383.86012 | 22.001762 | 1.559238 (lens L22) |
| 28* | 165.29528 | 19.644110 | |
| 29 | 556.37094 | 20.000000 | 1.559238 (lens L21) |
| 30 | 116.98457 | 275.440338 | |
| 31 | ∞ | −106.008415 | (second optical path folding mirror 2) |
| 32* | −8761.14467 | −25.535977 | 1.559238 (lens L31) |
| 33 | 279.72974 | −1.078193 | |
| 34 | −751.81935 | −30.303960 | 1.559238 (lens L32) |
| 35 | 352.73770 | −1.006012 | |
| 36 | −178.20333 | −35.675204 | 1.559238 (lens L33) |
| 37 | −1076.81270 | −51.479106 | |
| 38 | 1804.27479 | −28.746535 | 1.559238 (lens L34) |
| 39 | −120.27525 | −169.573423 | |
| 40 | −250.01576 | −35.535941 | 1.559238 (lens L35) |
| 41 | 521.40215 | −35.714360 | |
| 42 | ∞ | −24.295048 | (aperture stop AS) |
| 43 | 152.18493 | −24.773335 | 1.559238 (lens L36) |
| 44* | 252.15324 | −4.265268 | |
| 45 | −995.58003 | −37.825368 | 1.559238 (lens L37) |
| 46 | 262.29146 | −1.000000 | |
| 47 | −210.53420 | −30.482411 | 1.559238 (lens L38) |
| 48 | −8044.39654 | −1.002741 | |
| 49 | −124.46496 | −36.754604 | 1.559238 (lens L39) |
| 50 | −627.72968 | −9.489076 | |
| 51 | 534.41093 | −27.941522 | 1.559238 (lens L310) |
| 52 | −9748.42213 | −1.007391 | |
| 53 | −131.28658 | −50.000000 | 1.559238 (lens L311) |
| 54 | ∞ | −12.503787 | |

(wafer surface)
(Aspherical data)
Surface 2

$r = 1161.26854$ $\kappa = 0.000000$
$C_4 = 0.141234 \times 10^{-7}$ $C_6 = 0.566669 \times 10^{-12}$
$C_8 = 0.141094 \times 10^{-16}$ $C_{10} = -0.504032 \times 10^{-20}$
$C_{12} = 0.747533 \times 10^{-24}$ $C_{14} = -0.400565 \times 10^{-28}$ Surface 11

$r = -147.64267$ $\kappa = 0.000000$
$C_4 = 0.117741 \times 10^{-6}$ $C_6 = -0.764549 \times 10^{-11}$
$C_8 = -0.441188 \times 10^{-15}$ $C_{10} = 0.122309 \times 10^{-18}$
$C_{12} = -0.114006 \times 10^{-22}$ $C_{14} = 0.478194 \times 10^{-27}$ Surface 20

$r = 644.69642$ $\kappa = 0.000000$
$C_4 = 0.378434 \times 10^{-7}$ $C_6 = -0.751663 \times 10^{-12}$
$C_8 = 0.247735 \times 10^{-16}$ $C_{10} = -0.222239 \times 10^{-20}$
$C_{12} = 0.256558 \times 10^{-24}$ $C_{14} = -0.235204 \times 10^{-28}$ Surface 24 and surface 28 (same surface)

$r = 165.28528$ $\kappa = 0.000000$
$C_4 = -0.236840 \times 10^{-7}$ $C_6 = 0.766085 \times 10^{-12}$
$C_8 = -0.122244 \times 10^{-16}$ $C_{10} = -0.209608 \times 10^{-21}$
$C_{12} = 0.109632 \times 10^{-25}$ $C_{14} = -0.837618 \times 10^{-30}$ Surface 32

$r = -8761.14467$ $\kappa = 0.000000$
$C_4 = 0.138366 \times 10^{-7}$ $C_6 = -0.162646 \times 10^{-12}$
$C_8 = 0.264075 \times 10^{-17}$ $C_{10} = 0.265565 \times 10^{-22}$
$C_{12} = -0.494187 \times 10^{-26}$ $C_{14} = -0.786507 \times 10^{-31}$ Surface 44

$r = 252.15324$ $\kappa = 0.000000$
$C_4 = 0.697432 \times 10^{-8}$ $C_6 = -0.714444 \times 10^{-12}$
$C_8 = 0.747474 \times 10^{-17}$ $C_{10} = -0.699569 \times 10^{-21}$
$C_{12} = 0.228691 \times 10^{-25}$ $C_{14} = -0.160543 \times 10^{-29}$ (Corresponding values of conditions)

Figure 7:
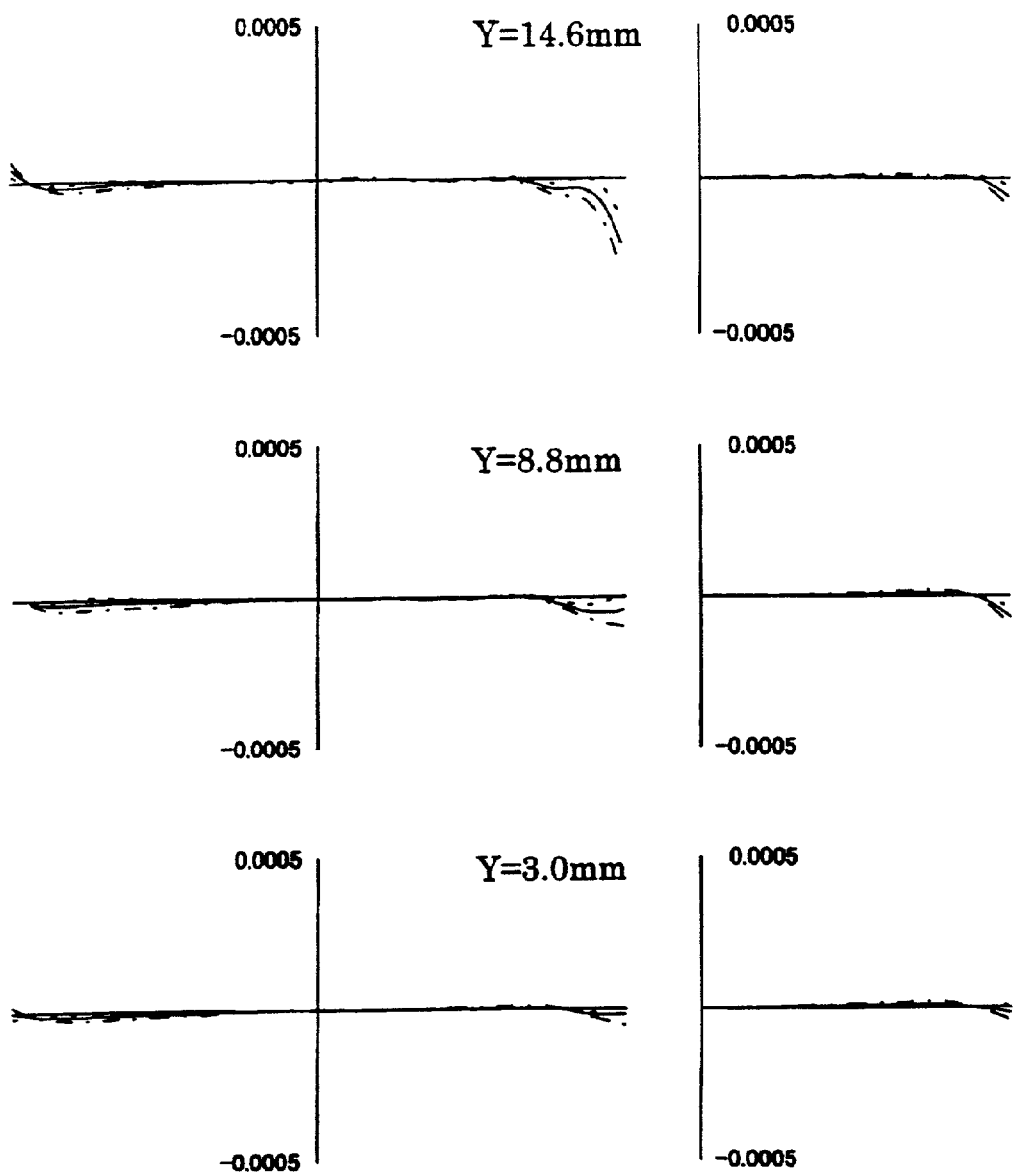
FIG. 7 is a diagram illustrating the lateral aberrations in the second embodiment.

$\beta 1 = -0.650$
$\beta 2 = -0.885$
$\beta 3 = -0.434$
L1 = 347.8 mm
L2 = 311.9 mm
E = 453.1 mm
D = 473.4 mm
(1) $|\beta 2| = 0.885$
(2) $||L1| - |L2|| / |L1| = 0.103$
(3) $|\beta| / |\beta 1| = 0.385$
(4) $|E - D| / |E| = 0.045$ FIG. 7 are charts showing the lateral aberrations in the second embodiment.

In the aberration charts, Y represents the image height, solid lines the wavelength 157.624 nm, broken lines 157.624+1 pm=157.625 nm and dashed lines 157.624−1 pm=157.623 nm, respectively.

As is evident from the aberration charts, it is known that the chromatic aberrations are well corrected for the exposure light with a wavelength of 157.624±1 pm in the second embodiment similar to in the first embodiment.

[Embodiment 3]

In the first and second embodiments, both the first optical path folding mirror 1 and the second optical path folding mirror 2 are constituted as front surface reflecting mirrors. Moreover, in the first and second embodiments, the angular widths of a beam incident into the reflecting plane of the first optical path of a folding mirror 1 and the reflecting plane of the second optical path of a folding mirror 2 increase in proportion to the numerical of aperture on the image side of the catadioptric optical system. In this case, if the reflecting planes are formed of a dielectric multilayer film, the reflectivity changes with the incident angle and the phase of a reflected wave disperses with the incident angle, thus it is difficult to ensure good angular characteristics. Therefore, it is preferable that the reflecting planes are formed of a metal film to obtain good angular characteristics, such as a reflectivity nearly constant for a wide range of incident angles. However, the reduction of reflectivity arises if the metal is subjected to irradiation of the $F_2$ laser in an atmosphere containing little oxygen.

Figures 13A, 13B:
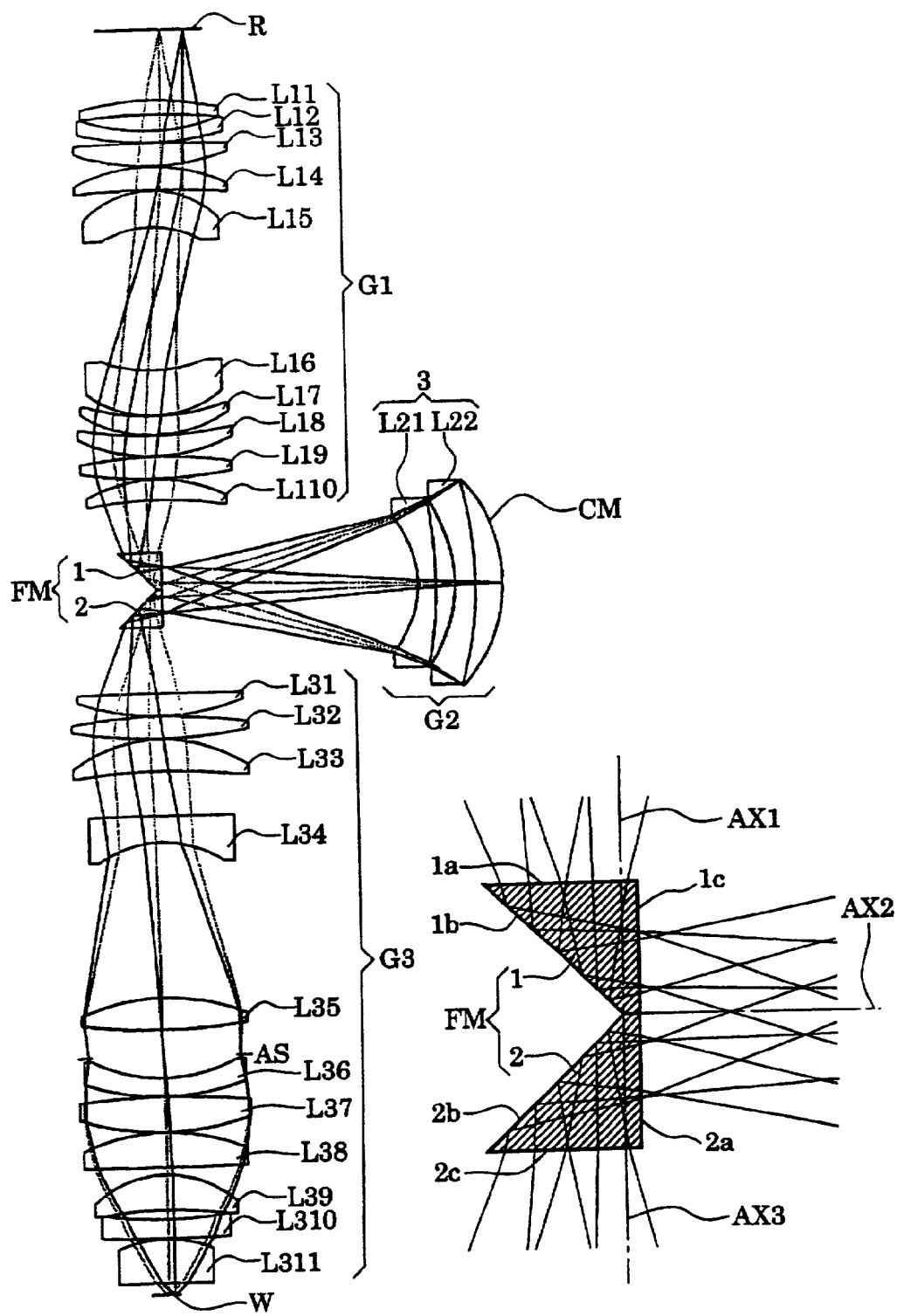
FIG. 13A is a diagram illustrating the lens construction of a catadioptric optical system (projection optical system PL) according to a third embodiment.
FIG. 13B is a diagram for illustrating principal parts of a catadioptric optical system (projection optical system PL) according to a third embodiment.

Accordingly, both the first optical path folding mirror 1 and the second optical path folding mirror 2 are constituted as rear (back) surface reflecting mirrors in the third embodiment. More specifically, as shown in FIG. 13B, the first optical path folding mirror 1 is formed as a right-angle prism having a plane of incidence 1a perpendicular to the optical axis AX1 of a first imaging optical system G1, a reflecting plane 1b inclined to the optical axis AX1 at an angle of 45° and a plane of emergence 1c perpendicular to the optical axis AX2 of a second imaging optical system G2. The second optical path folding mirror 2 is formed as a right-angle prism having a plane of incidence 2a perpendicular to the optical axis AX2 of the second imaging optical system G2, a reflecting plane 2b inclined to the optical axis AX1 at an angle of 45° and a plane of emergence 2c perpendicular to the optical axis AX3 of a third imaging optical system G3.

Moreover, the first optical path folding mirror 1 and the second optical path folding mirror 2 are integrally constituted as one optical path folding mirror FM. Then, the optical axis AX1 of the first imaging optical system G1 and the optical axis AX3 of a third imaging optical system G3 are so set up that they linearly extend and constitute a single common optical axis, i.e., a reference optical axis AX. Furthermore, the intersection line of the rear (back) surface reflecting plane 1b of first optical path folding mirror 1 and the rear (back) surface reflecting plane 2b of second optical path folding mirror 2 are set up so that the optical axis AX1 of the first imaging optical system G1, the optical axis AX2 of the second imaging optical system G2 and the optical axis AX3 of the third imaging optical system G3 intersect at one point (reference point).

As described above, both the first optical path folding mirror 1 and the second optical path folding mirror 2 are constituted as rear (back) surface reflecting mirrors in the third embodiment.

Therefore, the rear (back) surface reflecting plane 1b of the first optical path folding mirror 1 and the rear (back) surface reflecting plane 2b of the second optical path folding mirror 2 are not subjected to the irradiation of $F_2$ laser in an oxygen-containing atmosphere. As a result, the reduction of reflectivity caused by the $F_2$ laser irradiation can be avoided, even if the reflecting planes are formed of a metal film to obtain good angular characteristics, such as a reflectivity that is nearly constant for a wide range of incident angles.

Moreover, if the reflecting planes (1b, 2b) and the transmitting planes (1a, 1c, 2a, 2c) of the first optical path folding mirror 1 and the second optical path folding mirror 2 are located in the vicinity of the formation position of a first intermediate image and a second intermediate image, flaws, defects of coating, dust and the like on these planes are transferred to the wafer surface. Furthermore, setting a reduced length from a reticle R to wafer W results in the miniaturization of the apparatus. The compact nature of the apparatus is also favorable in transportation.

Accordingly, in the third embodiment, the first intermediate image is formed between the emergent plane 1c of the first optical path folding mirror 1 and a concave reflecting mirror CM. The second intermediate image is formed between the concave reflecting mirror CM and incident plane 2a of the second optical path folding mirror 2. The third embodiment is specifically described below.

FIG. 13A is a diagram illustrating the lens construction of a catadioptric optical system (projection optical system PL) according to the third embodiment. As in the first and second embodiments, the present invention is also applicable to a projection optical system in which aberrations including chromatic aberrations are corrected for an exposure light with a wavelength of 157.624 nm±1 pm in the third embodiment.

In the catadioptric optical system of FIG. 13A, the first imaging optical system G1 comprises a positive meniscus lens L11 having an aspherical concave surface facing to the wafer side, a negative meniscus lens L12 having a concave surface facing to the reticle side, a biconvex lens L13, a positive meniscus lens L14 having a convex surface facing to the reticle side, a positive meniscus lens L15 having a convex surface facing to the reticle side, a positive meniscus lens L16 having an aspherical concave surface facing to the reticle side, a positive meniscus lens L17 having a concave surface facing to the reticle side, a positive meniscus lens L18 having a concave surface facing to the reticle side, a biconvex lens L19 and a positive meniscus lens L110 having an aspherical concave surface to the wafer side in order from the reticle side.

The second imaging optical system G2 comprises a negative meniscus lens L21 having a concave surface facing to the reticle side, a negative meniscus lens L22 having an aspherical concave surface facing to the reticle side and a concave reflecting mirror CM in order from the reticle side along the propagative route of light (i.e., the incident side).

The third imaging optical system G3 comprises a biconvex lens L31 having an aspherical convex surface facing the reticle side, a biconvex lens L32, a positive meniscus lens L33 having a convex surface facing to the reticle side, a biconcave lens L34, a biconvex lens L35, an aperture stop AS, a negative meniscus lens L36 having an aspherical convex surface facing to the wafer side, a biconvex lens L37, a biconvex lens L38, a positive meniscus lens L39 having a convex surface facing to the reticle side, a negative meniscus lens L310 having a concave surface facing to the reticle side and a plano-convex lens L311 having a plane surface to the wafer side in order from the reticle side along the propagative route of light.

Values of data of the catadioptric optical system of the third embodiment are identified in the following table (3). In the table (3), λ represents the wavelength of exposure light, β the projection magnification (magnification of whole system), NA represents the numerical aperture on the image side (wafer side), B represents the radius of image circle IF on the wafer W, A represents the off-axis quantity of an effective exposure region ER, LX the dimension of the effective exposure region ER along the X direction (dimension of long side), and LY represents the dimension of the effective exposure region ER along the Y direction (dimension of the short side), respectively.

Moreover, surface no. represents the order of surfaces from the reticle side along the propagative direction of light from the reticle surface which is an object surface (first surface) to the wafer surface being the image surface (second surface), r the curvature radius of surface (vertex curvature radius in the case of the aspherical surface: mm), d the axial space of surface, i.e., surface distance (nun), and n the dioptric index to the wavelength, respectively.

Furthermore, the surface distance d changes its sign with reflected degree. Therefore, the sign of the surface distance d is taken as negative on the optical path from the first optical path folding mirror 1 to the concave reflecting mirror CM and on the optical path from the second optical path folding mirror 2 to the image surface, and is taken as positive in other optical paths. Then, the curvature radius of convex surface facing to the reticle side is taken as positive and the curvature radius of the concave surface facing to the reticle side is taken as negative in the first imaging optical system G1. On the other hand, the curvature radius of concave surface facing to the reticle side is taken as positive and the curvature radius of convex surface facing to the reticle side is taken as negative in the third imaging optical system G3. The curvature radius of concave surface directing to the reticle side (i.e., the incident side) is taken as positive and the curvature radius of convex surface facing to the reticle side (i.e., the incident side) is taken as negative along the propagative route of light in the second imaging optical system G2.

TABLE 3

(Main data)

$\lambda$ = 157.624 nm
$\beta$ = −0.25
NA = 0.75
B = 14.6 mm
A = 3 mm
LX = 22 mm
LY = 6.6 mm (Data of optical members)

| Surface no. | r | d | n | |
|---|---|---|---|---|
| (reticle surface) | | 78.905334 | | |
| 1 | 342.16576 | 16.022696 | 1.559307 | (lens L11) |
| 2* | 991.85390 | 17.753350 | | |
| 3 | −219.16547 | 12.000000 | 1.559307 | (lens L12) |
| 4 | −320.00000 | 1.000000 | | |
| 5 | 2955.64579 | 26.141043 | 1.559307 | (lens L13) |
| 6 | −246.44297 | 1.000000 | | |
| 7 | 194.21831 | 26.260817 | 1.559307 | (lens L14) |
| 8 | 1329.96976 | 1.000000 | | |
| 9 | 107.60955 | 40.108611 | 1.559307 | (lens L15) |
| 10 | 113.33032 | 159.676621 | | |
| 11* | −148.84038 | 49.913127 | 1.559307 | (lens L16) |
| 12 | −120.00000 | 1.000000 | | |
| 13 | −222.95345 | 20.859126 | 1.559307 | (lens L17) |
| 14 | −150.00000 | 1.000000 | | |
| 15 | −401.55577 | 23.223530 | 1.559307 | (lens L18) |
| 16 | −183.82866 | 1.000000 | | |
| 17 | 521.59548 | 25.488040 | 1.559307 | (lens L19) |
| 18 | −467.35041 | 1.000000 | | |
| 19 | 163.47702 | 24.187152 | 1.559307 | (lens L110) |
| 20* | 493.47675 | 59.076923 | | |
| 21 | ∞ | 42.000000 | 1.559307 | (incident plane of first optical path folding mirror 1) |
| 22 | ∞ | −5.000000 | 1.559307 | (reflecting plane of first optical path folding mirror 1) |
| 23 | ∞ | −288.258092 | | (emergent plane of first optical path folding mirror 1) |
| 24 | 117.68987 | −20.000000 | 1.559307 | (lens L21) |
| 25 | 494.06295 | −20.317103 | | |
| 26* | 162.15533 | −23.222125 | 1.559307 | (lens L22) |
| 27 | 424.56556 | −30.146320 | | (concave reflecting mirror) |
| 28 | 174.51441 | 30.146320 | | |
| 29 | 424.56556 | 23.222125 | 1.559307 | (lens L22) |
| 30* | 162.15533 | 20.317103 | | |
| 31 | 494.06295 | 20.000000 | 1.559307 | (lens L21) |
| 32 | 117.68987 | 288.258092 | | |
| 33 | ∞ | 5.000000 | 1.559307 | (incident plane of second optical path folding mirror 2) |
| 34 | ∞ | −42.000000 | 1.559307 | (reflecting plane of second optical path folding mirror 2) |
| 35 | ∞ | −75.000000 | | (emergent plane of second optical path |

TABLE 3-continued

|  |  |  | (folding mirror 2) |
|---|---|---|---|
| 36* | −4472.59851 | −25.928698 | 1.559307 (lens L31) |
| 37 | 261.48119 | −1.000000 |  |
| 38 | −702.65223 | −25.574812 | 1.559307 (lens L32) |
| 39 | 484.70684 | −1.000000 |  |
| 40 | −171.00841 | −36.095030 | 1.559307 (lens L33) |
| 41 | −824.20256 | −52.106994 |  |
| 42 | 11305.93183 | −29.474446 | 1.559307 (lens L34) |
| 43 | −116.92116 | −179.952947 |  |
| 44 | −250.00000 | −35.678589 | 1.559307 (lens L35) |
| 45 | 613.05439 | −28.469304 |  |
| 46 | ∞ | −24.889346 |  |
|  |  |  | (aperture stop AS) |
| 47 | 165.48519 | −20.183765 | 1.559307 (lens L36) |
| 48* | 279.53959 | −1.000000 |  |
| 49 | −1112.01574 | −39.557019 | 1.559307 (lens L37) |
| 50 | 293.63544 | −1.000000 |  |
| 51 | −227.08614 | −39.175338 | 1.559307 (lens L38) |
| 52 | 3890.58196 | −8.150754 |  |
| 53 | −120.00000 | −39.612810 | 1.559307 (lens L39) |
| 54 | −519.19928 | −10.442215 |  |
| 55 | 457.48024 | −21.591566 | 1.559307 (lens L310) |
| 56 | 2169.78959 | −1.000000 |  |
| 57 | −132.52125 | −50.000000 | 1.559307 (lens L311) |
| 58 | ∞ | −12.499991 |  |

(wafer surface)
(Aspherical data)
Surface 2

$r = 991.85390$  $\kappa = 0.000000$
$C_4 = 0.117208 \times 10^{-7}$  $C_6 = 0.310236 \times 10^{-12}$
$C_8 = 0.401356 \times 10^{-17}$  $C_{10} = -0.265435 \times 10^{-20}$
$C_{12} = 0.412618 \times 10^{-24}$  $C_{14} = -0.238346 \times 10^{-28}$
Surface 11

$r = -148.84038$  $\kappa = 0.000000$
$C_4 = 0.637735 \times 10^{-7}$  $C_6 = -0.462907 \times 10^{-11}$
$C_8 = -0.137097 \times 10^{-15}$  $C_{10} = 0.475629 \times 10^{-19}$
$C_{12} = -0.370236 \times 10^{-23}$  $C_{14} = 0.833198 \times 10^{-28}$
Surface 20

$r = 493.47675$  $\kappa = 0.000000$
$C_4 = 0.280809 \times 10^{-7}$  $C_6 = -0.360031 \times 10^{-12}$
$C_8 = 0.929800 \times 10^{-17}$  $C_{10} = -0.100162 \times 10^{-20}$
$C_{12} = 0.116050 \times 10^{-24}$  $C_{14} = -0.979417 \times 10^{-29}$
Surface 26 and Surface 30 (same surface)

$r = 162.15533$  $\kappa = 0.000000$
$C_4 = -0.235140 \times 10^{-7}$  $C_6 = -0.709685 \times 10^{-12}$
$C_8 = -0.957183 \times 10^{-17}$  $C_{10} = -0.947024 \times 10^{-22}$
$C_{12} = 0.274134 \times 10^{-26}$  $C_{14} = -0.469484 \times 10^{-30}$
Surface 36

$r = -4472.59851$  $\kappa = 0.000000$
$C_4 = 0.108255 \times 10^{-7}$  $C_6 = -0.135832 \times 10^{-12}$
$C_8 = 0.188102 \times 10^{-17}$  $C_{10} = -0.163001 \times 10^{-22}$
$C_{12} = 0.128506 \times 10^{-26}$  $C_{14} = -0.312367 \times 10^{-30}$
Surface 48

$r = 279.53959$  $\kappa = 0.000000$
$C_4 = 0.176353 \times 10^{-7}$  $C_6 = -0.889127 \times 10^{-12}$
$C_8 = 0.132824 \times 10^{-16}$  $C_{10} = -0.701110 \times 10^{-21}$
$C_{12} = 0.104172 \times 10^{-25}$  $C_{14} = -0.327893 \times 10^{-30}$ (Corresponding values of conditions)

$\beta 1 = -0.650$
$\beta 2 = -0.865$
$\beta 3 = -0.445$
L1 = 320.8 mm
L2 = 365.2 mm
E = 466.7 mm
D = 455.6 mm
(1) $|\beta 2| = 0.865$
(2) $|L1 - L2| / |L1| = 0.138$
(3) $|\beta| / |\beta 1| = 0.385$
(4) $|E - D| / |E| = 0.024$ FIG. 14 are charts illustrating the lateral aberrations in the third embodiment.

In the aberration charts, Y represents the image height, the solid lines represent the wavelength 157.624 nm, the broken lines represent wavelength 157.624+1 pm=157.625 nm and the dashed lines represent wavelength 157.624−1 pm=157.623 nm, respectively.

As is evident from the aberration charts, it is known that the chromatic aberrations can be corrected for the exposure light with a wavelength of 157.624±1 pm in the third embodiment as similarly corrected in the first and second embodiments.

As described above, in the first to third embodiments, the image side, having a NA of 0.75, can be provided and the image circle with radius of 14.6 mm, in which the aberrations beginning with the chromatic aberrations are corrected, can be provided on the wafer. Therefore, a high resolution of about 0.1 μm can be obtained in addition to providing a rectangular effective exposure region that is approximately 22 mm×6.6 mm.

Moreover, in the first to third embodiments, an off-axis quantity A as small as about 3 mm can be set up on the wafer W because the second imaging optical system G2 has a nearly unit (equal) magnification β2 and the optical path separation is provided in the vicinity of the two intermediate images formed by a mutual approach. As a result, a rectangular effective exposure region approximately as large as 22 mm×6.6 mm can be provided in the image circle that is as small as about 14.6 mm in radius. Thus, an optical system superior in aberration correction, miniaturization, optical adjustment, mechanical design, and in cost of manufacturing can be obtained.

Furthermore, in the first to third embodiments, the reticle R and the wafer W can be arranged in parallel to each other and along a plane perpendicular to the direction of gravity (i.e., horizontal plane). All the lenses constituting the first imaging optical system G1 and the third imaging optical system G3 can be arranged in parallel along a single optical axis AX of the direction of gravity because the first imaging optical system G1 and the third imaging optical system G3 are provided in an upright position along the common reference optical axis AX. Accordingly, the reticle R, the wafer W and most of lenses constituting the projection optical system PL (91% in number for all the embodiments) are parallel, and are not subject to asymmetrical deformation caused by their own weight. Likewise, optical adjustment, mechanical design and high resolution are advantageously ensured.

Additionally, in the first to third embodiments, the intersection line of the reflecting planes of the first optical path folding mirror 1 and the second optical path folding mirror 2 are set up so that the optical axis AX1 of the first imaging optical system G1, the optical axis AX2 of the second imaging optical system G2 and the optical axis AX3 of the third imaging optical system G3 intersect at one point (reference point). The first optical path folding mirror 1 and the second optical path folding mirror 2 are integrally formed as a triagonal prism member in which the top side and the bottom side are shaped into right angled isosceles triangles, i.e., one optical path folding mirror FM. As a result, the stability of the optical system increases. The optical adjustment and mechanical design are simple because it is possible to position the three optical axes AX1–AX3 and the ridge lines of the optical path folding mirror FM in connection at one reference point. In addition, the high-accuracy optical adjustment is simple and the optical systems have higher stability because the optical axis AX2 of the second imaging optical system G2 is set up so that it is perpendicular to the reference optical axis AX which is the common optical axis of the first imaging optical system G1 and the third imaging optical system G3.

Furthermore, in the first, second and third embodiments, the intersection line of reflecting planes of the first optical path folding mirror 1 and the second optical path folding mirror 2 are set up so that the optical axis AX1 of the first imaging optical system G1, the optical axis AX2 of the second imaging optical system G2 and the optical axis AX3 of the third imaging optical system G3 intersect at one point (reference point) as described above. As shown in the alternative, FIGS. 15 and 16, illustrate an intersection line of reflecting planes of the first optical path folding mirror 1 and the second optical path folding mirror 2 which is not located at the intersection of the optical axis AX1 of the first imaging optical system G1, the optical axis AX2 of the second imaging optical system G2 and the optical axis AX3 of the third imaging optical system G3.

Figure 15:
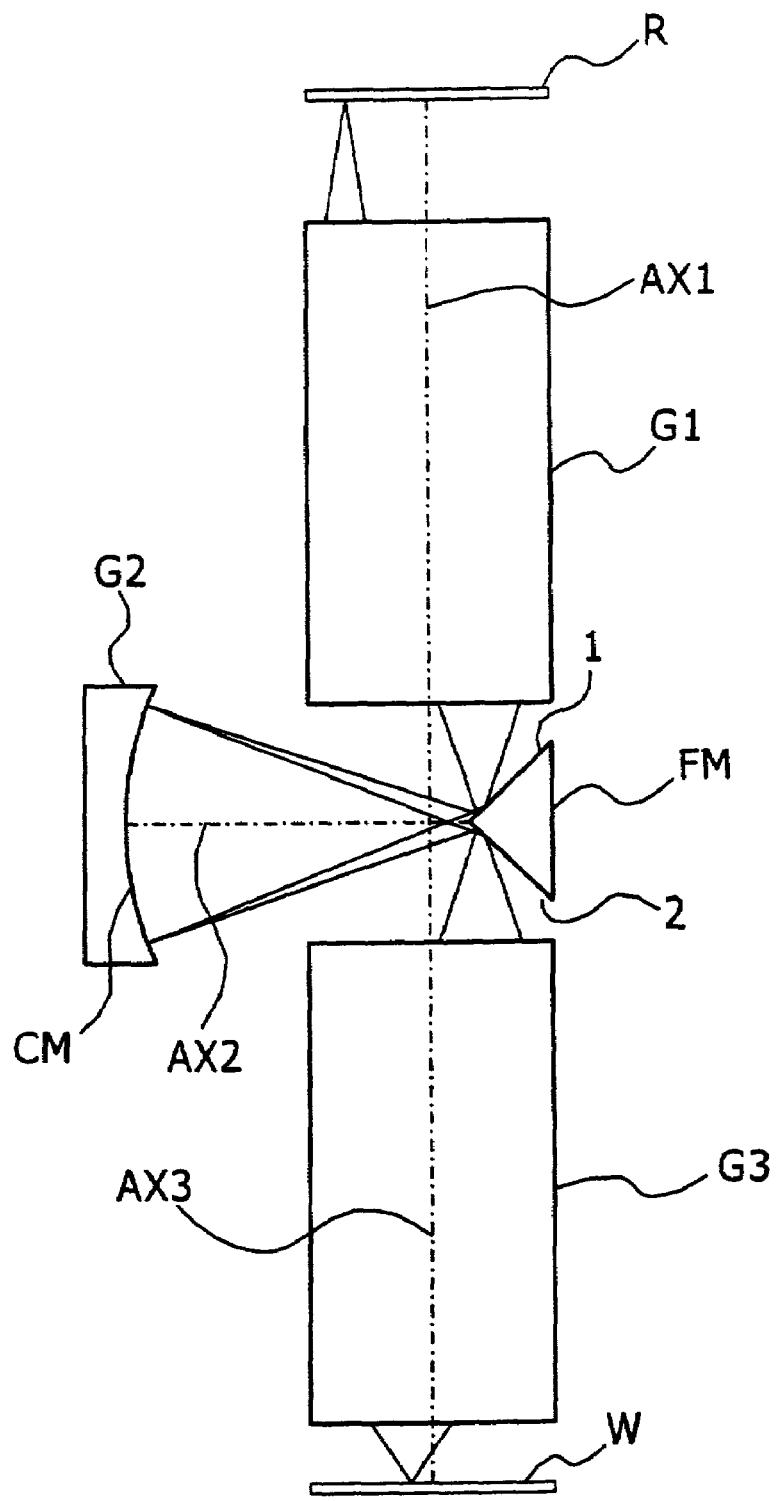
FIG. 15 is a diagram illustrating the construction of modification example 1 of the third embodiment.

FIG. 15 is a schematic block diagram of a catadioptric optical system based on modification example 1. In the catadioptric optical system shown in FIG. 15, the optical axis AX1 of the first imaging optical system G1 and the optical axis AX3 of the third imaging optical system G3 are coincident. The intersection line of reflecting planes of the first optical path folding mirror 1 and the second optical path folding mirror 2 is located on the side opposite to the concave mirror CM for the optical axis AX1 of the first imaging optical system G1 and the optical axis AX3 of the third imaging optical system G3.

Figure 16:
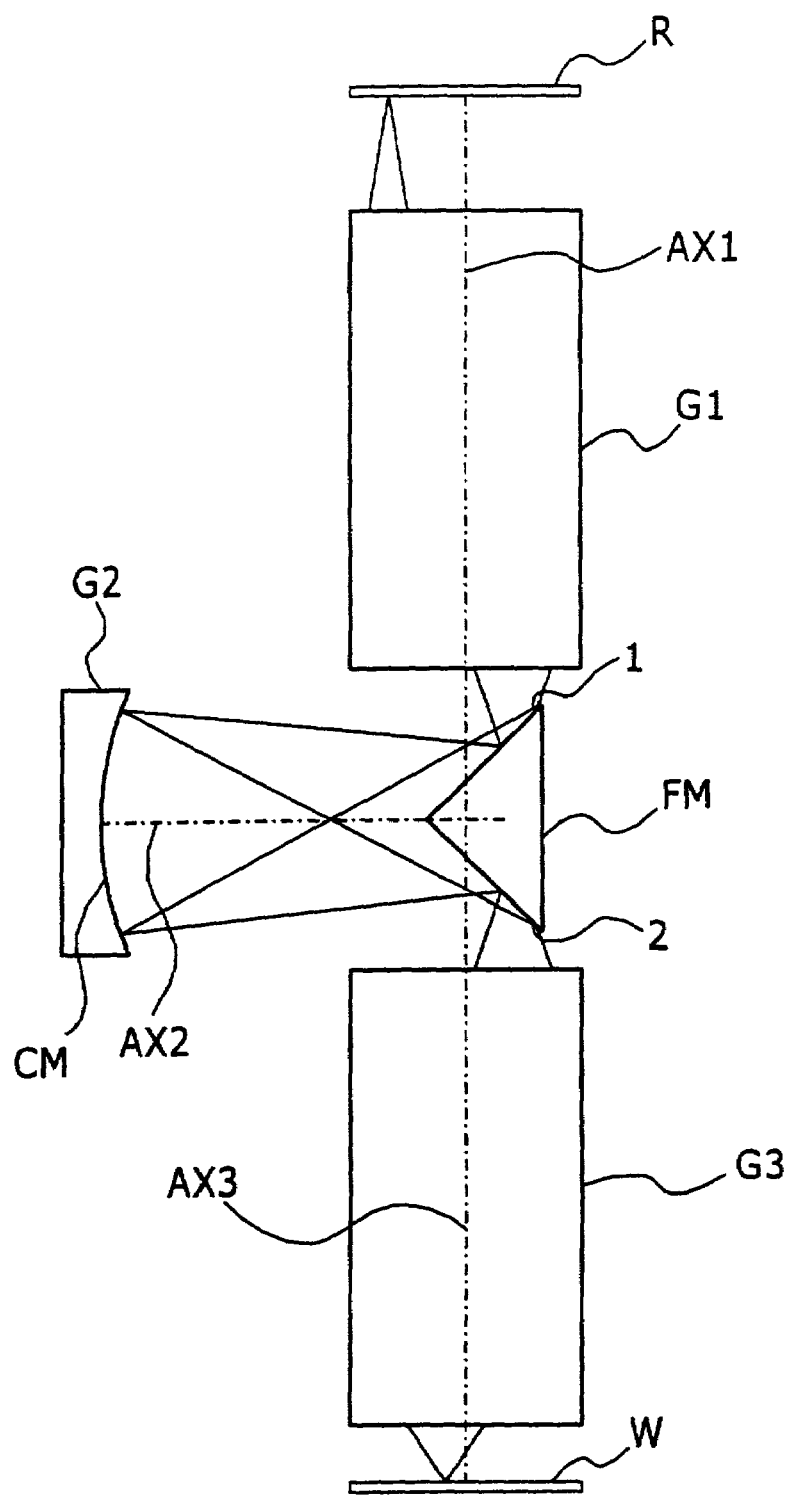
FIG. 16 is a diagram illustrating the construction of modification example 2 of the third embodiment.

FIG. 16 is a schematic block diagram of a catadioptric optical system based on modification example 2. In the catadioptric optical system shown in FIG. 16, the optical axis AX1 of the first imaging optical system G1 and the optical axis AX3 of the third imaging optical system G3 are coincident. The intersection line of reflecting planes of the first optical path folding mirror 1 and the second optical path folding mirror 2 is located on the side of concave mirror CM for the optical axis AX1 of the first imaging optical system G1 and the optical axis AX3 of the third imaging optical system G3.

Figure 17:
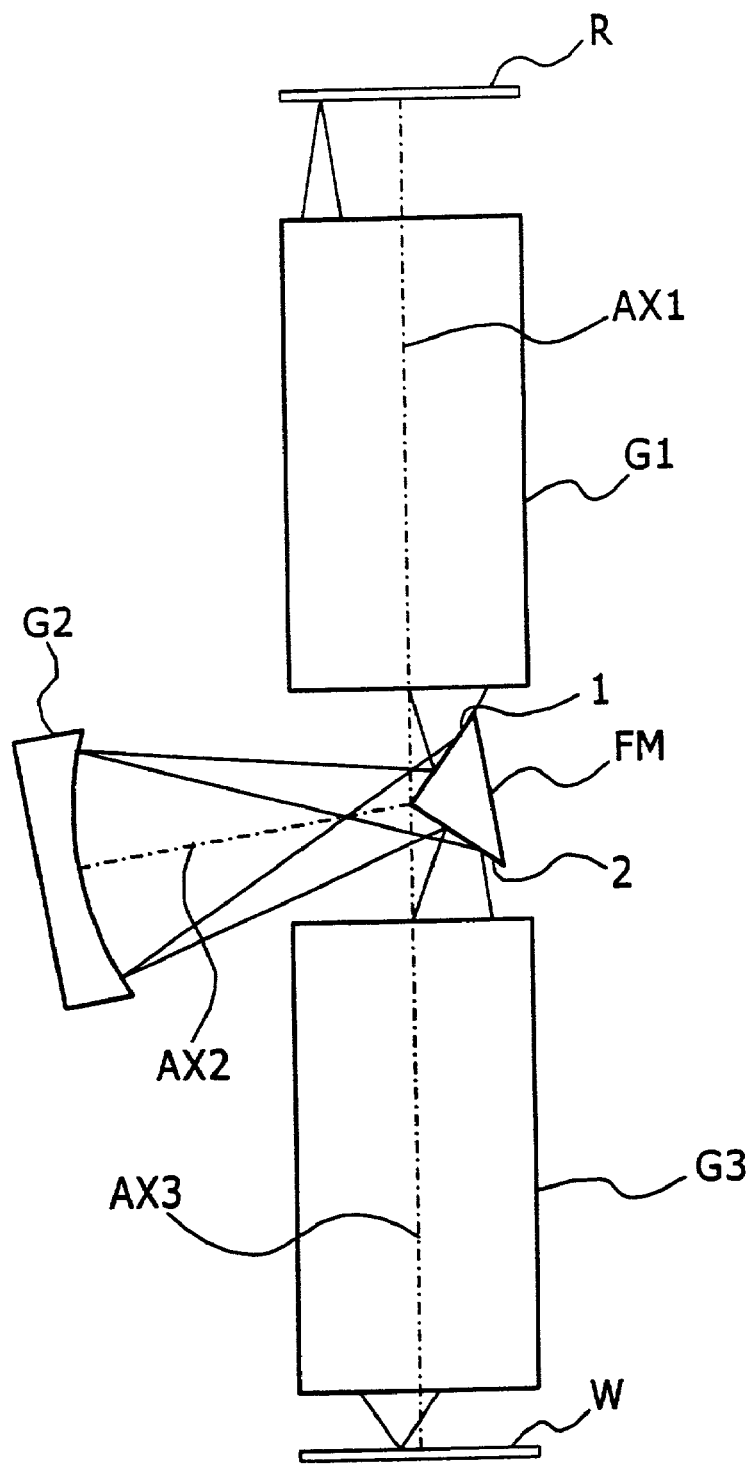
FIG. 17 is a diagram illustrating the construction of modification example 3 of the third embodiment.

Moreover, in previous examples, the optical axis AX1 of the first imaging optical system G1 and the optical axis AX2 of the second imaging optical system G2 are orthogonal and the optical axis AX2 of the first imaging optical system G2 and the optical axis AX3 of the third imaging optical system G3 are orthogonal. However, they may also be constituted so that the optical axis AX1 of the first imaging optical system G1, the optical axis AX2 of the second imaging optical system G2 and the optical axis AX3 of the third imaging optical system G3 are non-orthogonal. See, e.g., modification example 3 shown in FIG. 17.

Figure 18:
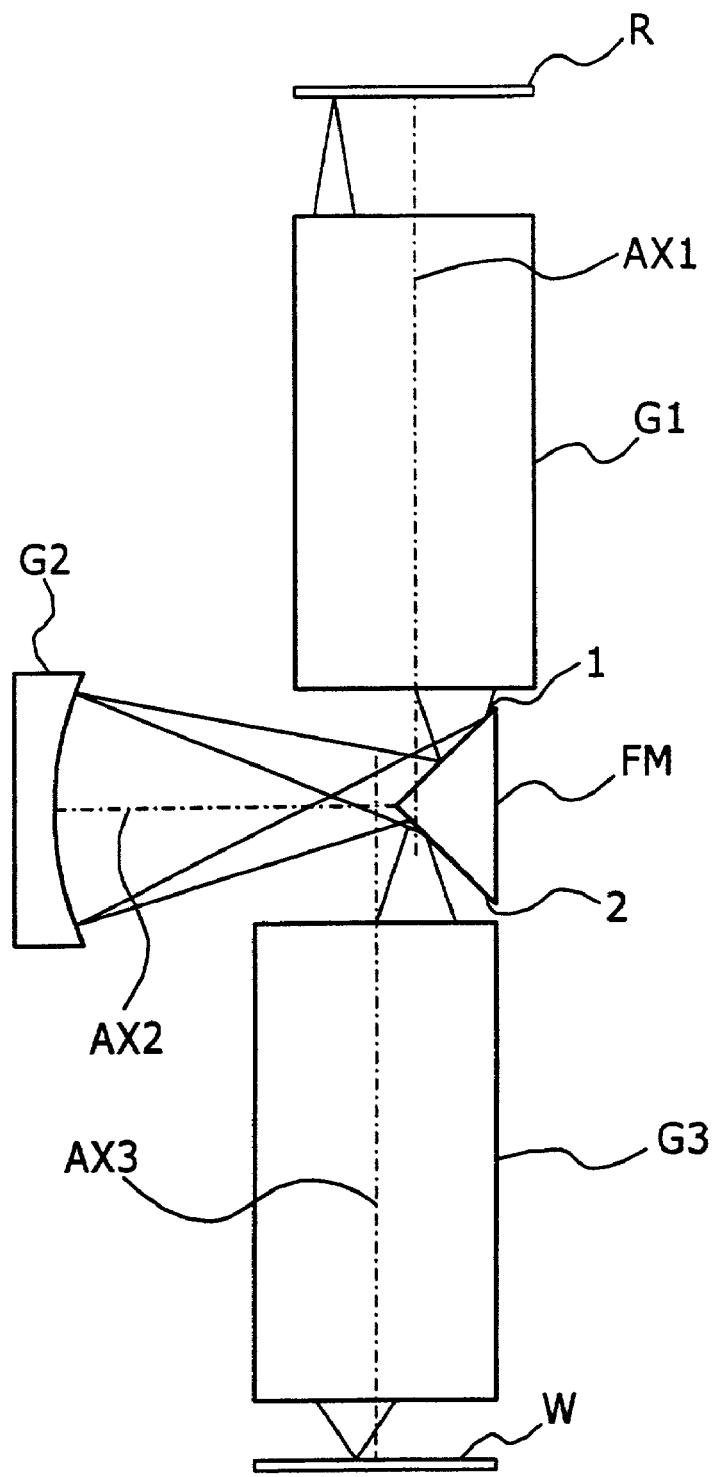
FIG. 18 is a diagram illustrating the construction of modification example 4 of the third embodiment.

Furthermore, in previous examples, the optical axis AX1 of the first imaging optical system G1 and the optical axis AX3 of the third imaging optical system G3 are coincident. However, a construction in which the optical axis AX1 of the first imaging optical system G1 and the optical axis AX3 of the third imaging optical system G3 shift in parallel to each other is also possible. See, e.g., modification example 4 shown in FIG. 18. In the modification example 4 shown in FIG. 18, the intersection line of the first optical path folding mirror 1 and the second optical path folding mirror 2 is not coincident with the optical axis AX1 of the first imaging optical system G1 and the optical axis AX3 of the third imaging optical system G3. The intersection line of the first optical path folding mirror 1 and the second optical path folding mirror 2 may also be constituted so that it is coincident with the intersection of optical axis AX1 of the first imaging optical system G1 and optical axis AX2 of the second imaging optical system G2 or the intersection of optical axis AX2 of the second imaging optical system G2 and optical axis AX3 of the third imaging optical system G3.

Figure 19:
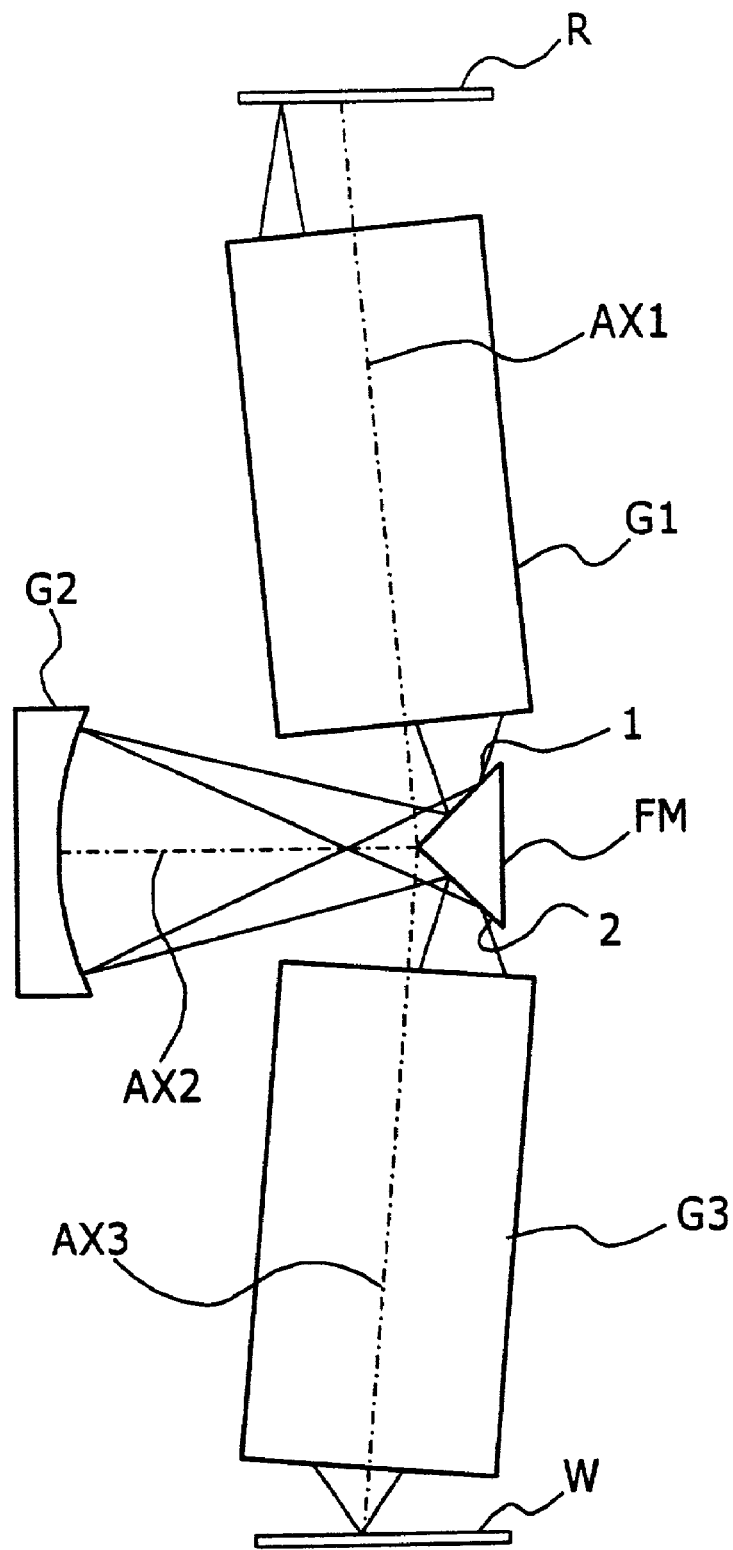
FIG. 19 is a drawing illustrating the construction of modification example 5 of the third embodiment.

Additionally, in previous examples, the optical axis AX1 of the first imaging optical system G1 and the optical axis AX3 of the third imaging optical system G3 are in parallel to (coincident with) each other (the axis AX1 of the first imaging optical system G1 and the axis AX2 of the second imaging optical system G2 are made orthogonal and the axis AX2 of the second imaging optical system G2 and the axis AX3 of the third imaging optical system G3 are made orthogonal). However, a construction in which the optical axis AX1 of the first imaging optical system G1 and the optical axis AX3 of the third imaging optical system G3 are not parallel to each other is also possible. See, e.g., modification example 5 shown in FIG. 19. In the modification example 5 shown in FIG. 19, the intersection line of reflecting planes of the first optical path folding mirror 1 and the second optical path folding mirror 2 is set up so that it intersects with the optical axis AX1 of the first imaging optical system G1, the optical axis AX2 of the second imaging optical system G2 and the optical axis AX3 of the third imaging optical system G3 at one point (reference point). However, they may also be constituted so as not to intersect at the reference point. See, e.g., the modification example 2 shown in FIG. 15 and FIG. 16.

Next, a detailed construction of the projection exposure apparatus of the embodiment shown in FIG. 2 is described below.

Figure 8:
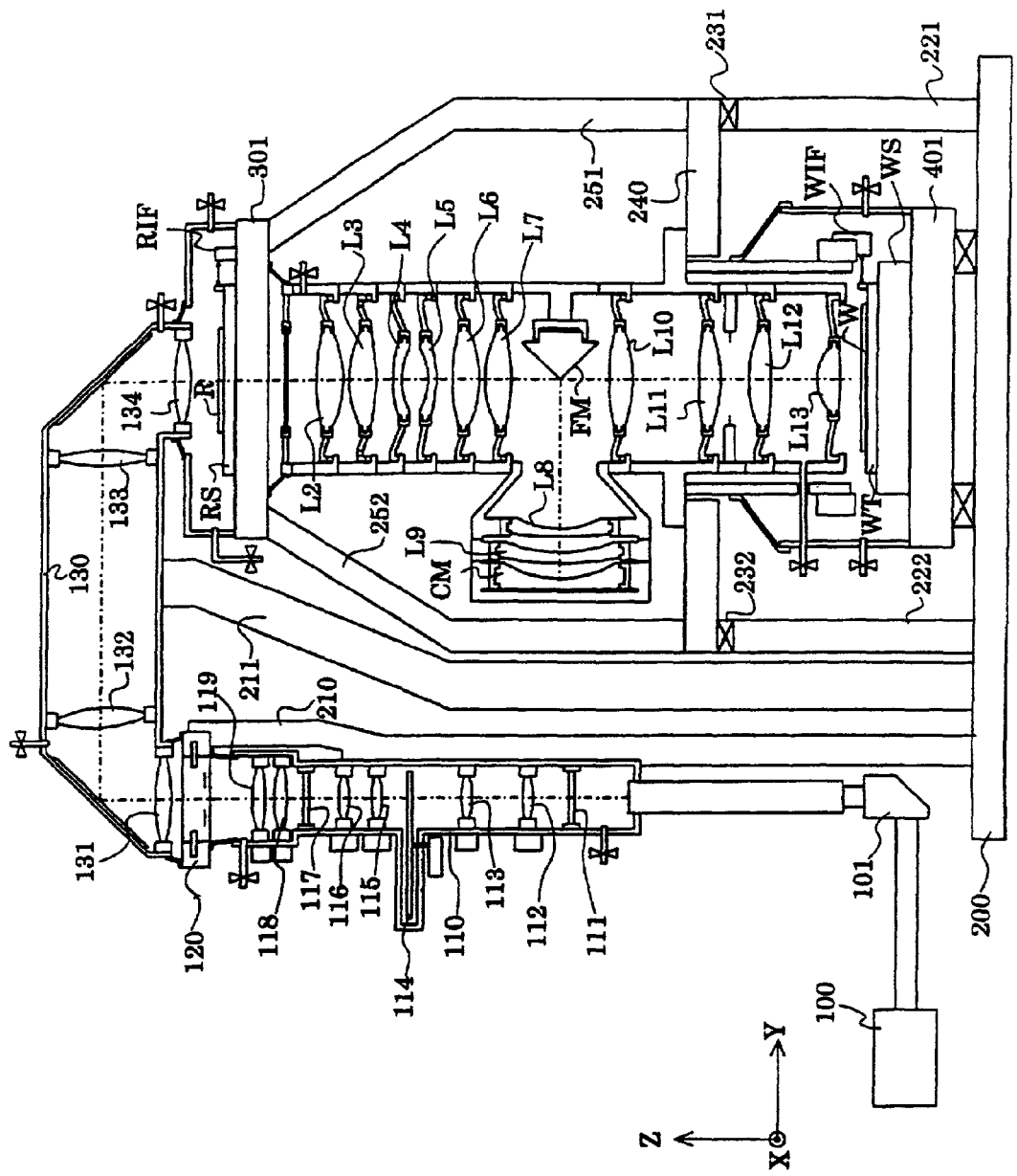
FIG. 8 is a diagram illustrating the general construction of the projection exposure apparatus of the embodiment shown in FIG. 2.
Figure 9:
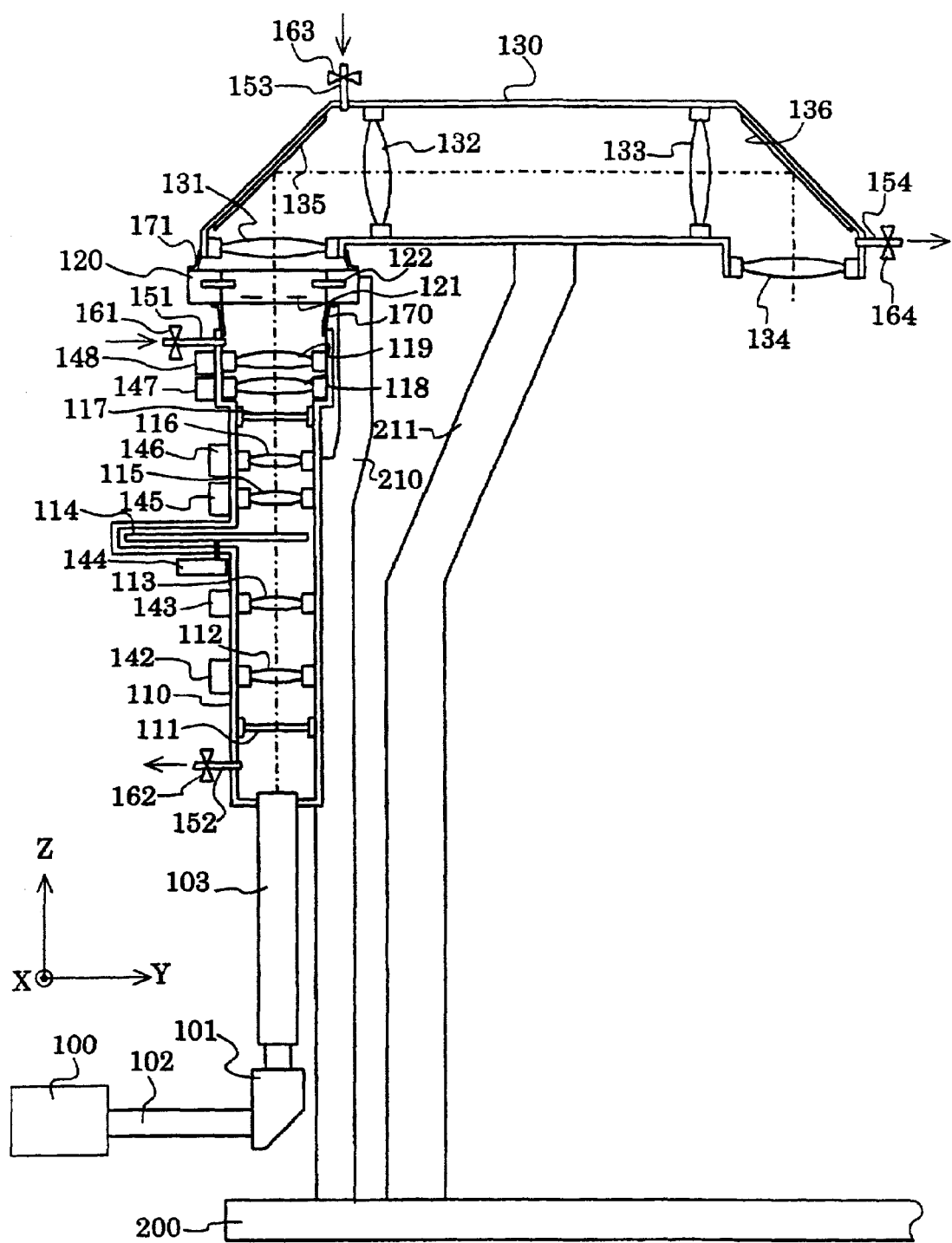
FIG. 9 is an enlarged view illustrating a part related to an illuminating optical system which constitutes a part of the projection exposure apparatus of FIG. 8.
Figure 10:
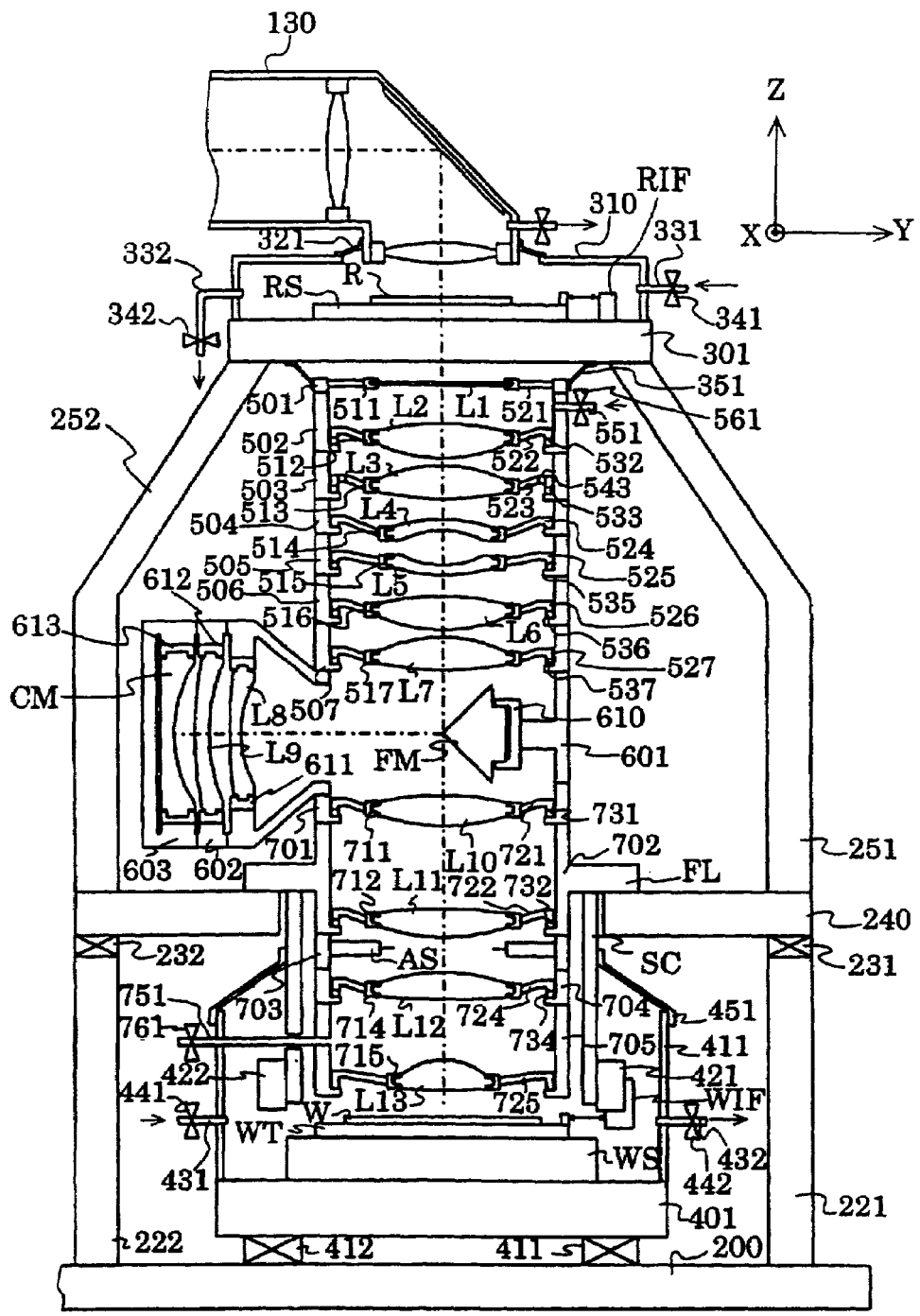
FIG. 10 is an enlarged view illustrating a part related to an illuminating optical system which constitutes a part of the projection exposure apparatus of FIG. 8.

FIG. 8 is a diagram showing the general construction of the projection exposure apparatus of the embodiment shown in FIG. 2. FIG. 9 is an enlarged diagram which shows a portion of to the illumination optical system of the projection exposure apparatus of FIG. 8. FIG. 10 is an enlarged diagram which shows a portion of the projection optical system of the projection exposure apparatus of FIG. 8.

First, a detailed construction of the portion of the illumination optical system IL of FIGS. 8–9 is described.

The projection exposure apparatus is provided with a $F_2$ laser light source 100, e.g., 156.624 nm in wavelength used in a natural oscillation (almost half width 1.5 pm). However, the application of an ArF excimer laser light source of about 193 nm, a KrF excimer light source of about 248 mn, an $Ar_2$ laser light source and the like can also be used in the present invention. The light source 100 may be arranged on the lower floor where the main body of the exposure apparatus. An exclusive area (footprint) of main body of the exposure apparatus can be decreased and an influence of vibrations on the main body of the exposure apparatus can also be reduced.

A light from the light source 100 is led into the inside of a first illumination system casing 110 via a beam matching unit (BMU) 101. The first illumination system casing 110 receives movable optical elements inside it and supports them by a supporting member 210 on a base plate 200. The beam matching unit 101 contains a movable mirror matching an optical path between the light source 100 and an the main body of the exposure apparatus. Moreover, the optical path between the light source 100 and the beam matching unit 101 is optically connected by a cylinder (tube) 102, and an optical path between the beam matching unit 101 and the first illumination system casing 110 is optically connected by a cylinder (tube) 103. Nitrogen or a rare gas (inert gas), such as helium and the like, is filled in the optical path of the cylinder 102 and cylinder 103.

The light led into the inside of the first illumination system casing 110 passes through a micro fly's eye lens 111 (an optical system equivalent to a first fly's eye lens), and lens groups 112, 113 constituting an afocal zoom relay optical system (a both side telecentric zoom optical system), and then comes to a turret 114 for loading plural diffraction array optical elements or dioptric array optical elements. The micro fly's eye lens 111 is an optical system comprising many fine (micro) lenses having a positive dioptric power and arranged vertically and horizontally in a dense arrangement. Generally, the micro fly's eye lens 111 is constituted, e.g., by applying an etching treatment to a parallel plane glass plate to form the fine lens groups. Diffraction array optical elements disclosed in U.S. Pat. No. 5,850,300 can be used as the diffraction array optical elements, and dioptric array optical elements disclosed in WO 99/49505 (EP 1,069, 600), wherein the elements are formed on one substrate by an etching technique can be used as the dioptric array optical elements.

U.S. Pat. No. 5,850,300 and WO 99/49505 (EP 1,069, 600) are incorporated herein by reference.

In the plural diffraction array optical elements or the dioptric array optical elements supported by the turret 114, a light passing through one diffraction, or dioptric, array optical element positioned in the illuminating optical path incides into a micro fly's eye lens 117 via a focal zoom optical system (115, 116). A front focal point of the afocal zoom optical system (115, 116) is positioned in the vicinity of the diffraction array optical element or the dioptric array optical element of the turret 114. The micro fly's eye lens 117 is an optical system equivalent to a second fly's eye lens. The micro fly's eye lens 117 includes many fine lenses which are much finer than fly's eye lenses and produces a large wave front dividing effect. Thus, an illuminating aperture stop is not provided on its emergent side (back focus plane). The micro fly's eye lens 117 is constituted by a pair of micro fly's eye lenses at a space along the optical axis, and an aspherical surface may also be introduced into its refracting surface. This construction results in the suppression of the occurrence of a coma aberration in the micro fly's eye lens 117 and suppresses the occurrence of uneven illuminance distribution on the reticle. Furthermore, a turret type stop provided with a iris stop, a annular aperture and a quadrupole aperture may also be arranged in the vicinity of rear focal plane of the micro fly's eye lens 117.

The light exiting from the micro fly's eye lens 117 illuminates a movable blind mechanism 120 superimposed via a condenser optical system (118, 119). The front focal position of the movable blind mechanism 120 is positioned in the vicinity of position of a surface light source (plural light source images) formed by the micro fly's eye lens 117. The movable blind mechanism 120 is provided with a fixed illumination field stop (fixed blind) 121 with a slit aperture and a movable blind 122 for varying the width of an illumination field region in the scanning direction. The movable blind 122 allows for a decrease in the moving stroke of a reticle stage in the scanning direction and a decrease in the width of shading zone (frame) of reticle. Moreover, the fixed blind 121 is arranged together with the reticle. The construction of the movable blind mechanism 120 is disclosed in Japan Kokai 4-196513 (U.S. Pat. No. 5,473,410).

U.S. Pat. No. 5,473,410 is incorporated herein by reference.

The light passing through the movable blind mechanism 120 emits from the first illumination system casing 110 and is led to the inside of a second illumination system casing 130. An imaging optical system of the illuminating field stop is provided for reimaging the illuminating field stop on the reticle by a given enlargement magnification. The lens groups (131–134) and optical path folding mirrors (135, 136), which constitute the illumination field stop imaging optical system must not be used for a vibration source because they are fixed to the second illumination system casing 130. The second illumination system casing 130 is supported by a supporting member 211 on the base plate 200. The magnification factor of the imaging optical system of illuminating field stop may be equal to (unity) or a reduced ratio.

Driving units (142, 143) for driving the lens groups (112, 113) of the afocal zoom relay optical system in the direction of optical axis are arranged in the first illumination system casing 110. The driving units (142, 143) are mounted to the outer side of the first illumination system casing 110 to prevent the contamination in the illuminating optical path. A driving unit 144 for rotationally driving the turret 114 and driving units 145, 146 for driving the lens groups (115, 116) constituting the afocal zoom relay optical system in the direction of optical axis are mounted to the outer side of the first illumination system casing 110 to prevent the contamination in the illuminating optical path.

Driving units (147, 148) for driving the lens groups (118, 119) constituting the condenser optical system in the direction of optical axis, rotating at least one lens group with an axis perpendicular to the optical axis as center and moving (offsetting) the other lens group in the direction perpendicular to the optical axis are mounted to the outer side of the first illumination system casing 110. The focal length of the condenser optical system can be changed and in its turn the size of an illumination region formed on a wafer and the illumination NA (numerical aperture) can be properly changed on the reticle independently of each other by movement of the lens groups (118, 119) in the direction of optical axis. Controls of slanted illuminance (inclined illuminance distribution) on the wafer surface and slanted (inclined) telecentricity are obtained by the rotation and offset of the lens groups (118, 119). An illuminance control symmetrical to the optical axis on the wafer surface is obtained by moving one lens group in the direction of the optical axis separately from a previous illumination field variable.

Furthermore, a tube 151 for allowing nitrogen or a rare gas (inert gas), such as helium and the like, to flow into the inside of the first illumination system casing 110, and a tube 152 for allowing nitrogen or a rare gas (inert gas), such as helium and the like, to discharge from the first illumination system casing 110 are arranged on the outer side thereof. Valves (161, 162) for controlling the gas inflow rate/outflow rate are arranged at the tubes (151, 152), respectively. If the inert gas is helium, the tubes (151, 152) are connected to a helium recovery/regeneration unit, e.g., disclosed in Japan Kokai 11-219902 (WO 99/25010, EP 1,030,351).

EP 1,030,351 is incorporated herein by reference.

A tube 153 for allowing nitrogen or a rare gas (inert gas), such as helium and the like, to flow into the inside of the second illumination system casing 130 and a tube 154 for allowing nitrogen or a rare gas (inert gas), such as helium and the like, to discharge from the second illumination system casing 130 are arranged on the outer side thereof. Valves (163, 164) for controlling the gas inflow rate/outflow rate are arranged at the tubes (153, 154), respectively. If the inert gas is helium, the tubes (153, 154) are also connected to the previously mentioned helium recovery/regeneration unit.

A bellows 170 is provided for connecting the first illumination system casing 110 and the movable blind mechanism 120. Another bellows 171 is provided for connecting the movable blind mechanism 120 and the second illumination system casing 130. The bellows 170, 171 are formed of a material which has a certain degree of flexibility and rigidity that is not so great as to deform and to ensure less degassing, e.g., a metal or a material given by coating a rubber or resin with aluminum and the like.

In the illumination optical system IL arranged as above, a beam incident from the laser light source 100 to the micro fly's eye lens 111 is divided two-dimensionally by many fine lenses, and one light source image is formed on the back focal plane of each fine lens, respectively. The beam from the many light source images (surface light sources) formed at the back focal plane of the micro fly's eye lens 111 incides into one diffraction array optical element, e.g., a diffraction optical element for annular modified illumination, arranged in the illumination optical path by the turret 114 via the afocal zoom relay optical system (112, 113). The beam converted to rings via the diffraction optical element for annular modified illumination forms a annular illumination field at its back focal plane and in its turn at the incident plane of the micro fly's eye lens 117 via the afocal zoom optical system (115, 116).

The beam inciding into the micro fly's eye lens 117 is divided two-dimensionally by many fine lenses, and a light source image is formed on the back focal plane of each fine lens where the beam incides, respectively. Thus, many annular light sources (secondary surface light sources) are provided (same as the illumination field formed by the beam inciding into the micro fly's eye lens 117). The light from these secondary surface light sources is subjected to a condensing action of the condenser optical system (118, 119) and then illuminates a given plane optically together with the reticle R superimposed. Thus, a rectangular illumination field similar to the shape of each fine lens constituting the micro fly's eye lens 117 is formed on the fixed blind 121 arranged at this given plane. The beam passing through the fixed blind 121 and the movable blind 122 of the movable blind mechanism 120 is subjected to a condensing action of the imaging optical system of illumination field stop (131–134) and then illuminates the reticle R with a given formed pattern evenly and superimposed.

Here, modified illuminations like annular modified illumination or multipole (e.g., dipole (two-eyed), quadrupole (four-eyed), octapole (eight-eyed) and so on) modified illumination and conventional circular illumination can be imposed by switching the diffraction array optical elements or the dioptric array optical elements arranged in the illumination optical path by the turret 114. In the case of the annular modified illumination, for example, both the size (outer diameter) and shape (annular ratio) of a annular secondary light source can be changed by changing the magnification of the afocal zoom relay optical system (112, 113). Moreover, the outer diameter of the annular secondary light source can be changed by changing the focal length of the focal zoom optical system (115, 116) without changing its annular ratio. Only the annular ratio of the annular secondary light source can be changed by properly changing the focal length of the focal zoom optical system (115, 116) without changing the outer diameter of the light source.

A detailed construction of a portion of the projection optical system PL is described hereafter, with reference to FIG. 8 and FIG. 10.

The described projection exposure apparatus is horizontally arranged on the floor of a clean room and is provided with the base plate (frame caster) 200 which becomes the datum of the apparatus. Plural supporting members (221, 222) are vertically arranged on the base plate 200. Only two supporting members are shown in FIGS. 8 and 10, but four supporting members are vertically arranged in practice. Three supporting members may also be used.

Anti-vibration units (231, 232) for isolating vibrations from the floor at a micro G level are mounted to the supporting members (221, 222), respectively. In the anti-vibration units (231, 232), an air mount with controllable internal pressure and an electromagnetic actuator (e.g., voice coil motor) are arranged in parallel or in series. The transmission of vibrations from the floor to a column 240 for holding the projection optical system is reduced by the action of the anti-vibration units (231, 232). A plurality of supporting members (251, 252) for supporting a reticle stage fixed plate 301 are vertically arranged on the column 240. In FIGS. 8 and 10, only two supporting members (251, 252) are shown, but they are actually four members (may also be three members).

The described projection exposure apparatus is provided with a reticle stage RS float supporting on the reticle base fixed plate 301. The reticle stage RS is constituted so that the reticle R can be linearly driven in the Y-axis direction with a large stroke, and also can be driven in the X-axis, Y-axis directions and $\theta_z$ (direction of rotation around the Z axis) with a little driven amount.

Moreover, a reticle stage RS in which a reticle stage and a reticle base between the reticle base fixed plate and the reticle stage is provided. The reticle base may be shifted so as to keep a momentum in a direction reverse to the direction of movement of the reticle stage. Such a reticle stage is disclosed, e.g., in Japan Kokai 11-251217 (U.S. patent application Ser. No. 260,544 filed on Mar. 2, 1999). Moreover, a reticle stage holding two reticles along the Y-axis direction (scanning direction) as shown in Japan Kokai 10-209039 (EP 855,623) and Japan Kokai 10-214783 (EP 951,054) may also be used as the reticle stage RS.

U.S. patent application Ser. No. 260,544, EP 855,623 and EP 951,054 are incorporated herein by reference.

A reticle interferometer RIF is arranged on the reticle base fixed plate 301 for measuring the position and the amount of movement of the reticle stage RS in the XY direction. One end of the reticle stage RS is a reflecting plane, which is a moving (measuring) mirror of the reticle interferometer RIF. A reticle chamber partition 310 for forming a space where an optical path in the vicinity of the reticle R is sealed with an inert gas (nitrogen, helium and the like) is arranged on the reticle base fixed plate 301. A door for moving the reticle in or out of a reticle stocker (not shown) may be provided. A reticle pool room for temporarily receiving the reticle before moving the reticle into the reticle chamber and replacing the internal gas with an inert gas is arranged by adjoining it to the reticle chamber.

A bellows 321 for connecting the reticle chamber partition 310 and the second illumination system casing 130 is arranged. The material of the bellows 321 is similar to the previously mentioned bellows (170, 171). A tube 331 for allowing nitrogen or a rare gas (inert gas), such as helium and the like, to flow into the reticle chamber and a tube 332 for allowing nitrogen or a rare gas (inert gas), such as helium and the like, to discharge from the reticle chamber are arranged on the outer side of the reticle chamber partition 310. If the inert gas is helium, and the tubes (331, 332) may also be connected to the previously mentioned helium recovery/regeneration unit.

Valves (341, 342) for controlling the gas inflow rate/outflow rate are arranged at the tubes (331, 332), respectively. Moreover, a bellows 351 for connecting the reticle base fixed plate 301 and the projection optical system is arranged. The material of the bellows 351 is similar to the previously mentioned bellows 321. Thus, the space in the vicinity of the reticle R is sealed by the action of the reticle chamber partition and the bellows (321, 351).

The projection exposure apparatus is provided with a wafer stage fixed plate 401. The wafer stage fixed plate 401 is horizontally supported on the base plate 200 by the action of anti-vibration units (411, 412) for isolating vibrations from the floor at a micro G level. In the anti-vibration units (411, 412), an air mount with controllable internal pressure and an electromagnetic actuator (e.g., voice coil motor) may be arranged in parallel or in series. The wafer stage WS is movable in the XY direction and is floatably loaded on the wafer stage fixed plate 401.

The wafer stage WS comprises a Z-leveling stage for inclination in the biaxial direction of $\theta_x$ (direction of rotation around the X axis) and $\theta_y$ (direction of rotation around the Y axis) and movable in the Z-axis direction and a $\theta$ stage for making it movable in the $\theta_z$ (direction of rotation around the Z axis) direction. For example, a wafer stage disclosed in Japan Kokai 8-63231 (GB 2,290,658) can be used as the wafer stage WS. Moreover, two wafer stages may also be arranged as described in Japan Kokai 10-163097, Japan Kokai 10-163098, Japan Kokai 10-163099, Japan Kokai 10-163100, Japan Kokai 10-214783 (EP 951,054), or Japan Kokai 10-209039 (EP 855,623), WO 98/28665 or WO 98/40791.

GB 2,290,658, EP 855,623, EP 951,054, WO 98/28665 and WO 98/40791 are incorporated herein by reference.

A wafer table (wafer holder) WT for loading the wafer by vacuum suction and/or electrostatic suction is arranged on the wafer stage WS. A wafer chamber partition 411 for forming a space where an optical path in the vicinity of the wafer W is sealed with an inert gas (nitrogen, helium and the like) is arranged on a wafer stage fixed plate 401. A door for moving the wafer in or out of a reticle stocker (not shown) may be provided. A reticle spare room for temporarily receiving wafers before moving the wafers into the wafer chamber and replacing the internal gas with an inert gas is arranged by adjoining it to the wafer chamber.

A sensor column SC is fixed to a lens barrel (or the column 240) of the projection optical system. An alignment sensor 421 for optically measuring the position of an alignment mark on the wafer W in the XY two-dimensional direction is provided, an auto-focus leveling sensor 422 for detecting the position of the wafer in the Z-axis direction (optical axis direction) and the inclinations of $\theta_x$, $\theta_y$ and $\theta_z$ in triaxial direction and a wafer interferometer WIF for measuring the position and amount of movement of the wafer table WT in the XY direction are mounted to the sensor column SC.

At least one of a FIA (Field Image Alignment) system which the mark position by illuminating an alignment mark on the wafer with a light having a broad wavelength region, such as a halogen lamp and the like, and then processing this mark image, a LSA (Laser Step Alignment) system which measures the mark position by irradiating a laser light on a mark and then using a light diffracted and scattered by the mark and a LIA system (Laser Interferometric Alignment) which detects the positional information of mark from its phase by irradiating a laser light with only a little different frequency on an alignment mark like diffraction gratings from two directions and then interfering two diffraction lights generated by the mark with each other is suitable for the alignment sensor 421.

The auto-focus leveling sensor 422 detects whether the surface of wafer to be exposed coincides (focuses) with the image surface of the projection optical system. An auto-focus leveling sensor which detects Z-axis direction positions of detection points in plural locations arranged into a matrix is suitable for the auto-focus leveling sensor 422. In this case, the detection points in plural locations are arranged in a range including the slit-like exposure region formed by the projection optical system.

The wafer interferometer WIF measures the position and the amount of movement of the wafer stage in the XY direction. One end of the wafer stage WS becomes a reflecting plane. The reflecting plane becomes a moving (measuring) mirror of the wafer interferometer WIF. A tube 431 for allowing nitrogen or a rare gas (inert gas), such as helium and the like, to flow into the wafer chamber and a tube 432 for allowing nitrogen or a rare gas (inert gas), such as helium and the like, to discharge from the wafer chamber are arranged on the outer side of the wafer chamber partition 411.

If the inert gas is helium, the tubes (431, 432) can be connected to the previously mentioned helium recovery/regeneration unit. Valves (441, 442) for controlling the gas inflow rate/outflow rate are arranged at the tubes (431, 432), respectively. Moreover, a bellows 451 for connecting the wafer chamber partition 411 and the sensor column SC is vertically arranged on the wafer stage fixed plate 401. The material of the bellows 451 is same, e.g., as the previously mentioned bellows 321. Thus, the space in the vicinity of the wafer W is sealed by the action of the wafer chamber partition 411 and the bellows 451.

The described projection exposure apparatus is provided with a parallel plane plate L1 for covering a purge space in the projection optical system. The projection optical system is provided with a first imaging optical system for forming a primary image (a first intermediate image) of the pattern of the reticle R. The first imaging optical system is composed of lenses (L2–L7: corresponding to L11–L110 in the first imaging optical system of FIG. 2). The parallel plane plate L1 and the lenses (L2–L7) are received in divided barrels (501–507), respectively. Connection techniques between the divided barrels are disclosed in, Japan Kokai 7-86152 (U.S. Pat. No. 5,638,223). U.S. Pat. No. 5,638,223 is incorporated herein as reference.

The parallel plane plate L1 is held by a cell 511. The cell 511 holds the parallel plane plate L1 so as to be put between the top surface and the under surface of the parallel plane plate L1. The held locations are plural locations (3 locations or more) in the circumferential direction ($\theta_z$ direction) of the parallel plane plate L1. An air (gas)-tight structure is disposed between the parallel plane plate L1 and the cell 511. The lenses (L2–L7) are held by cells (512–517). The cells (512–517) hold the lenses (L2–L7) so as to be put between the top surface and the bottom surface of rims arranged at the periphery of the lenses (L2–L7). The held locations are plural locations (3 locations or more) in the circumferential direction of the lenses.

The divided barrels (501–507) and the cells (511–517) are connected by frames 521–527. Apertures for allowing an inert gas (helium) to pass inside of the projection optical system are arranged in the frames 521–527 at plural locations along its circumferential (tangential) direction. An air (gas)-tight structure is disposed between the frame 521 and the divided barrel 501.

In the first imaging optical system, an actuator 532 for moving the lens L2 in the optical axis direction (Z direction) and inclining it in the $\theta_x$, $\theta_y$ directions is arranged. This actuator 532 is arranged at a pitch of 1200 in three locations which is equal distant from the optical axis and spaced in the circumferential direction ($\theta_z$ direction). A linear motor, piezoelectric element, cylinder mechanism driven by a pressure fluid or gas and the like can be used as the actuator 532. If the driven amount of actuator 532 is the same, the lens L2 can be moved in the optical axis direction. The lens L2 can be inclined in the $\theta_x$, $\theta_y$ direction by setting it up so that the driven amount of the actuator 532 in three different locations is different, respectively. Actuators 533, 535, 536, 537 operate similar to actuator 532.

In the first imaging optical system, an actuator 543 for moving the lens L3 in the XY plane is arranged. These actuator 543 is between the actuator 533 and a frame 523 and is arranged at a pitch of 120° in three locations which are equal distant from the optical axis and different in the circumferential direction ($\theta_z$ direction). A linear motor, piezoelectric element, cylinder mechanism driven by a pressure fluid or gas and the like can be used as the actuator 543. A tube 551 for allowing helium to flow into the inside of the projection optical system is arranged in the divided barrel 511. This tube 551 may also be connected to the previously mentioned helium recovery/regeneration unit. A valve 561 for controlling the gas inflow rate is arranged at the tube 551.

The projection optical system is provided with an optical path folding mirror FM integrally formed by a first optical path folding mirror and a second optical path folding mirror. The optical path folding mirror FM can be formed, e.g., by vapor deposition of a metal, such as aluminum and the like, on two side faces in a triagonal prism member in which the top surface and the lower surface are in the shape of right angled isosceles triangles. A dielectric multilayer film may also be vapor deposited in place of a metal film. As the materials of dielectric multilayer film, metal fluorides such as aluminum fluoride, cryolite, chiolite, lithium fluoride, sodium fluoride, barium fluoride, calcium fluoride, magnesium fluoride, yttrium fluoride, ytterbium fluoride, neodymium fluoride, gadolinium fluoride, lanthanum fluoride, osmium fluoride, strontium fluoride and the like can be used. A construction in which a dielectric multilayer film is arranged on a metal film, such as aluminum and the like, may also be used. The dielectric multilayer film functions as a protection coat for preventing the metal film from oxidation. This dielectric multilayer film functions to correct the phase difference between P polarization and S polarization caused by a reflecting light from the metal film so as to decrease it and to correct a difference in phase difference between P polarization and S polarization due to the incident angle (emergent angle) (angular characteristic of PS phase difference) so as to homogenize it in a desirable range of incident angles. If a phase difference between P polarization and S polarization exists, this is undesirable because the imaging positions of an image due to the P polarization and an image due to the S polarization deviate and cause the deterioration of image quality on the imaging surface; thus a desirable resolution is not obtained. Moreover, two plane mirrors may be kept so as to perpendicularly intersect to each other in place of forming the first and the second optical path folding mirrors on one member. In this case, it is considered that the two plane mirrors are kept adjustably, e.g., by a technique disclosed in Japan Kokai 2000-28898, which is incorporated herein by reference.

The projection optical system is also provided with a second imaging optical system for forming a second intermediate image (a secondary image of the pattern) nearly equal to the first intermediate image in size, based on a light from the first intermediate image formed by the first imaging optical system. The second imaging optical system is provided with lenses (L8, L9: corresponding to negative lenses L21, L 22 in the second imaging optical system G2 of FIG. 2) and a concave reflecting mirror CM. SiC or a composite of SiC and Si can be used as the material of the concave reflecting mirror CM. It is preferable to coat the entire concave reflecting mirror CM with SiC for degassification prevention. The reflecting surface of the concave reflecting mirror CM is formed by vapor deposition of metals, such as, e.g., aluminum and the like. A dielectric multi-layer film may also be vapor deposited in place of a metal film. In this case, as the materials of dielectric multilayer film, metal fluorides such as aluminum fluoride, cryolite, chiolite, lithium fluoride, sodium fluoride, barium fluoride, calcium fluoride, magnesium fluoride, yttrium fluoride, ytterbium fluoride, neodymium fluoride, gadolinium fluoride, lanthanum fluoride, osmium fluoride, strontium fluoride and the like can be used. A construction in which a dielectric multilayer film is arranged on a metal film, such as aluminum and the like, may also be used. The dielectric multilayer film functions as a protection coat for preventing the metal film from oxidation. This dielectric multilayer film enables the metal film to have a correcting function so as to decrease the phase difference between P polarization and S polarization caused by a reflecting light from the metal film. The correcting function nearly homogenizes a difference in phase difference between P polarization and S polarization caused by the incident angle (reflection angle) (angular characteristic of PS phase difference) in a desirable range of incident angle. If the phase difference between P polarization and S polarization exists, this is undesirable because the imaging positions of an image due to the P polarization and an image due to the S polarization deviate and cause the deterioration of image quality on the imaging surface and a desirable resolution is not obtained. The materials of the concave reflecting mirror can include ULE or Be. If Be is used, it is preferable that the whole concave reflecting mirror CM is coated with SiC and the like.

The optical folding mirror FM and the lens L8 are contained by a divided barrel 601, the lens L9 is contained by a divided barrel 602 and the concave reflecting mirror CM is contained in a divided barrel 603. A holding member 610 for holding the optical folding mirror FM is mounted to the divided barrel 601. A mechanism for adjusting the position of the optical folding mirror FM (first and second optical folding mirrors) in the $\theta_x$, $\theta_y$, $\theta_z$ directions and its position in the XYZ directions may be arranged between this holding member 610 and the divided barrel 601.

The lenses (L8, L9) of the second imaging optical system are supported by supporting members (611, 612). Supporting members disclosed in Japan Kokai 6-250074 and Japan Kokai 11-231192 are suitable for these supporting members (611, 612). The concave reflecting mirror CM of the second imaging optical system is supported by a supporting member 613. Supporting members disclosed in Japan Kokai 6-250074, Japan Kokai 11-231192 are suitable for this supporting member 613 and are incorporated herein by reference.

The projection optical system is further provided with a third imaging optical system for forming a final image (a reduced image of the pattern) on the wafer based on a light from the second intermediate image formed by the second imaging optical system. The third imaging optical system is provided with lenses (L10–L13: corresponding to the lenses L31–L311 in the third imaging optical system G3 of FIG. 2) and a variable aperture stop unit AS. The lens L110 is contained by a divided barrel 701 and the lens L11 is contained by a divided barrel 702. A flange FL supported by a column 240 is arranged in the divided barrel 702. Techniques for connection of the flange FL and the column 240, for example, are disclosed in Japan Kokai 6-300955 (U.S. Pat. No. 5,576,895) and Japan Kokai 11-84199 are applicable. A sensor column SC is mounted to the flange FL. U.S. Pat. No. 5,576,895 is incorporated herein by reference.

The variable aperture stop AS is contained by a divided barrel 703 and the lenses (L12, L13) are contained by divided barrels (704, 705). The L10–L13 are supported by cells (711–712, 714–715), respectively. The structure of the cells (711–712, 714–715) is similar to that of the cell 512. An air (gas)-tight structure is disposed between the lens L13 and the cell 715 in the cell 715.

In the third imaging optical system, frames (721–722, 724–725) for connecting the divided barrels (701–702, 704–705) and the cells (711–712, 714–715) are arranged. Apertures for allowing an inert gas (helium) to flow into the inside of the projection optical system are arranged in plural locations along their circumferential direction in the frames (721–722, 724–725). An air (gas)-tight structure is disposed between the cell 715 and the divided barrel 705.

In the third imaging optical system, actuators (731–732, 734) for moving the lens (L10–L12) in the optical axis direction and inclining the imaging optical system in the $\theta_x$, $\theta_y$ directions are arranged. These actuators (731–732, 734) have construction similar to the actuator 532. A tube 751 for allowing helium to discharge from the projection optical system is arranged in the divided barrel 705. This tube 751 is also connected to the previously mentioned helium recovery/regeneration unit. A valve 761 for controlling the gas inflow rate is arranged at the tube 751.

Next, the embodiments of a manufacturing process wherein the previously mentioned exposure apparatus and an exposure method are used in the lithographic process are described below.

Figure 11:
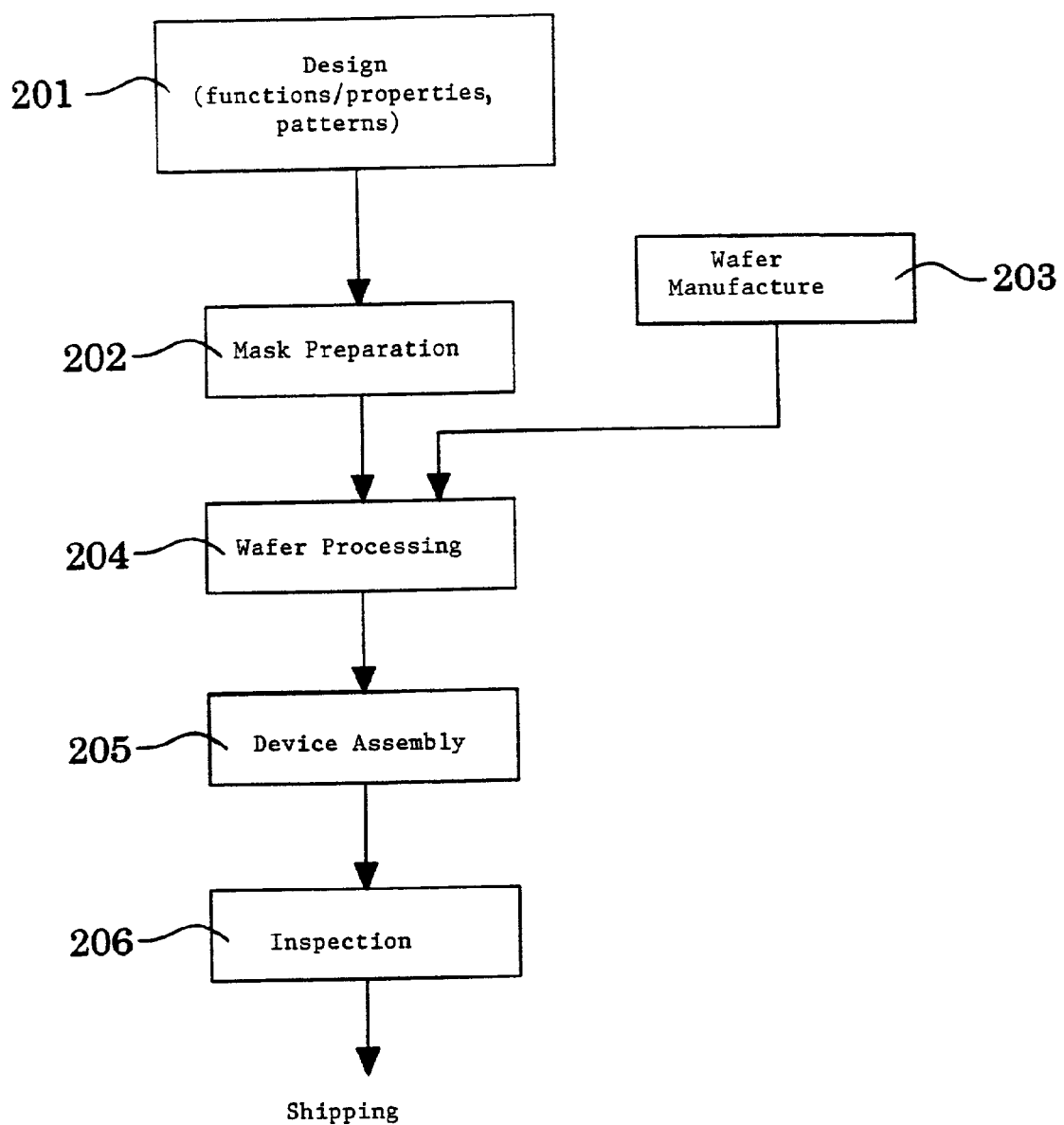
FIG. 11 is a diagram illustrating a flowchart of a manufacturing example of devices (semiconductor chip such as IC or LSI and the like, liquid crystal panel, CCD, thin-film magnetic head, micro-machine and so on).

FIG. 11 is a diagram showing the flowchart of a manufacturing process (semiconductor chips such as IC or LSI and the like, liquid crystal panel, CCD, thin-film magnetic head, micro-machine and so on). As shown in FIG. 11, design step 201 illustrates a function/property design (e.g., circuit design of semiconductor devices and the like) of devices (micro-devices) and a pattern design for obtaining the functions are also made (design step). Successively, a mask (reticle) for forming a designed circuit pattern is prepared in a step 202 (mask preparation step). Alternatively, wafers can be manufactured with a material such as silicon and the like in a step 203 (wafer manufacture step).

Next, in the step 204 (wafer processing step), actual circuits and the like are formed on the wafers by using wafers prepared in step 201 and step 203 according to a lithographic technique and the like as described later. Subsequently, in the step 205, the device assembly is conducted by using wafers processed in step 204. Such processes include, e.g., a dicing process, a bonding process and a packaging process (chip enclosure) and so on in step 205 according to demand.

Finally, in a step 206 (inspection step), inspections conducted include, e.g., an action confirmation test, a durability test and so on for the devices prepared in step 205. After processing, the devices are completed and shipped.

Figure 12:
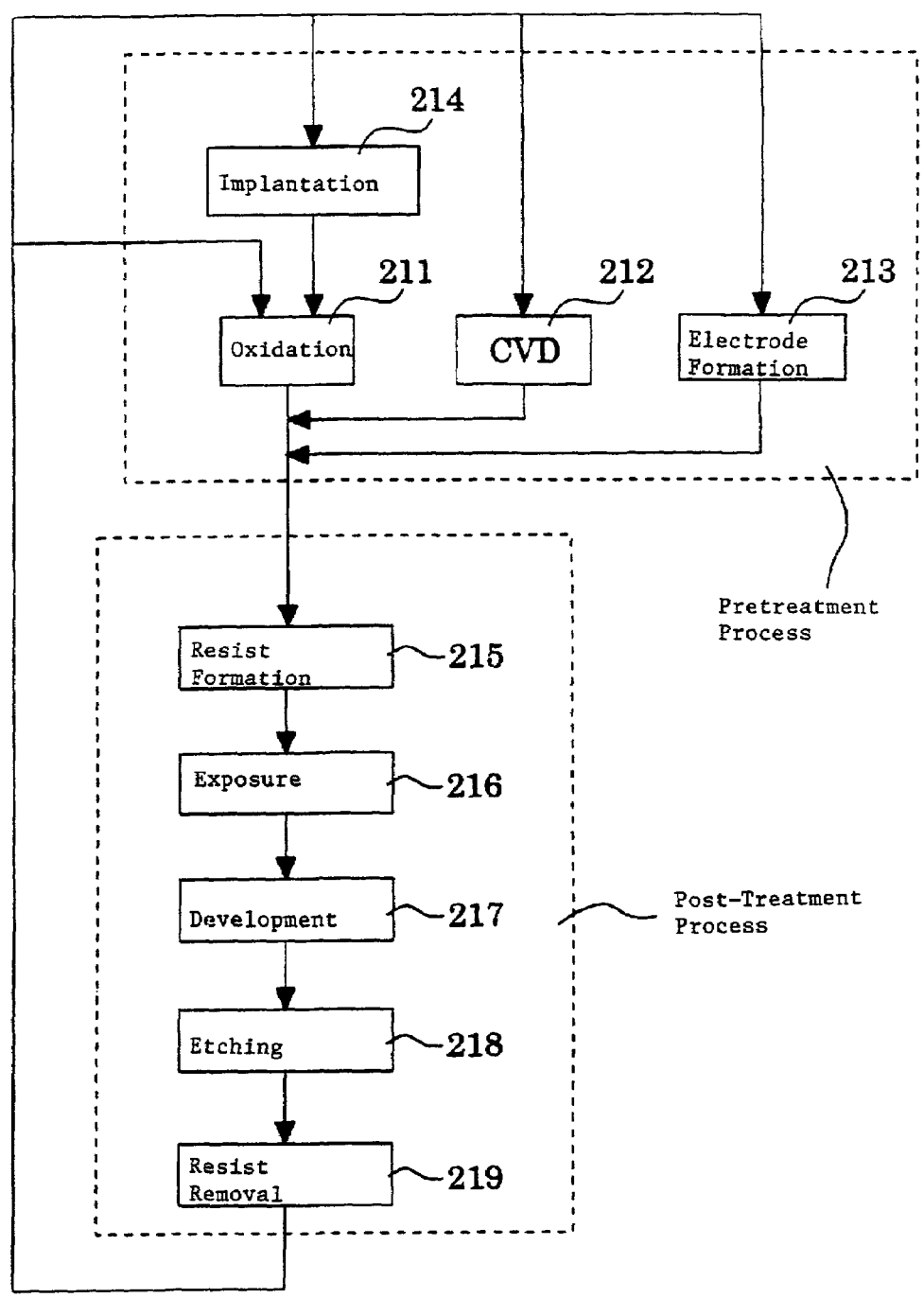
FIG. 12 is a drawing for illustrating one example of detailed flow of step 204 of FIG. 11 in the case of a semiconductor device.

FIG. 12 is a diagram showing one example of the wafer processing of step 204 in FIG. 11 for semiconductor devices. In FIG. 12, the wafer surface is oxidized in a step 211

(oxidation step). An insulating film is formed on the wafer surface in a step 212 (CVD step). Electrodes are formed on the wafers by vapor deposition in a step 213 (electrode formation step). An ion is implanted into the wafers in a step 214 (ion implantation step). Steps 211 through step 214 constitute a pretreatment process of the wafer processing, and are selected and executed according to the demand called for by the processing steps.

In the wafer processing steps, if the above pretreatment process has been completed, a post-treatment process as follows is executed. In the post-treatment process, first, a sensitizer is applied to wafers in a step 215 (resist formation step). Successively, a circuit pattern of mask given by the lithographic system (exposure apparatus) and exposure method described above is transferred on wafers in a step 216 (exposure step). Next, the exposed wafers are developed in step 217 (development step), and exposed members in a part, except for an area where the resist remains, are removed by etching in step 218 (etching step). After, the etching is finished, any unnecessary resist is removed in step 219 (resist removal step).

Circuit patterns are formed on the wafers by repeating the above mentioned pretreatment and post-treatment process steps.

If the manufacturing method of this embodiment is applied, devices with a high integrated level of about 0.1 μm in minimum line width can be produced with sufficient yield. The method applies the use of the exposure apparatus and the exposure method described above in the exposure process (step 216), thereby improving the resolving power of an exposure light in the vacuum ultraviolet region and producing high accuracy exposure control.

Moreover, in this embodiment form, the tubes connected to the inside of the projection optical system are disposed in two locations. The number of tubes is not limited to only two locations. For example, a number of tubes (inflow port/outflow outlet) corresponding to respective lens chambers (spaces between optical members) may be arranged. The pressure fluctuation of the gas in the projection optical system and the illumination optical system can be suppressed to a predetermined value. At this time, an allowable value of the pressure fluctuation is set up such that the value of the projection optical system more tight than that of the illumination optical system.

Furthermore, the pressure change of an inert gas filled or circulated among optical elements of the illumination system and projection optical system is detected, and optical elements for aberration correction (L2–L3, L5–L7, L10–L12 in FIG. 8 through FIG. 10) may also be driven based on the detected result. Such a technique is disclosed, e.g., in WO99/10917 (EP 1,020,897). EP 1,020,897 is incorporated herein by reference.

Additionally, it is preferable that the concentrations and/or the total amount of light-absorbing substances (gases such as oxygen ($O_2$), carbon dioxide ($CO_2$) and the like, water vapor ($H_2O$) and so on, are given as substances absorbing exposure beams and light-absorbing substances for the $F_2$ laser light of wavelength 157 μm) in the optical path of the illumination optical system, the optical path in the reticle chamber, the optical path in the projection optical system and the optical path in the wafer chamber are controlled independently of each other. For example, allowable concentrations and an allowable total amount of the light-absorbing substances can be variably set up because the wafer chamber and the reticle chamber have short optical paths. Thus, the open/close mechanisms of the reticle chamber are simplified and contact with the outside air or mix-in of light-absorbing substances is avoided because of the reticle exchange and the wafer exchange. Allowable concentrations and an allowable total amount of the light-absorbing substances are harshly set up in response to the illumination optical system having a long optical path.

An $F_2$ laser can be incorporated in this embodiment which can include, nitrogen, rare gases such as helium (He), neon (Ne), argon (Ar) and the like as a permeable gas having a wavelength of 157 nm. Helium gas is particularly superior in high permeability, stability of imaging characteristic of optical system and cooling property since its heat conductivity is about 6 times greater than that of nitrogen and its fluctuation of dioptric index to pressure change is about ⅛greater than that of nitrogen gas. In this embodiment, the gas in the wafer chamber and the reticle chamber which fills the optical path of the interferometers (wafer interferometer, reticle interferometer) and the inside of the projection optical system can be helium. And, the gas in the optical path of the illumination optical system can be nitrogen gas in order to reduce the running cost. The gas used in the optical path of the illumination optical system can also be helium and the gas in the wafer chamber, the reticle chamber, and inside the projection optical system can be nitrogen.

The following photopermeable optical materials constituting the illumination optical system and the projection optical system that can be used include: lenses, parallel plane plates, micro fly's eye lenses and diffraction optical elements. In addition, fluorite ($CaF_2$), modified quartzs such as F-doped silica glass, F- and H-doped silica glass, OH-containing silica glass, F-doped and OH-containing silica glass and the like can also be used. The photopermeable optical materials constituting the illumination optical system and the projection optical system may also include the previously mentioned modified quartz. In the F-doped silica glass, the fluorine concentration is preferably 100 ppm or more, and more preferably in a range of 500 ppm–30,000 ppm. In the F-doped and H-doped silica glass, the hydrogen concentration is preferably $5 \times 10^{18}$ molecules/$cm^3$ or less, and more preferably $1 \times 10^{18}$ molecules/$cm^3$ or less. In the OH-containing silica glass, the concentration of OH group is preferably in a range of 10 ppm–100 ppm. In the F-doped and OH-containing silica glass, the fluorine concentration is preferably 100 ppm or more and the concentration of OH group is preferably lower than the fluorine concentration. In this embodiment, the concentration of OH group is preferably in a range of 10 ppm–20 ppm.

When an image is formed by using a region free of the optical axis of the projection optical system, as in the present embodiment, an illumination optical system disclosed in Japan Kokai 2000-21765 (U.S. patent application Ser. No. 340,236 filed on Jul. 1, 1999) can be used as the illumination optical system. U.S. patent application Ser. No. 340,236 is incorporated hereby by reference.

Moreover, in this embodiment, a portion of the optical element in the optical elements constituting the projection optical system is inclinable to the $\theta_x$, $\theta_y$ directions and/or movable in the XY plane. The optical elements may also be rotatably arranged in a direction of rotation ($\theta_z$ direction in the first and third imaging optical systems) with the optical axis as the center by forming the optical surfaces (refractive surfaces/reflecting surfaces) of these optical elements so as to have different powers in the meridional directions perpendicular to each other (dioptric plane/reflecting plane) of the optical elements (conducting an astigmatic surface processing). This arrangement results in correct asymmetrical aberrations such as an astigmatic difference on the optical axis (center astigmatism) of the projection optical system, or a rhombic distortion of that.

For example, a construction in which an actuator and a driving axis are disposed along the tangential direction of the circumstance of the frame is arranged between a frame and a divided barrel such that the frame is driven to the divided barrel in the $\theta_z$ direction. It is preferable that the actuator is equal distant from the optical axis and arranged in a plurality of different locations at an equal-angle pitch in the circumferential direction ($\theta_z$ direction). A mechanism for rotating optical members with an astigmatic surface is disclosed in Japan Kokai 8-327895 (U.S. Pat. No. 5,852,518). U.S. Pat. No. 5,852,518 is incorporated herein by reference.

Furthermore, a purge space may also be formed on the outside of the purge space of the illumination optical system and/or purge space of the projection optical system. In this case, the allowable concentration and allowable total amount of light-absorbing substance of the purge spaces on the outside are set up more unexacting than the purge spaces on the inner side (the purge space of the illumination optical system and/or the purge space of the projection optical system).

Additionally, a parallel plane plate is arranged on the wafer side of the lens on the wafer side of the projection optical system. The parallel plane plate may also be provided as a cover to the purge space of the projection optical system similar to the reticle side.

In addition to the $F_2$ laser light that supplies a pulse light having a wavelength of 157 nm as provided for in this embodiment, implementing various other light sources is also possible. For example, the following light sources can be implemented a KrF excimer laser light supplying a light of wavelength 248 nm, and an ArF excimer laser light supplying a light of wavelength 193 m, and an $Ar_2$ laser light supplying a light of wavelength 126 nm. A harmonic wave given by amplifying a laser light with a single wavelength in the infrared region oscillated from a DFB semiconductor laser or a fiber laser or in the visible region with an Er-doped (or both Er-and Yb-doped) fiber amplifier that converts the light source to an ultraviolet light with a nonlinear optical crystal may also be used.

The present invention is applicable not only to microdevices such as, semiconductor devices and the like, but also to an exposure apparatus for transferring circuit patterns from a mother reticle to a glass substrate, or a silicon wafer and the like, to manufacture a reticle or a mask used in, e.g., a light exposure apparatus an EUV exposure apparatus, an X-ray exposure apparatus and an electron ray exposure apparatus and the like. Transmitting reticles are commonly used in the exposure apparatus using DUV (deep ultraviolet) or VUV (vacuum ultraviolet) light and the like. Silica glass, F-doped silica glass, fluorite, magnesium fluoride, or quartz crystal and the like are used as the reticle substrate. In a proximity-mode X-ray exposure apparatus and an electron ray exposure apparatus and the like, transmitting masks (stencil mask, membrane mask) are used. A silicon wafer and the like is used as the mask substrate. Such exposure apparatus are disclosed in WO 99/34255 (EP 1,043,625), WO 99/50712 (U.S. patent application Ser. No. 661,396 filed on Sep. 13, 2000), WO 99/66,370, Japan Kokai 11-194479, Japan Kokai 2000-12453, Japan Kokai 2000-29202 and so on. EP 1,043,625, U.S. patent application Ser. No. 661,396 and WO 99/66,370 are incorporated herein by reference.

The present invention is applicable not only to the manufacture of semiconductor devices, but also to an exposure apparatus which can transfer device patterns onto a glass plate which are used in the manufacture of displays including liquid crystal display devices. An exposure apparatus which transfers device patterns onto a ceramic wafer and which are used in the manufacture of thin-film magnetic head, and an exposure apparatus used in the manufacture of image pickup devices such as CCD and the like, and so on can also be applied.

The above-described present invention applies the scanning step mode of operation. The present invention is also applicable to a step-and-repeat mode reduction projection exposure apparatus in which mask patterns are transferred to a substrate in a static state of the mask and the substrate. The substrate is then moved in successive steps.

An aperture stop is arranged in the third imaging optical system in the previously mentioned embodiment. The aperture stop may also be arranged in the first imaging optical system. A field stop may also be arranged in at least one of the position of the intermediate image between the first imaging optical system and the second imaging optical system, and the position of the intermediate image between the second imaging optical system and the third imaging optical system.

The projection magnification of the catadioptric projection optical system is given as a reduction ratio in previously mentioned embodiment. However, the projection magnification is not limited to the reduction ratio (magnification), it can also be an equal ratio (an unit magnification) or an enlargement ratio (magnification). For example, if the projection magnification is the enlargement ratio, the optical system can be arranged so that a light is incided from the side of the third imaging optical system, a primary image of the mask or the reticle is formed by the third imaging optical system, a secondary image is formed by the secondary imaging optical system and a tertiary image is formed by the first imaging optical system on a substrate such as wafer and the like.

As described above, in the catadioptric optical system, the projection exposure apparatus and the exposure method including the optical system of the previously mentioned embodiments, the optical adjustment and mechanical design are improved. The aberrations beginning with chromatic aberrations can be fully corrected. For example, a resolution of about 0.1 μm or less can be achieved by using a light with a wavelength of 180 nm or less in the vacuum ultraviolet wavelength region. Particularly, in the previous embodiments, the optical path separation is disposed in the vicinity of two intermediate images which are formed by a mutual approach of the second imaging optical system having a nearly equal (unit) magnification. Thus, the present invention provides for a small distance in the exposure region from the optical axis, i.e., the offset quantity, and is favorable in aberration correction, miniaturization, optical adjustment, mechanical design, manufacturing cost and so on.

The previously mentioned embodiments provide for improvements in the overlay accuracy of each exposure (each relay) and the synchronization accuracy of the reticle and the wafer because the reticle surface and the wafer surface are parallel to each other and perpendicular to the direction of gravity. The optical adjustment and the mechanical design is simple since there are only two optical axes. Thus, a transmission reflecting film having a low absorption and a high extinction ratio, a high-accuracy plate with a ¼wavelength and a prism with homogeneity are not required and stray light caused by a transmission reflecting plane and the like also do not occur because transmission reflecting planes like a semi-transparent mirror or a polarizing beam splitter are not used. Also, because the reticle surface and the wafer surface are parallel to each other and perpendicular to the direction of gravity.

Moreover, in the manufacturing method of micro-devices using the projection exposure apparatus and the exposure method of the previously mentioned embodiments, improved micro-devices can be manufactured via the projection optical system in which the optical adjustment and mechanical design are simple. In addition, aberrations beginning with chromatic aberrations can be fully corrected and a high resolution of about 0.1 µm or less can be achieved.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A catadioptric optical system forming a reduced image of a first surface onto a second surface comprising:
    a first imaging optical subsystem which is arranged in an optical path between the first surface and the second surface and includes a dioptric imaging optical system to form a first intermediate image of the first surface;
    a first folding mirror which is arranged in the vicinity of a position of forming the first intermediate image to deflect a beam prior to or after the position where the first intermediate image is formed;
    a second imaging optical subsystem which is arranged in an optical path between the first folding mirror and the second surface and which forms a second intermediate image with a magnification factor nearly equal to the first intermediate image in the vicinity of a position of forming the first intermediate image based on the beam from the first intermediate image, the second imaging optical subsystem includes a concave reflecting mirror and at least one negative lens;
    a second folding mirror which is arranged in the vicinity of a position of forming the first intermediate image to deflect a beam prior to or after the position where the second intermediate image is formed; and
    a third imaging optical subsystem which is arranged in an optical path between the second imaging optical subsystem and the second surface and includes a dioptric imaging optical system to form the reduced image onto the second surface based on the beam from the second intermediate image,
    wherein the catadioptric optical system is a telecentric optical system on both sides of the first surface and the second surface.

2. The catadioptric optical system of claim 1, wherein a reflecting surface of the first folding mirror and a reflecting surface of the second folding mirror are positioned so that they do not overlap spatially.

3. The catadioptric optical system of claim 2, wherein all lenses constituting the first imaging optical subsystem and all lenses constituting the third imaging optical subsystem are arranged along a single optical axis.

4. The catadioptric optical system of claim 3, wherein a magnification factor $\beta 2$ of the second imaging optical subsystem satisfies the following condition:

$$0.082 < |\beta 2| < 1.20.$$

5. The catadioptric optical system of claim 4, wherein the following condition is satisfied:

$$|L1 - L2|/|L1| < 0.15,$$

where a first distance between the first intermediate image and the concave reflecting mirror in the second imaging optical subsystem along the optical axis is defined as L1, and a second distance between the second intermediate image and the concave reflecting mirror in the second imaging optical subsystem along the optical axis is defined as L2.

6. The catadioptric optical system of claim 5, wherein the following condition is satisfied:

$$0.20 < |\beta|/|\beta 1| < 0.50,$$

where a magnification of the catadioptric optical system is defined as $\beta$, and a magnification of the first imaging optical subsystem is defined as $\beta 1$.

7. The catadioptric optical system of claim 6, wherein the following condition is satisfied:

$$|E - D|/|E| < 0.24,$$

where a distance between a surface of the first imaging optical subsystem on a most image side and an exit pupil position along the optical axis is defined as E, and a distance by air conversion from the surface of the first imaging optical subsystem on the most image side to the concave reflecting mirror in the second imaging optical subsystem along the optical axis is defined as D.

8. The catadioptric optical system of claim 7, wherein:
    the first intermediate image is formed in an optical path between the first folding mirror and the second imaging optical subsystem; and
    the second intermediate image is formed in an optical path between the second imaging optical subsystem and the second folding mirror.

9. The catadioptric optical system of claim 8, wherein:
    85% of the number of lenses in all lenses constituting the catadioptric optical system are arranged along the single optical axis.

10. The catadioptric optical system of claim 9, wherein:
    an intersection line of an extension plane of the reflecting surface of the first folding mirror and an extension plane of the reflecting surface of the second folding mirror is set up so that an optical axis of the first imaging optical subsystem, an optical axis of the second imaging optical subsystem and an optical axis of the third imaging optical subsystem intersect at one point.

11. The catadioptric optical system of claim 10, wherein:
    the second imaging optical subsystem has at least two negative lenses.

12. The catadioptric optical system of claim 11, wherein:
    the first folding mirror has a back surface reflecting mirror for reflecting a beam from the first imaging optical subsystem to the second imaging optical subsystem; and
    the second folding mirror has a back surface reflecting mirror for reflecting a beam from the second imaging optical subsystem to the third imaging optical subsystem.

13. The catadioptric optical system of claim 12, wherein:
the catadioptric optical system forms the reduced image on a position deviating from a position of reference in an optical axis of the catadioptric optical system on the second surface.

14. The catadioptric optical system of claim 1, wherein:
a plurality of lenses constituting the first imaging optical subsystem and a plurality of lenses constituting the third imaging optical subsystem are arranged along a single optical axis.

15. The catadioptric optical system of claim 1, wherein a magnification $\beta 2$ of the second imaging optical subsystem satisfies the following condition:

$$0.82 < |\beta 2| < 1.20.$$

16. The catadioptric optical system of claim 15, wherein the following condition is satisfied:

$$|L1-L2|/|L1| < 0.15,$$

where a first distance between the first intermediate image and the concave reflecting mirror in the second imaging optical subsystem along the optical axis is defined as L1, and a second distance between the second intermediate image and the concave reflecting mirror in the second imaging optical subsystem along the optical axis is defined as L2.

17. The catadioptric optical system of claim 1, wherein the following condition is satisfied:

$$|L1-L2|/|L1| < 0.15,$$

where a first distance between the first intermediate image and the concave reflecting mirror in the second imaging optical subsystem along the optical axis is defined as L1, and a second distance between the second intermediate image and the concave reflecting mirror in the second imaging optical subsystem along the optical axis is defined as L2.

18. The catadioptric optical system of claim 1, wherein the following condition is satisfied:

$$0.20 < |\beta/\beta 1| < 0.50,$$

where a magnification of the catadioptric optical system is defined as $\beta$, and a magnification of the first imaging optical subsystem is defined as $\beta 1$.

19. The catadioptric optical system of claim 1, wherein the following condition is satisfied:

$$|E-D|/|E| < 0.24,$$

where a distance between a surface of the first imaging optical subsystem on a most image side and an exit pupil position along the optical axis is defined as E, and a distance by air conversion from the surface of the first imaging optical subsystem on the most image side to the concave reflecting mirror in the second imaging optical subsystem along the optical axis is defined as D.

20. The catadioptric optical system of claim 1, wherein:
the first intermediate image is formed in an optical path between the first folding mirror and the second imaging optical subsystem; and
the second intermediate image is formed in an optical path between the second imaging optical subsystem and the second folding mirror.

21. The catadioptric optical system of claim 1, wherein: 85% of the number of lenses in all lenses constituting the catadioptric optical system are arranged along the single optical axis.

22. The catadioptric optical system of claim 1, wherein an intersection line of an extension plane of a reflecting surface of the first folding mirror and an extension plane of a reflecting surface of the second folding mirror is set up so that an optical axis of the first imaging optical subsystem, an optical axis of the second imaging optical subsystem and an optical axis of the third imaging optical subsystem intersect at one point.

23. The catadioptric optical system of claim 1, wherein the second imaging optical subsystem has at least two negative lenses.

24. The catadioptric optical system of claim 1, wherein:
the first folding mirror has a back surface reflecting surface for reflecting a beam from the first imaging optical subsystem to the second imaging optical subsystem; and
the second folding mirror has a back surface reflecting surface for reflecting a beam from the second imaging optical subsystem to the third imaging optical subsystem.

25. The catadioptric optical system of claim 1, wherein:
the catadioptric optical system forms the reduced image in a position deviating from a position of a reference optical axis of the catadioptric optical system on the second surface.

26. A catadioptric optical system forming a reduced image of a first surface onto a second surface comprising:
a first imaging optical subsystem with a first optical axis, which is arranged in an optical path between the first surface and the second surface and includes a dioptric imaging optical system;
a second imaging optical subsystem with a concave reflecting mirror and a second optical axis, which is arranged in an optical path between the first imaging optical subsystem and the second surface; and
a third imaging optical subsystem with a third optical axis, which is arranged in an optical path between the second imaging optical subsystem and the second surface and includes a dioptric imaging optical system,
wherein the first optical axis and the second optical axis intersect with each other and the second optical axis and the third optical axis intersect with each other, and
wherein the catadioptric optical system is a telecentric optical system on both sides of the first surface and the second surface.

27. The catadioptric optical system of claim 26, further comprising:
a first reflection surface arranged in an optical path between the first imaging optical subsystem and the second imaging optical subsystem; and
a second reflection surface arranged in an optical path between the second imaging optical subsystem and the third imaging optical subsystem.

28. The catadioptric optical system of claim 27, wherein a first intermediate image is formed in an optical path between the first reflection surface and the second imaging optical subsystem by the first imaging optical subsystem, and a second intermediate image is formed in an optical path between the second imaging optical subsystem and the second reflection surface by the second imaging optical subsystem.

29. The catadioptric optical system of claim 28, wherein the following condition is satisfied:

$$|L1-L2|/|L1| < 0.15,$$

where a first distance between the first intermediate image and the concave reflecting mirror in the second imaging optical subsystem along the optical axis is defined as L1, and a second distance between the second intermediate image and the concave reflecting mirror in the second imaging optical subsystem along the optical axis is defined as L2.

30. The catadioptric optical system of claim 26, wherein a magnification factor β2 of the second imaging optical subsystem satisfies the following condition:

$$0.082 < |\beta 2| < 1.20.$$

31. The catadioptric optical system of claim 30, wherein the following condition is satisfied:

$$0.20 < |\beta|/|\beta 1| < 0.50,$$

where a magnification of the catadioptric optical system is defined as β, and a magnification of the first imaging optical subsystem is defined as β1.

32. The catadioptric optical system of claim 31, wherein the following condition is satisfied:

$$|E-D|/|E| < 0.24,$$

where a distance between a surface of the first imaging optical subsystem on a most image side and an exit pupil position along the optical axis is defined as E, and a distance by air conversion from the surface of the first imaging optical subsystem on the most image side to the concave reflecting mirror in the second imaging optical subsystem along the optical axis is defined as D.

33. The catadioptric optical system of claim 30, wherein the second imaging optical subsystem has at least two negative lenses.

34. The catadioptric optical system of claim 26, wherein 85% of the number of lenses in all lenses constituting the catadioptric optical system are arranged along a single optical axis, and wherein the first optical axis and the third optical axis form the single optical axis.

35. The catadioptric optical system of claim 26, wherein the catadioptric optical system forms the reduced image in a position deviating from a position of a reference optical axis of the catadioptric optical system on the second surface.

36. A catadioptric optical system forming a reduced image of a first surface onto a second surface comprising:
    a first imaging optical subsystem with a first optical axis, which is arranged in an optical path between the first surface and the second surface and includes a dioptric imaging optical system;
    a second imaging optical subsystem with a concave reflecting mirror and a second optical axis, which is arranged in an optical path between the first imaging optical subsystem and the second surface; and
    a third imaging optical subsystem with a third optical axis, which is arranged in an optical path between the second imaging optical subsystem and the second surface and includes a dioptric imaging optical system,
    wherein the first optical axis and the third optical axis are located on a common axis, and
    wherein the catadioptric optical system is a telecentric optical systemon both sides of the first surface and the second surface.

37. The catadioptric optical system of claim 36, further comprising:
    a first reflection surface arranged in an optical path between the first imaging optical subsystem and the second imaging optical subsystem; and
    a second reflection surface arranged in an optical path between the second imaging optical subsystem and the third imaging optical subsystem.

38. The catadioptric optical system of claim 37, wherein a first intermediate image is formed in an optical path between the first reflection surface and the second imaging optical subsystem by the first imaging optical subsystem, and a second intermediate image is formed in an optical path between the second imaging optical subsystem and the second reflection surface by the second imaging optical subsystem.

39. The catadioptric optical system of claim 38, wherein the following condition is satisfied:

$$|L1-L2|/|L1| < 0.15,$$

where a first distance between the first intermediate image and the concave reflecting mirror in the second imaging optical subsystem along the optical axis is defined as L1, and a second distance between the second intermediate image and the concave reflecting mirror in the second imaging optical subsystem along the optical axis is defined as L2.

40. The catadioptric optical system of claim 37, wherein an intersection line of an extension plane of the first reflection surface and an extension plane of the second reflection surface is set up so that the first optical axis of the first imaging optical subsystem, the second optical axis of the second imaging optical subsystem and the third optical axis of the third imaging optical subsystem intersect at one point.

41. The catadioptric optical system of claim 36, wherein a magnification factor β2 of the second imaging optical subsystem satisfies the following condition:

$$0.082 < |\beta 2| < 1.20.$$

42. The catadioptric optical system of claim 41, wherein the following condition is satisfied:

$$0.20 < |\beta|/|\beta 1| < 0.50,$$

where a magnification of the catadioptric optical system is defined as β, and a magnification of the first imaging optical subsystem is defined as β1.

43. The catadioptric optical system of claim 42, wherein following condition is satisfied:

$$|E-D|/|E| < 0.24,$$

where a distance between a surface of the first imaging optical subsystem on a most image side and an exit pupil position along the optical axis is defined as E, and a distance by air conversion from the surface of the first imaging optical subsystem on the most image side to the concave reflecting mirror in the second imaging optical subsystem along the optical axis is defined as D.

44. The catadioptric optical system of claim 41, wherein the second imaging optical subsystem has at least two negative lenses.

45. The catadioptric optical system of claim 36, wherein 85% of the number of lenses in all lenses constituting the catadioptric optical system are arranged along a single optical axis, and wherein the first optical axis and the third optical axis form the single optical axis.

46. The catadioptric optical system of claim 36, wherein the catadioptric optical system forms the reduced image in a position deviating from a position of a reference optical axis of the catadioptric optical system on the second surface.

47. A projection exposure apparatus comprising:
    a projection optical system which is arranged in an optical path between a first surface and a second surface that projects and exposes a pattern located on the first surface onto a workpiece located on the second surface, and
    the projection optical system that comprises:
    a first imaging optical subsystem including a dioptric imaging optical system;
    a second imaging optical subsystem including a concave reflecting mirror;

a third imaging optical subsystem including a dioptric imaging optical system;

a first folding mirror arranged in an optical path between the first imaging optical subsystem and the second imaging optical subsystem; and a second folding mirror arranged in an optical path between the second imaging optical subsystem and the third imaging optical subsystem;

wherein the first imaging optical subsystem forms a first intermediate image of the first surface into the optical path between the first imaging optical subsystem and the second imaging optical subsystem, the second imaging optical subsystem forms a second intermediate image of the first surface into the optical path between the second imaging optical subsystem, and wherein the projection optical system is a telecentric optical system on both sides of the first surface and the second surface.

48. The projection exposure apparatus of claim 47, wherein:

the projection exposure apparatus projects the pattern on the mask onto the workpiece and exposes the pattern while the mask and the workpiece are moved in the same direction.

49. The projection exposure apparatus of claim 48, wherein:

the first folding mirror has a first reflecting surface;

the second folding mirror has a second reflecting surface; and the first reflecting surface and the second reflecting surface are positioned so that they do not overlap spatially.

50. The projection exposure apparatus of claim 49, wherein:

the first and the second reflecting surfaces are substantially flat surfaces.

51. The projection exposure apparatus of claim 48, wherein:

the projection optical system forms a reduced image of the pattern onto the workpiece.

52. The projection exposure apparatus of claim 48, wherein:

at least one of the first imaging optical subsystem and the third imaging optical subsystem contains an aperture stop.

53. The projection exposure apparatus of claim 48, wherein:

a plurality of optical members in the first imaging optical subsystem are arranged along a first optical axis extending in a straight line;

the concave reflecting mirror in the second imaging optical subsystem are arranged along a second optical axis; and a plurality of optical members in the third imaging optical subsystem are arranged along a third optical axis extending in a straight line.

54. The projection exposure apparatus of claim 48, wherein:

the first imaging optical subsystem and the third imaging optical subsystem have a common optical axis; and the first surface and the second surface are orthogonal in a direction of gravity.

55. The projection exposure apparatus of claim 48, wherein a magnification $\beta 2$ of the second imaging optical subsystem satisfies the following condition:

$$0.82<|\beta 2|<1.20.$$

56. The projection exposure apparatus of claim 55, wherein the following condition is satisfied:

$$0.20<|\beta|/|\beta 1|<0.50$$

wherein a magnification of the projection optical system is defined as $\beta$, and a magnification of the first imaging optical subsystem is defined as $\beta 1$.

57. The projection exposure apparatus of claim 48, wherein the following condition is satisfied:

$$0.20<|\beta|/|\beta 1|<0.50$$

wherein a magnification of the projection optical system is defined as $\beta$, and a magnification of the first imaging optical subsystem is defined as $\beta 1$.

58. The projection exposure apparatus of claim 48, wherein:

the concave reflecting mirror in the second imaging optical subsystem is arranged in the vicinity of a pupil surface of the projection optical system.

59. The projection exposure apparatus of claim 48, wherein:

the first intermediate image is formed in the optical path between the first folding mirror and a concave reflecting mirror in the second imaging optical subsystem; and the second intermediate image is formed in the optical path between the concave reflecting mirror in the second imaging optical subsystem and the second folding mirror.

60. The projection exposure apparatus of claim 59, wherein:

the first intermediate image and the second intermediate image are formed in both sides of a second optical axis of the second imaging optical subsystem.

61. The projection exposure apparatus of claim 48, wherein:

a second optical axis of the second imaging optical subsystem is orthogonal to a first optical axis of the first imaging optical subsystem and a third optical axis of the third imaging optical subsystem.

62. The projection exposure apparatus of claim 61, wherein:

the second optical axis of the second imaging optical subsystem extends in a straight line.

63. The projection exposure apparatus of claim 48, wherein:

an intersection line of an extension plane of a reflecting surface of the first optical path folding mirror and an extension plane of a reflecting surface of the second optical path folding mirror intersects with a first optical axis of the first imaging optical subsystem, a second optical axis of the second imaging optical subsystem and a third optical axis of the third imaging optical subsystem at one point.

64. The projection exposure apparatus of claim 48, wherein:

the first folding mirror has a back surface reflecting surface for reflecting a beam from the first imaging optical subsystem to the second imaging optical subsystem; and the second folding mirror has a back surface reflecting surface for reflecting a beam from the second imaging optical subsystem to the third imaging optical subsystem.

65. The projection exposure apparatus of claim 48, wherein an image of the first surface is formed in a position deviating from a position of a reference optical axis of the projection optical system on the second surface.

66. A manufacturing method of micro-devices comprising:
preparing a mask with a pattern;
preparing a workpiece;
projecting the pattern onto the workpiece using the projection exposure apparatus of claim 48.

67. An exposure method for projecting a pattern onto a workpiece via a projection optical system, the method comprising:
directing an illuminating light in the ultraviolet region to the pattern;
directing the illuminating light to a first imaging optical subsystem including a dioptric imaging optical system via the pattern to form a first intermediate image of the pattern;
directing the illuminating light from the first intermediate image to a second imaging optical subsystem including a concave reflecting mirror to form a second intermediate image;
directing the illuminating a light from the second intermediate image to a third imaging optical subsystem including a dioptric imaging optical system;
deflecting the illuminating light from the first imaging optical subsystem by a first folding mirror arranged in an optical path between the first imaging optical subsystem and the second imaging optical subsystem; and
deflecting the illuminating light from the second imaging optical subsystem by a second folding mirror arranged in an optical path between the second imaging optical subsystem and the third imaging optical subsystem,
wherein the projection optical system is a telecentric optical system on the pattern side and the workpiece side.

68. The exposure method of claim 67, wherein:
the pattern is projected onto the workpiece and exposed while the workpiece is moved relative to the projection optical system.

69. The exposure method of claim 67, wherein the first intermediate image of the pattern is formed in an optical path between the first folding mirror and the second imaging optical subsystem by the first imaging optical subsystem, and the second intermediate image is formed in an optical path between the second imaging optical subsystem and the second folding mirror by the second imaging optical subsystem.

70. The exposure method of claim 69, wherein the following condition is satisfied:

$|L1-L2|/|L1|<0.15$, where a first distance between the first intermediate image and the concave reflecting mirror in the second imaging optical subsystem along the optical axis is defined as L1, and a second distance between the second intermediate image and the concave reflecting mirror in the second imaging optical subsystem along the optical axis is defined as L2.

71. The exposure method of claim 67, wherein an intersection line of an extension plane of the first folding mirror and an extension plane of the second folding mirror is set up so that an optical axis of the first imaging optical subsystem, an optical axis of the second imaging optical subsystem and an optical axis of the third imaging optical subsystem intersect at one point.

72. The exposure method of claim 67, wherein a magnification factor β2 of the second imaging optical subsystem satisfies the following condition:

$0.082<|\beta2|<1.20$.

73. The exposure method of claim 72, wherein the following condition is satisfied:

$0.20<|\beta|/|\beta1|<0.50$, where a magnification of the catadioptric optical system is defined as β, and a magnification of the first imaging optical subsystem is defined as β1.

74. The exposure method of claim 73, wherein the following condition is satisfied:

$|E-D|/|E|<0.24$, where a distance between a surface of the first imaging optical subsystem on a most image side and an exit pupil position along the optical axis is defined as E, and a distance by air conversion from the surface of the first imaging optical subsystem on the most image side to the concave reflecting mirror in the second imaging optical subsystem along the optical axis is defined as D.

75. The exposure method of claim 72, wherein the second imaging optical subsystem has at least two negative lenses.

76. The exposure method of claim 67, wherein 85% of the number of lenses in all lenses constituting the catadioptric optical system are arranged along a single optical axis, and wherein an optical axis of the first imaging optical subsystem and an optical axis of the third imaging optical subsystem form the single optical axis.

77. The exposure method of claim 67, further comprising:
the step of forming an image in a position deviating from a position of a reference optical axis of the third imaging optical subsystem on the workpiece.

78. A manufacturing method of micro-devices comprising the steps of:
preparing a pattern;
preparing a workpiece; and
exposing the pattern onto the workpiece with the exposure method of claim 67.

79. A catadioptric optical system forming a reduced image of a first surface onto a second surface comprising:
a first imaging optical subsystem with a first optical axis, which is arranged in an optical path between the first surface and the second surface and includes a dioptric imaging optical system;
a second imaging optical subsystem with a concave reflecting mirror and a second optical axis, which is arranged in an optical path between the first imaging optical subsystem and the second surface;
a third imaging optical subsystem with a third optical axis, which is arranged in an optical path between the second imaging optical subsystem and the second surface and includes a dioptric imaging optical system;
a first folding mirror which is arranged in an optical path between the first imaging optical subsystem and the second imaging optical subsystem; and
a second folding mirror which is arranged in an optical path between the second imaging optical subsystem and the third imaging optical subsystem,
wherein the first optical axis and the third optical axis are located on a common axis,
wherein the first folding mirror and the second folding mirror are formed monolithically, and wherein the catadioptric optical system is a telecentric optical system on both sides of the first surface and the second surface.

80. The catadioptric optical system of claim 79, wherein:
a first intermediate image is formed in an optical path between the first folding mirror and the second imaging optical subsystem by the first imaging optical subsystem, and
a second intermediate image is formed in an optical path between the second imaging optical subsystem and the second folding mirror by the second imaging optical subsystem.

81. The catadioptric optical system of claim 80, wherein the following condition is satisfied:

$$|L1-L2|/|L1|<0.15,$$

where a first distance between the first intermediate image and the concave reflecting mirror in the second imaging optical subsystem along the optical axis is defined as L1, and a second distance between the second intermediate image and the concave reflecting mirror in the second imaging optical subsystem along the optical axis is defined as L2.

82. The catadioptric optical system of claim 79, wherein an intersection line of an extension plane of the first folding mirror and an extension plane of the second folding mirror is set up so that the first optical axis of the first imaging optical subsystem, the second optical axis of the second imaging optical subsystem and the third optical axis of the third imaging optical subsystem intersect at one point.

83. The catadioptric optical system of claim 79, wherein a magnification factor β2 of the second imaging optical subsystem satisfies the following condition:

$$0.082<|\beta 2|<1.20.$$

84. The catadioptric optical system of claim 83, wherein the following condition is satisfied:

$$0.20<|\beta|/|\beta 1|<0.50,$$

where a magnification of the catadioptric optical system is defined as β, and a magnification of the first imaging optical subsystem is defined as β1.

85. The catadioptric optical system of claim 84, wherein the following condition is satisfied:

$$|E-D|/|E|<0.24,$$

where a distance between a surface of the first imaging optical subsystem on a most image side and an exit pupil position along the optical axis is defined as E, and a distance by air conversion from the surface of the first imaging optical subsystem on the most image side to the concave reflecting mirror in the second imaging optical subsystem along the optical axis is defined as D.

86. The catadioptric optical system of claim 83, wherein the second imaging optical subsystem has at least two negative lenses.

87. The catadioptric optical system of claim 86, wherein the at least two negative lenses have a meniscus lens.

88. The catadioptric optical system of claim 79, wherein 85% of the number of lenses in all lenses constituting the catadioptric optical system are arranged along a single optical axis, and wherein the first optical axis and the third optical axis form the single optical axis.

89. The catadioptric optical system of claim 79, wherein the catadioptric optical system forms the reduced image in a position deviating from a position of a reference optical axis of the catadioptric optical system on the second surface.

90. A catadioptric optical system forming an image of a first surface onto a second surface comprising:
a first imaging optical subsystem with a first optical axis, which is arranged in an optical path between the first surface and the second surface and includes a dioptric imaging optical system;
a second imaging optical subsystem with a concave reflecting mirror and a second optical axis, which is arranged in an optical path between the first imaging optical subsystem and the second surface;
a third imaging optical subsystem with a third optical axis, which is arranged in an optical path between the second imaging optical subsystem and the second surface and includes a dioptric imaging optical system;
a first folding mirror which is arranged in an optical path between the first imaging optical subsystem and the second imaging optical subsystem; and
a second folding mirror which is arranged in an optical path between the second imaging optical subsystem and the third imaging optical subsystem,
wherein the first optical axis and the third optical axis are located on a common axis,
wherein an intersection line of an extension plane of a reflecting surface of the first folding mirror and an extension plane of a reflecting surface of the second folding mirror is on the common axis, and
wherein the catadioptric optical system is a telecentric optical system on both sides of the first surface and the second surface.

91. The catadioptric optical system according to claim 90, wherein the first folding mirror and the second folding mirror are formed monolithically.

92. The catadioptric optical system of claim 91, wherein the first and the second folding mirrors have substantially flat reflection surfaces.

93. The catadioptric optical system of claim 90, wherein at least one of the first imaging optical subsystem and the third imaging optical subsystem contains an aperture stop.

94. The catadioptric optical system of claim 90, wherein a plurality of optical members in the first imaging optical subsystem are arranged along the first optical axis extending in a straight line, the concave reflecting mirror in the second imaging optical subsystem is arranged along the second optical axis, and a plurality of optical members in the third imaging optical subsystem are arranged along the third optical axis extending in a straight line.

95. The catadioptric optical system of claim 94, wherein 85% of the number of lenses in all lenses constituting the catadioptric optical system are arranged along the common axis.

96. The catadioptric optical system of claim 94, wherein the second optical axis of the second imaging optical subsystem is orthogonal to the first optical axis of the first imaging optical subsystem and the third optical axis of the third imaging optical subsystem.

97. The catadioptric optical system of claim 90, wherein the first surface and the second surface are orthogonal in a direction of gravity.

98. The catadioptric optical system of claim 90, wherein a magnification factor β2 of the second imaging optical subsystem satisfies the following condition:

$$0.082<|\beta 2|<1.20.$$

99. The catadioptric optical system of claim 98, wherein the following condition is satisfied:

$$0.20<|\beta|/|\beta 1|<0.50,$$

wherein a magnification of the projection optical system is defined as β, and a magnification of the first imaging optical subsystem is defined as β1.

100. The catadioptric optical system of claim 98, wherein the second imaging optical subsystem has at least two negative lenses.

101. The catadioptric optical system of claim 90, wherein the following condition is satisfied:

$$0.20<|\beta|/|\beta1|<0.50,$$

wherein a magnification of the projection optical system is defined as β, and a magnification of the first imaging optical subsystem is defined as β1.

102. The catadioptric optical system of claim 90, wherein the concave reflecting mirror in the second imaging optical subsystem is arranged in the vicinity of a pupil surface of the projection optical system.

103. The catadioptric optical system of claim 90, wherein a first intermediate image is formed in the optical path between the first folding mirror and the concave reflecting mirror in the second imaging optical subsystem, and a second intermediate image is formed in the optical path between the concave reflecting mirror in the second imaging optical subsystem and the second folding mirror.

104. The catadioptric optical system of claim 103, wherein the first intermediate image and the second intermediate image are formed in both sides of the second optical axis of the second imaging optical subsystem.

105. The catadioptric optical system of claim 103, wherein the following condition is satisfied:

$$|L1-L2|/|L1|<0.15,$$

where a first distance between the first intermediate image and the concave reflecting mirror in the second imaging optical subsystem along the optical axis is defined as L1, and a second distance between the second intermediate image and the concave reflecting mirror in the second imaging optical subsystem along the optical axis is defined as L2.

106. The catadioptric optical system of claim 103, wherein the second optical axis of the second imaging optical subsystem extends in a straight line.

107. The catadioptric optical system of claim 90, wherein the intersection line of the extension plane of the reflecting surface of the first optical path folding mirror and the extension plane of the reflecting surface of the second optical path folding mirror intersects with the first optical axis of the first imaging optical subsystem, the second optical axis of the second imaging optical subsystem and the third optical axis of the third imaging optical subsystem at one point.

108. The catadioptric optical system of claim 90, wherein the image of the first surface is formed in a position deviating from a position of a reference optical axis of the projection optical system on the second surface.

* * * * *